(12) United States Patent
Wakabayashi et al.

(10) Patent No.: US 7,957,449 B2
(45) Date of Patent: Jun. 7, 2011

(54) TWO-STAGE LASER SYSTEM FOR ALIGNERS

(75) Inventors: Osamu Wakabayashi, Hiratsuka (JP); Tatsuya Ariga, Hiratsuka (JP); Takahito Kumazaki, Hiratsuka (JP); Kotaro Sasano, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 11/566,235

(22) Filed: Dec. 3, 2006

(65) Prior Publication Data
US 2007/0297483 A1 Dec. 27, 2007

Related U.S. Application Data

(62) Division of application No. 10/554,537, filed on Oct. 24, 2005.

(51) Int. Cl.
*H01S 3/083* (2006.01)
(52) U.S. Cl. ............. 372/94; 372/55; 372/56; 372/57; 372/62; 372/97
(58) Field of Classification Search ............ 372/55–57, 372/62, 94, 97
See application file for complete search history.

(56) References Cited

U.S. PATENT DOCUMENTS

| | | | |
|---|---|---|---|
| 4,689,794 | A | 8/1987 | Brosnan |
| 5,305,334 | A * | 4/1994 | Margalit et al. ............. 372/32 |
| 5,392,310 | A | 2/1995 | Klein |
| 6,173,000 | B1 * | 1/2001 | Balla .......................... 372/57 |
| 7,167,499 | B2 * | 1/2007 | Das et al. .................... 372/55 |
| 2002/0064202 | A1 | 5/2002 | Sandstrom et al. |
| 2004/0202220 | A1 * | 10/2004 | Hua et al. .................... 372/57 |
| 2006/0126697 | A1 * | 6/2006 | Knowles et al. ............. 372/55 |

FOREIGN PATENT DOCUMENTS

| | | |
|---|---|---|
| JP | 2-130990 | 5/1990 |
| JP | 11-121879 | 4/1999 |

OTHER PUBLICATIONS

M.S. Dzhidzhoev et al, Regenerative amplification of narrow-band radiation in an XeCL excimer laser, Sov.J, Quantum Electron. 20 (6), Jun. 1990, pp. 618-624.
Masakatsu Sugii et al, High locking efficiency XeCl ring amplifier injection locked by backward stimulated Brillouin scattering, J. Appl. Phys. 62 (8), Oct. 15, 1987 pp. 3480-3482.
Thomas J. Pacala et al, A wavelength scannable XeCl oscillator-ring amplifier laser system, Appl. Phys. Lett. 40(1), Jan. 1, 1982, pp. 1-3.
J. C. White et al, Tunable ArF excimer-laser source, Optics Letters vol. 6, No. 6, Jun. 1981, pp. 293-294.
Julius Goldhar et al, An Efficient Double-Pass Raman Amplifier with Pump Intensity Averaging in a Light Guide, IEEE Journal of Quantum Electronics, vol. Qe-20, No. 7, Jul. 1984, pp. 772-785.

* cited by examiner

*Primary Examiner* — Tod T Van Roy
(74) *Attorney, Agent, or Firm* — McDermott Will & Emery LLP

(57) ABSTRACT

The invention relates to a two-stage laser system well fit for semiconductor aligners, which is reduced in terms of spatial coherence while taking advantage of the high stability, high output efficiency and fine line width of the MOPO mode. The two-stage laser system for aligners comprises an oscillation-stage laser (50) and an amplification-stage laser (60). Oscillation laser light having divergence is used as the oscillation-stage laser (50), and the amplification-stage laser (60) comprises a Fabry-Perot etalon resonator made up of an input side mirror (1) and an output side mirror (2). The resonator is configured as a stable resonator.

17 Claims, 70 Drawing Sheets

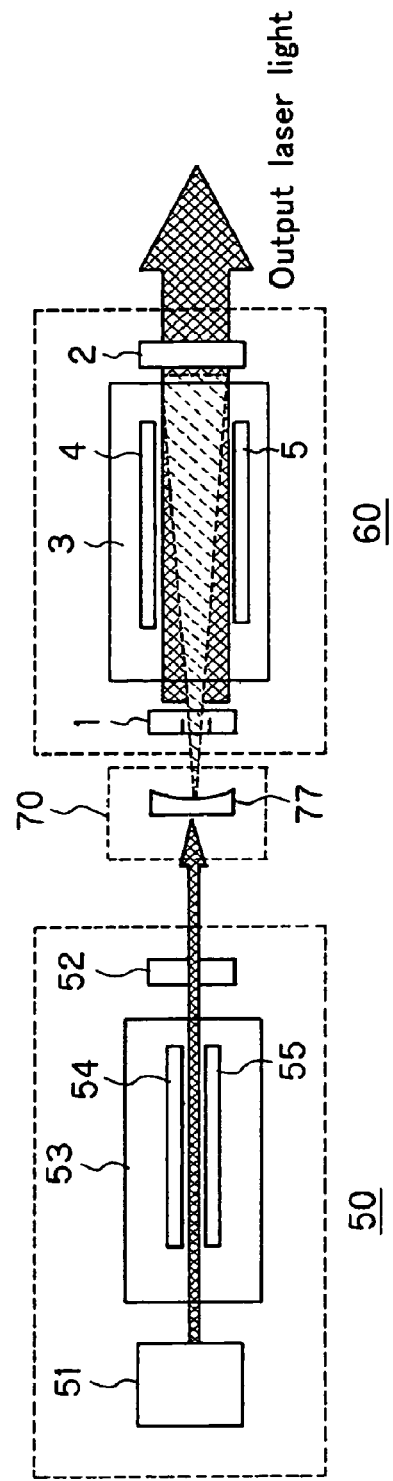
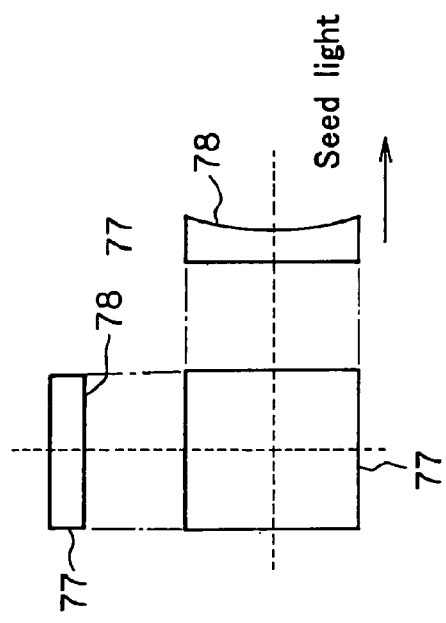
FIG. 12 (a)
FIG. 12 (b)

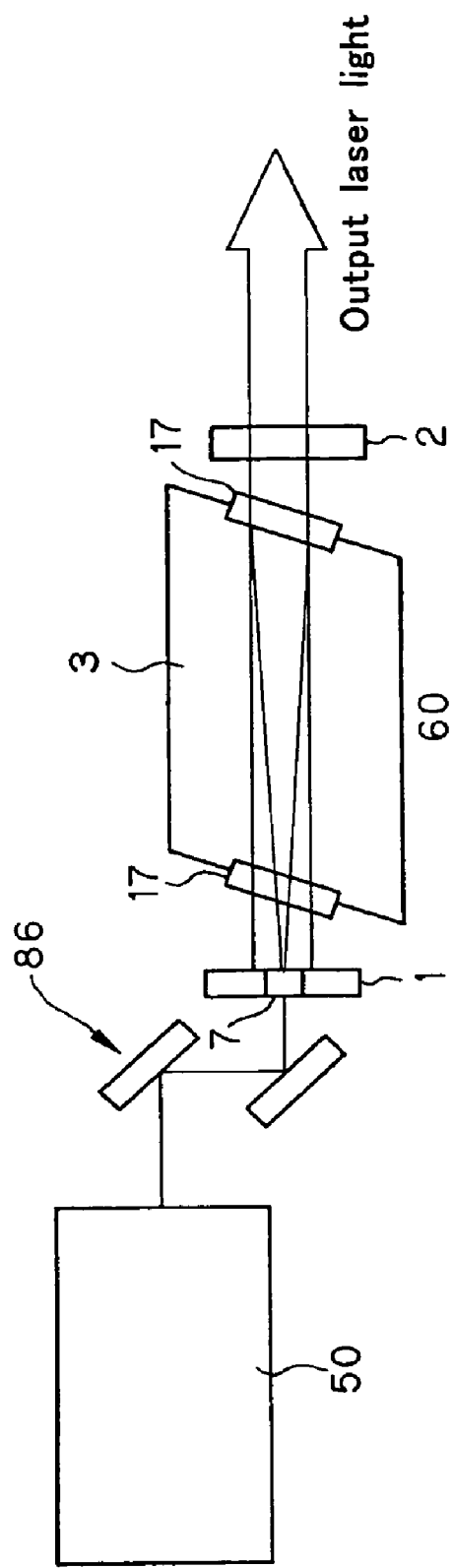
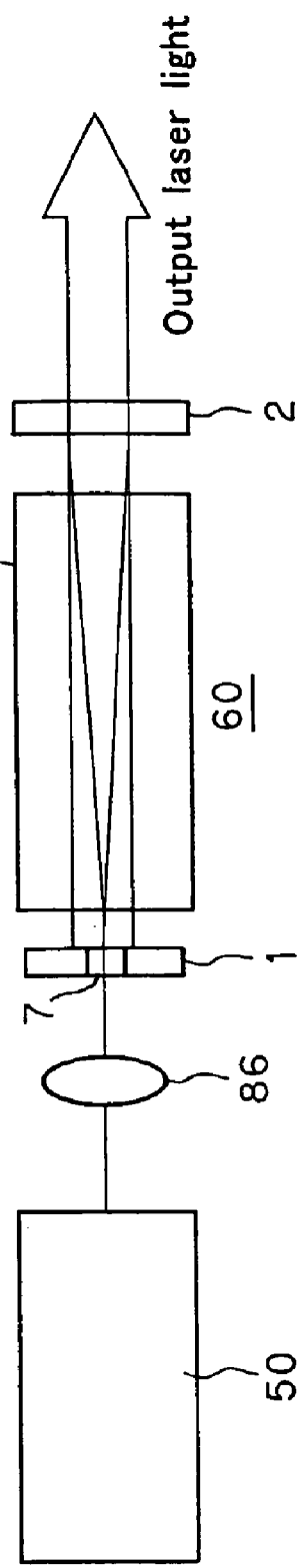
FIG. 14 (a)
FIG. 14 (b)

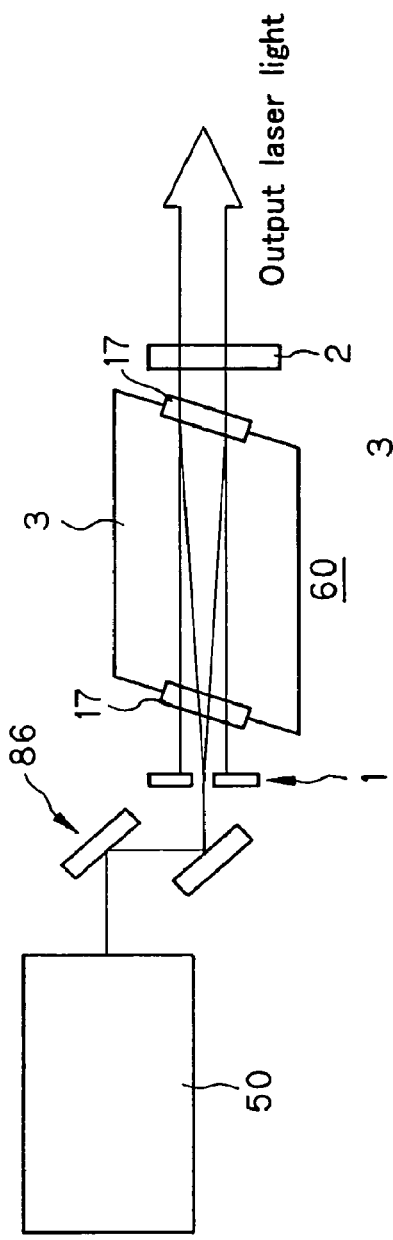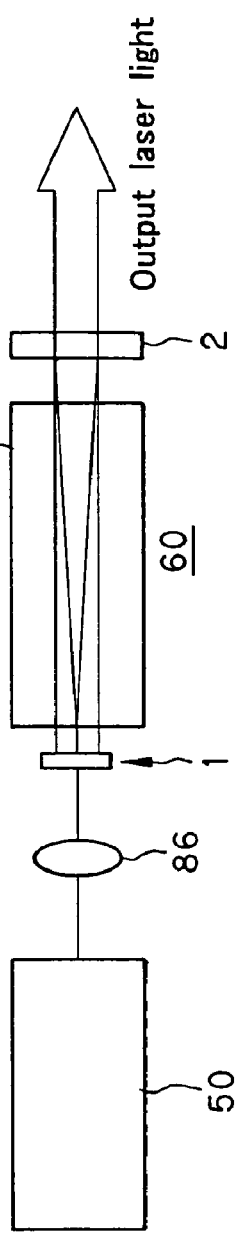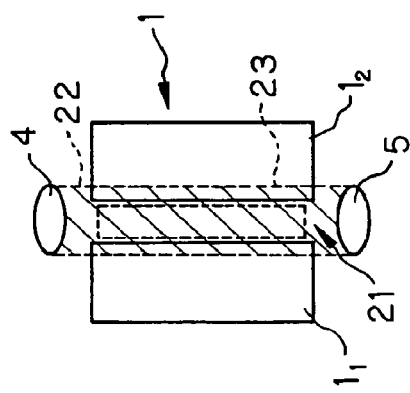
FIG. 16 (a)
FIG. 16 (b)
FIG. 16 (c)

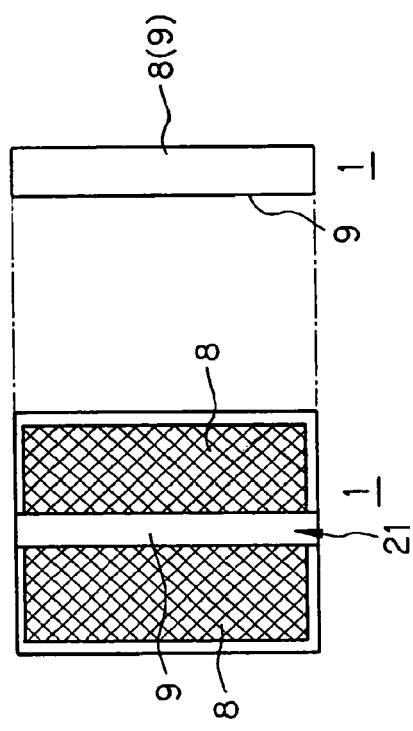
FIG. 17(a)  FIG. 17(b)
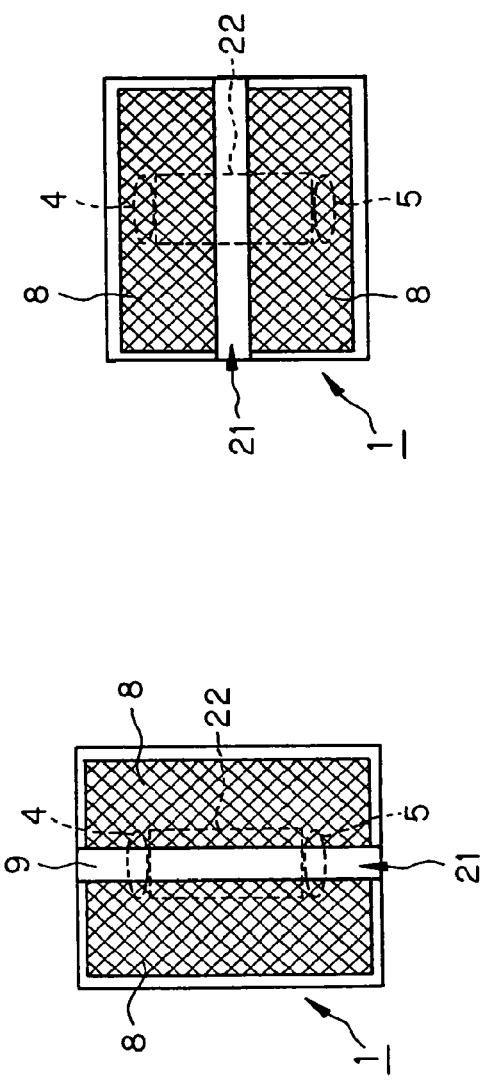
FIG. 17(d)
FIG. 17(c)

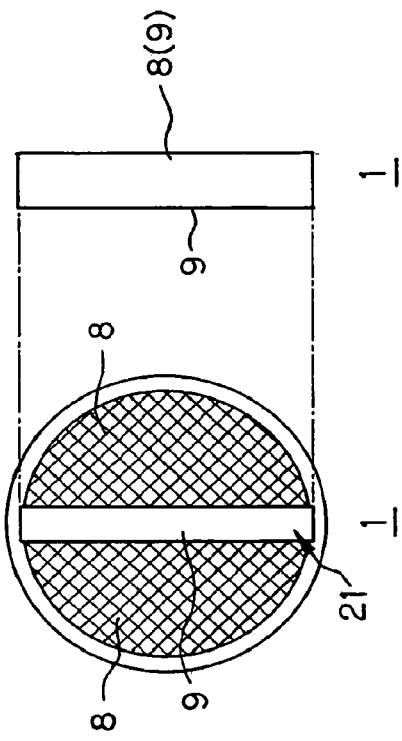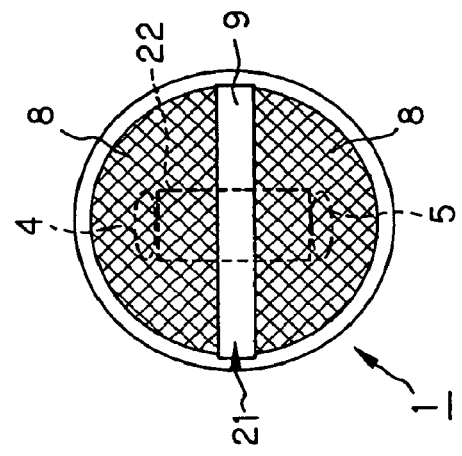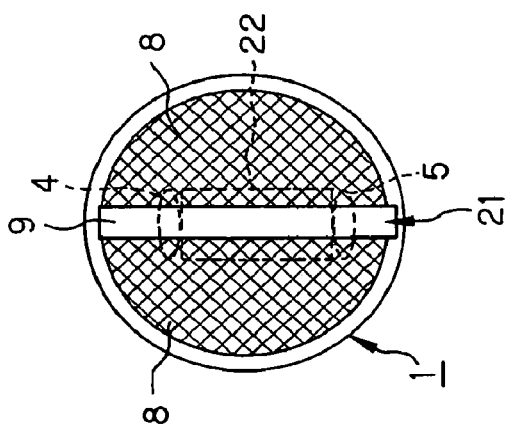

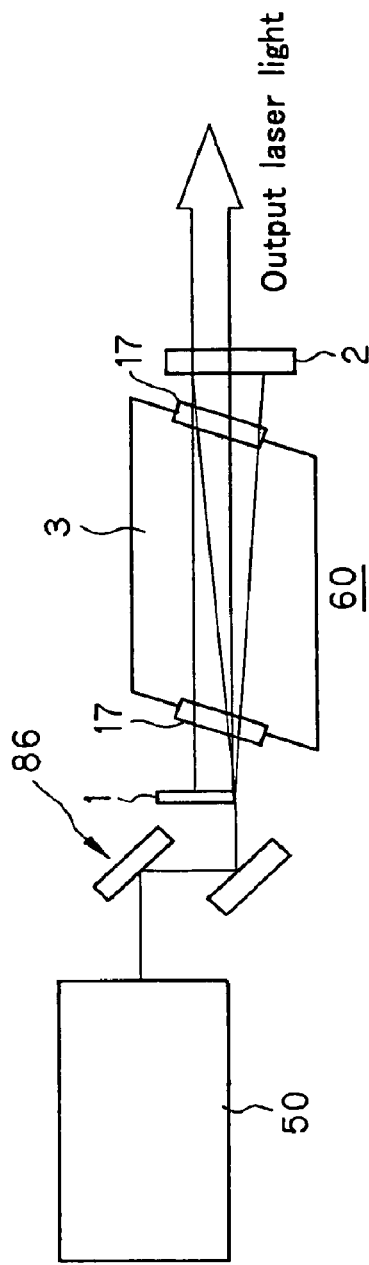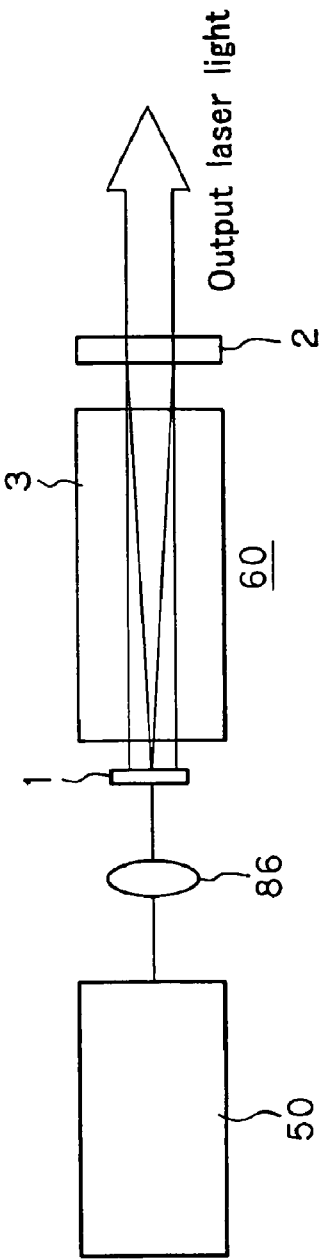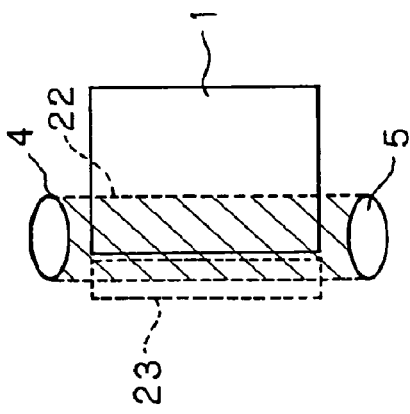
FIG. 19(a)
FIG. 19(b)
FIG. 19(c)

FIG. 23
FIG. 23(a)  FIG. 23(b)
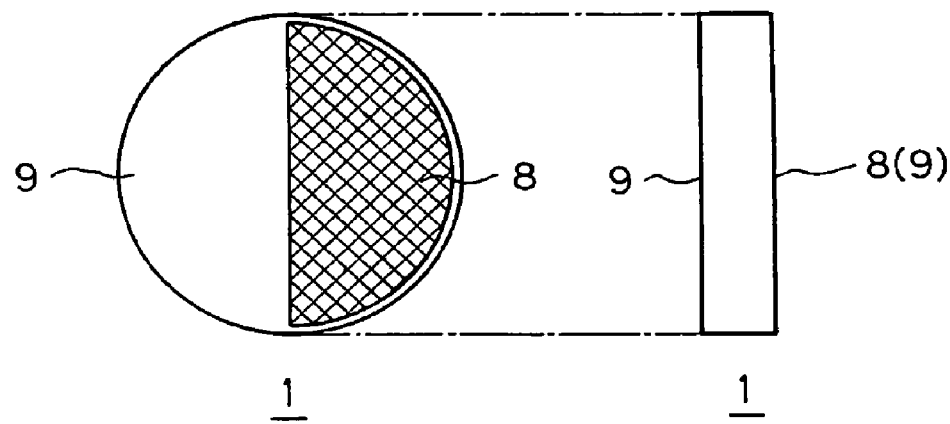
FIG. 23(c)  FIG. 23(d)
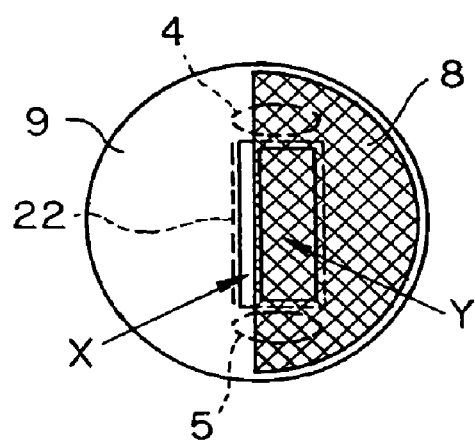 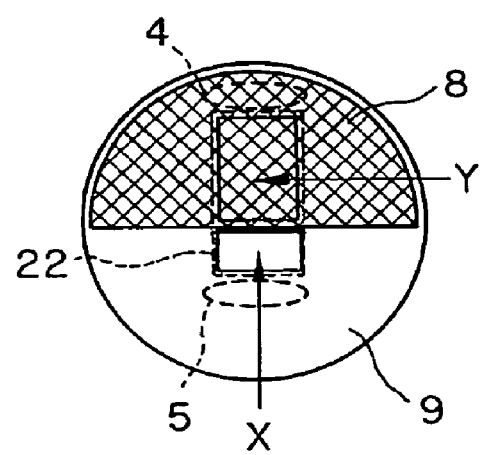

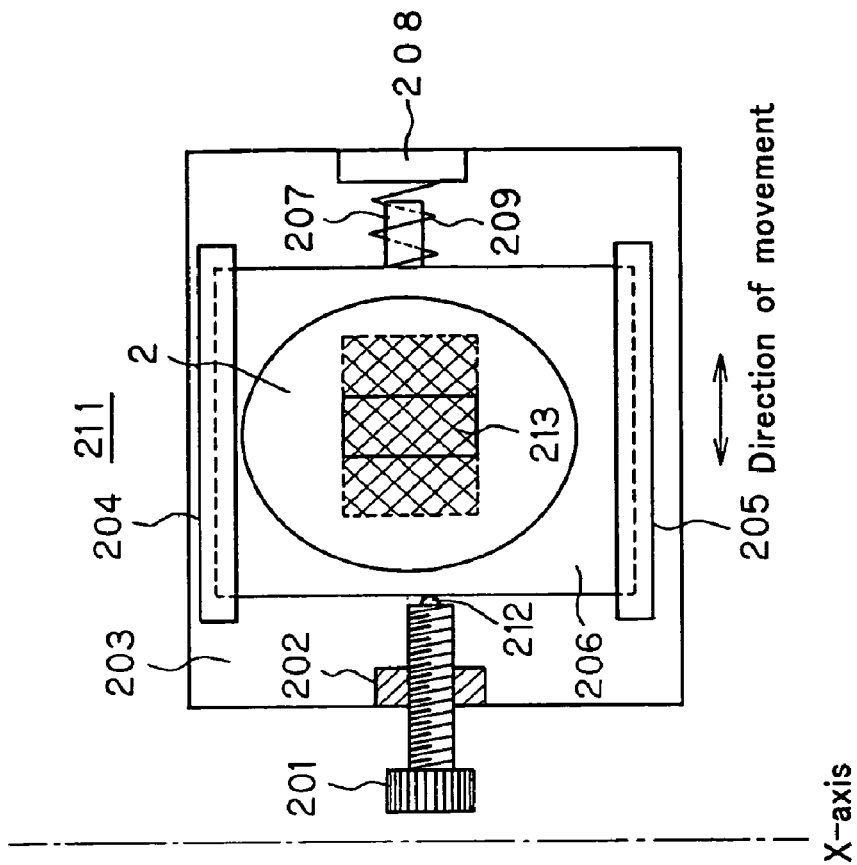
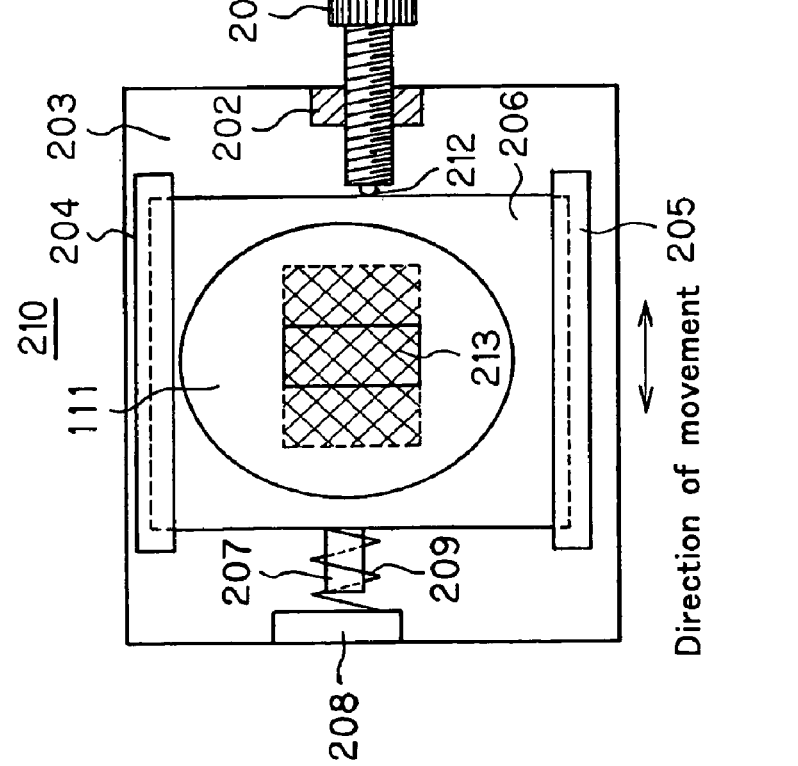

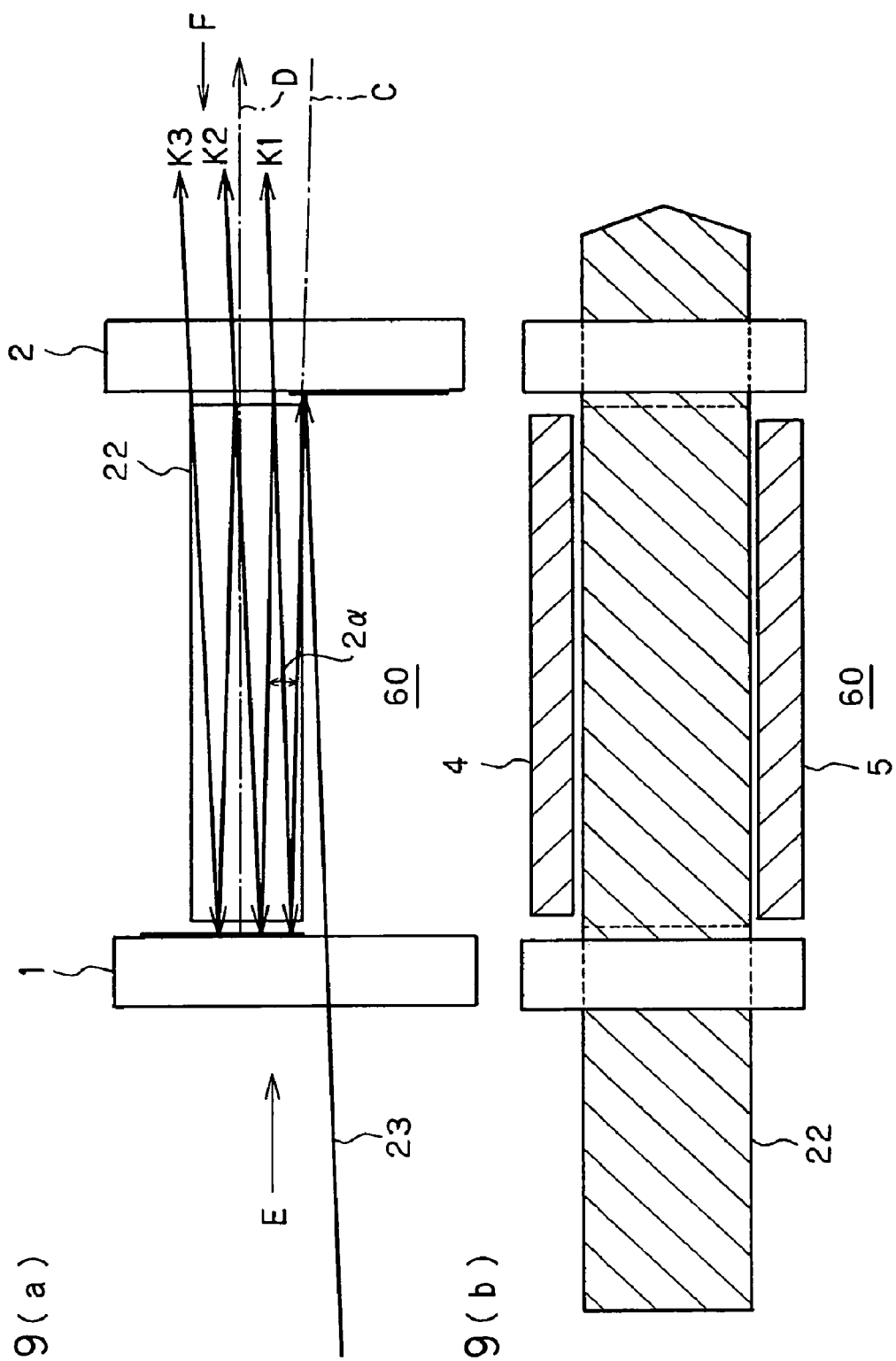

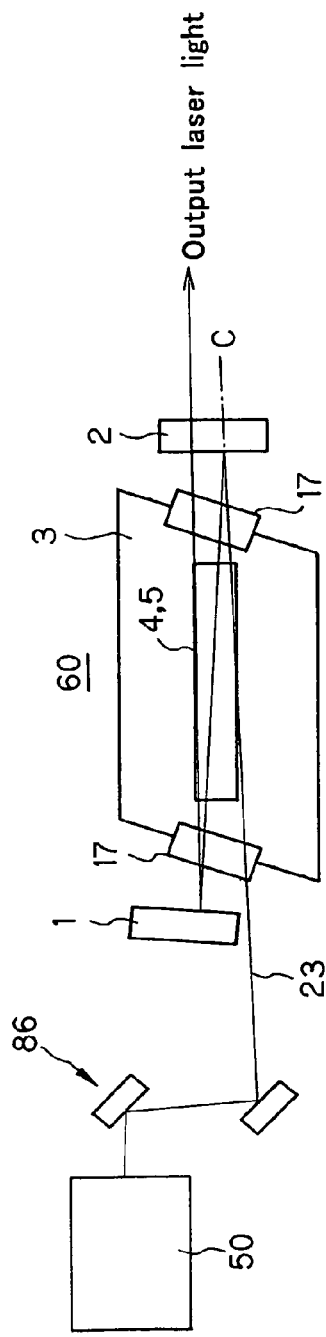
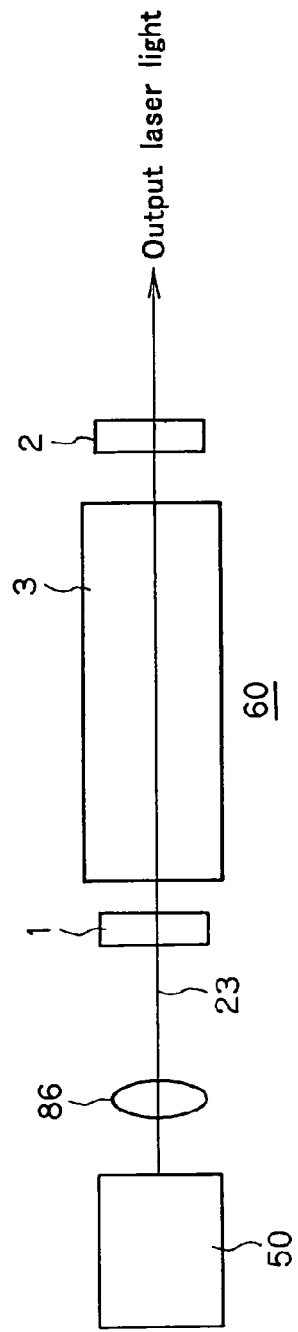
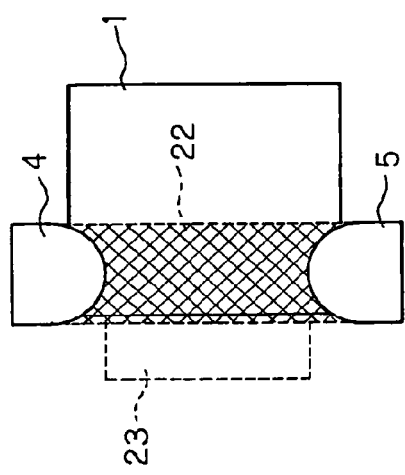
FIG. 31(a)
FIG. 31(b)
FIG. 31(c)

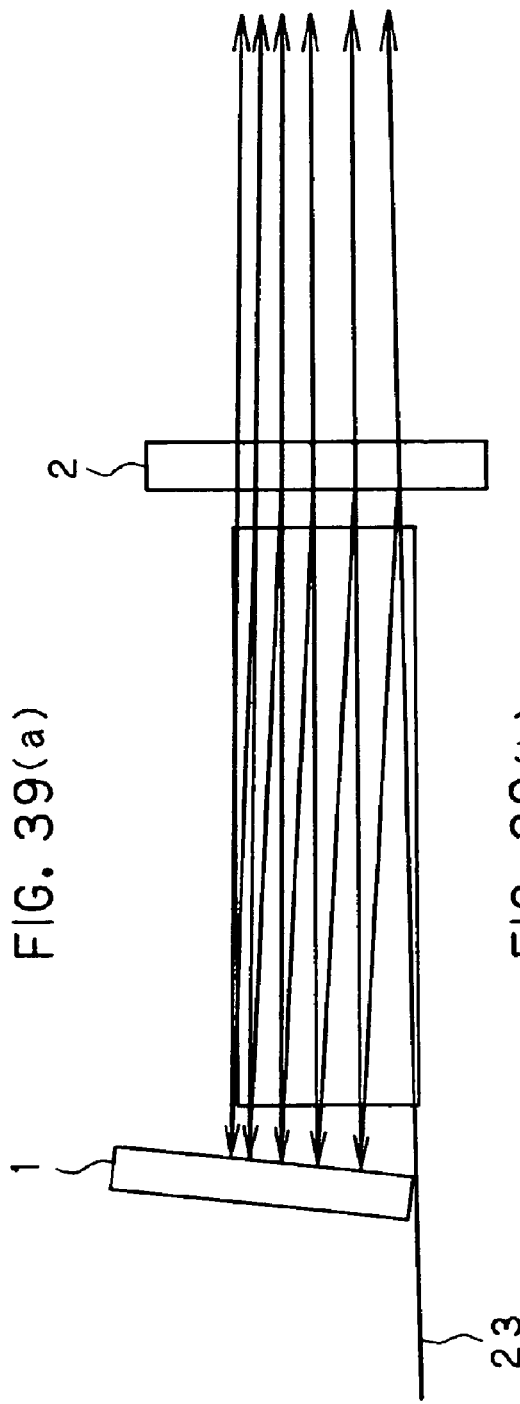
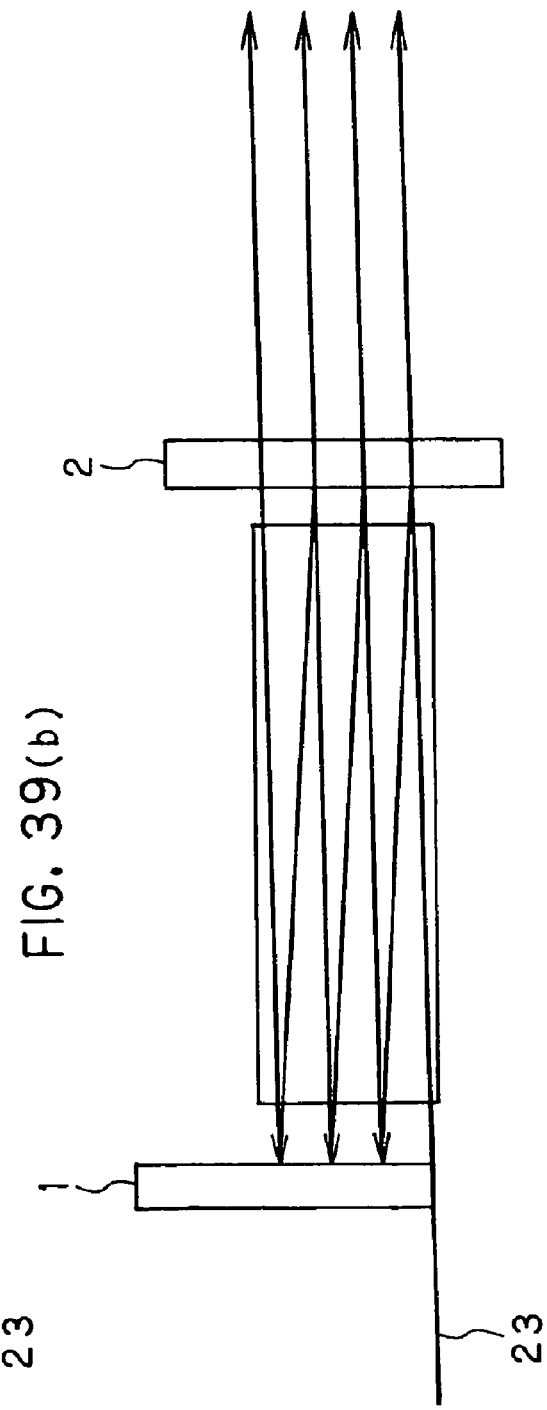
FIG. 39(a)
FIG. 39(b)

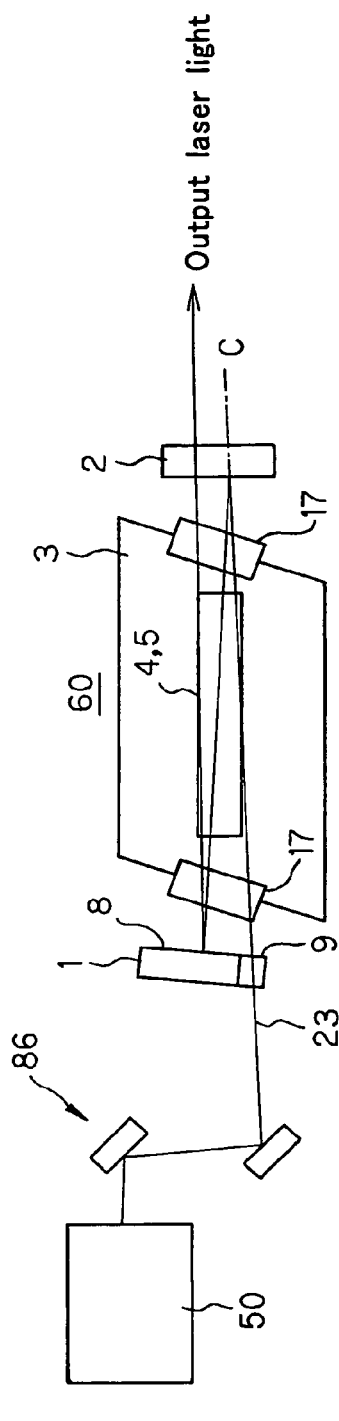
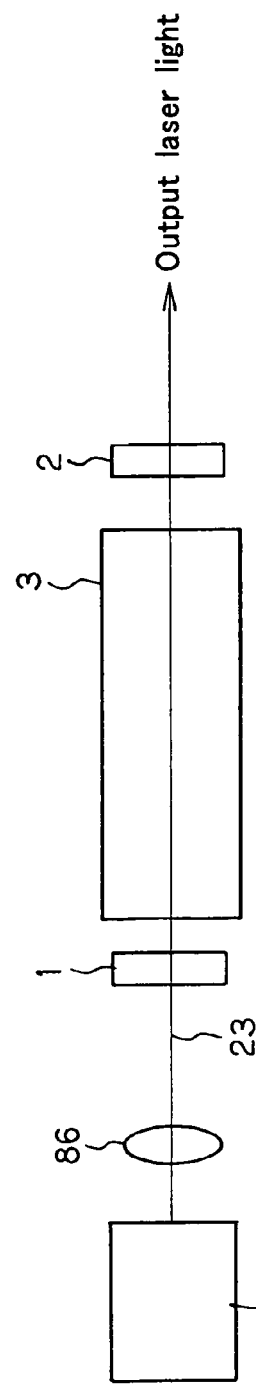
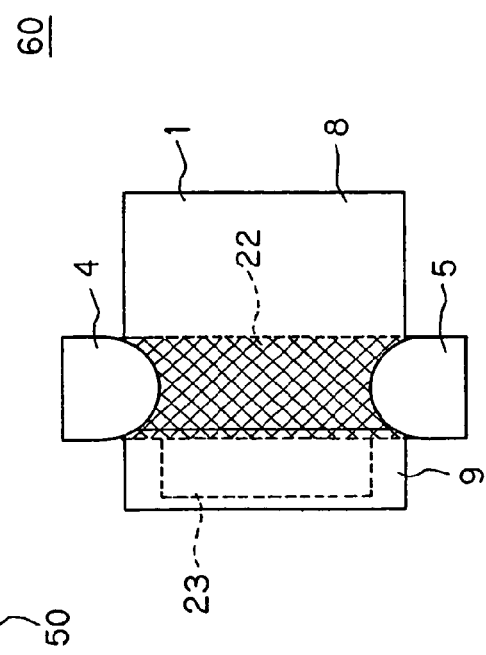
FIG. 44(a)
FIG. 44(b)
FIG. 44(c)

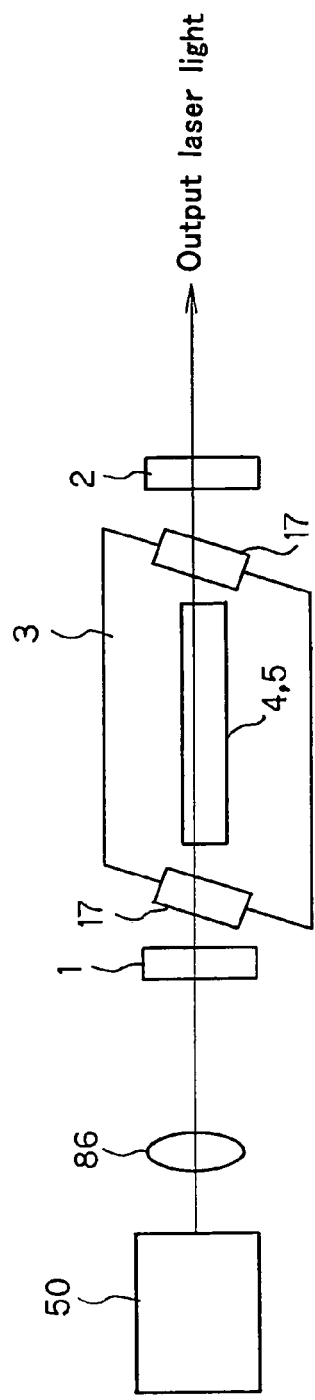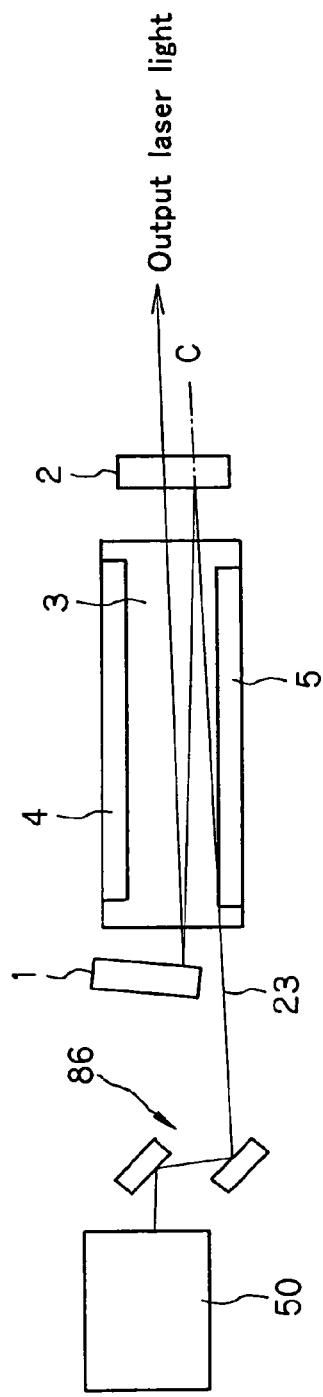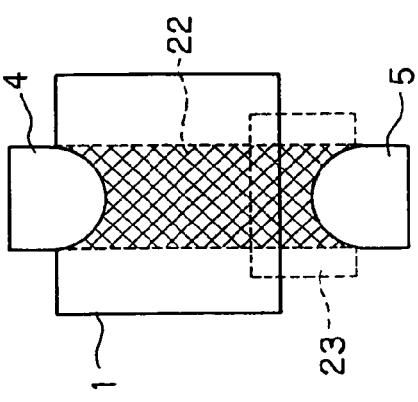
FIG. 47(a)
FIG. 47(b)
FIG. 47(c)

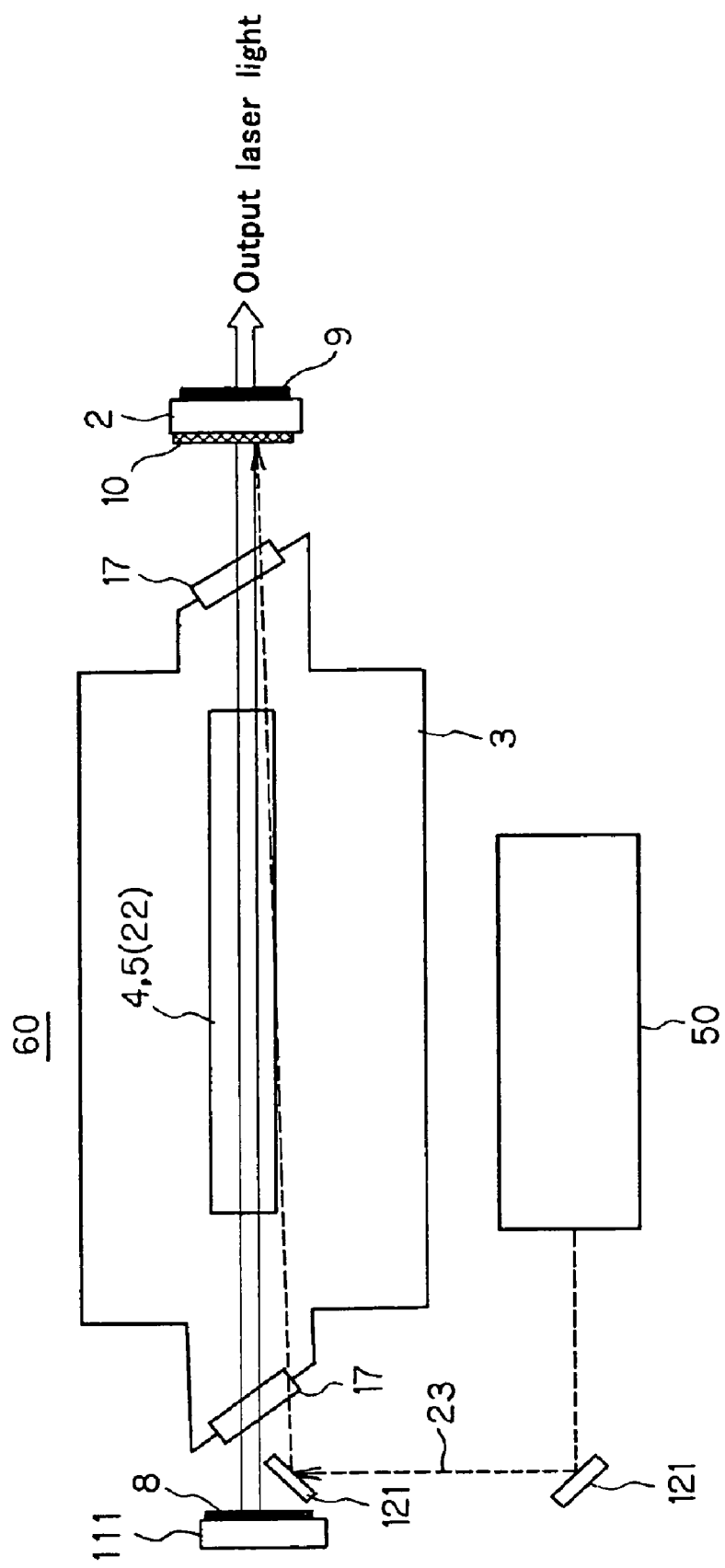

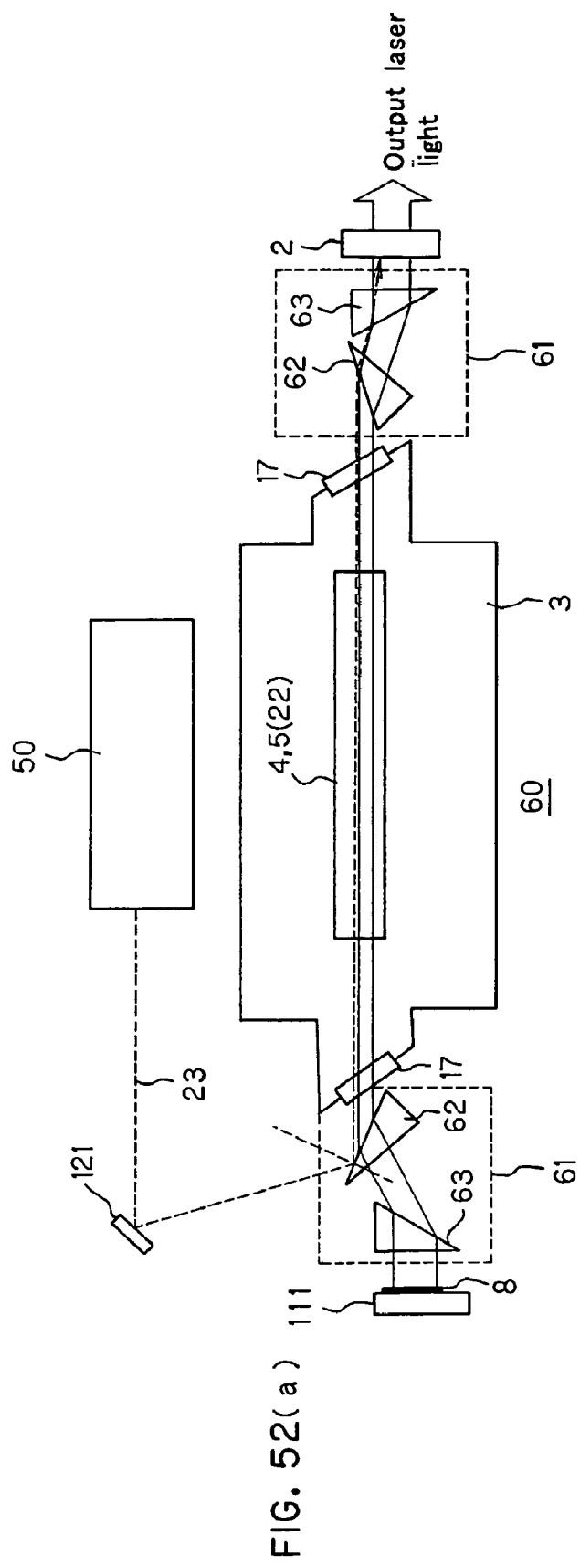
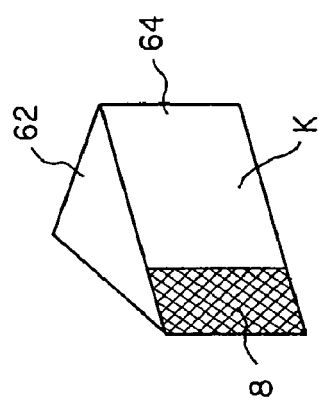
FIG. 52(a)
FIG. 52(b)

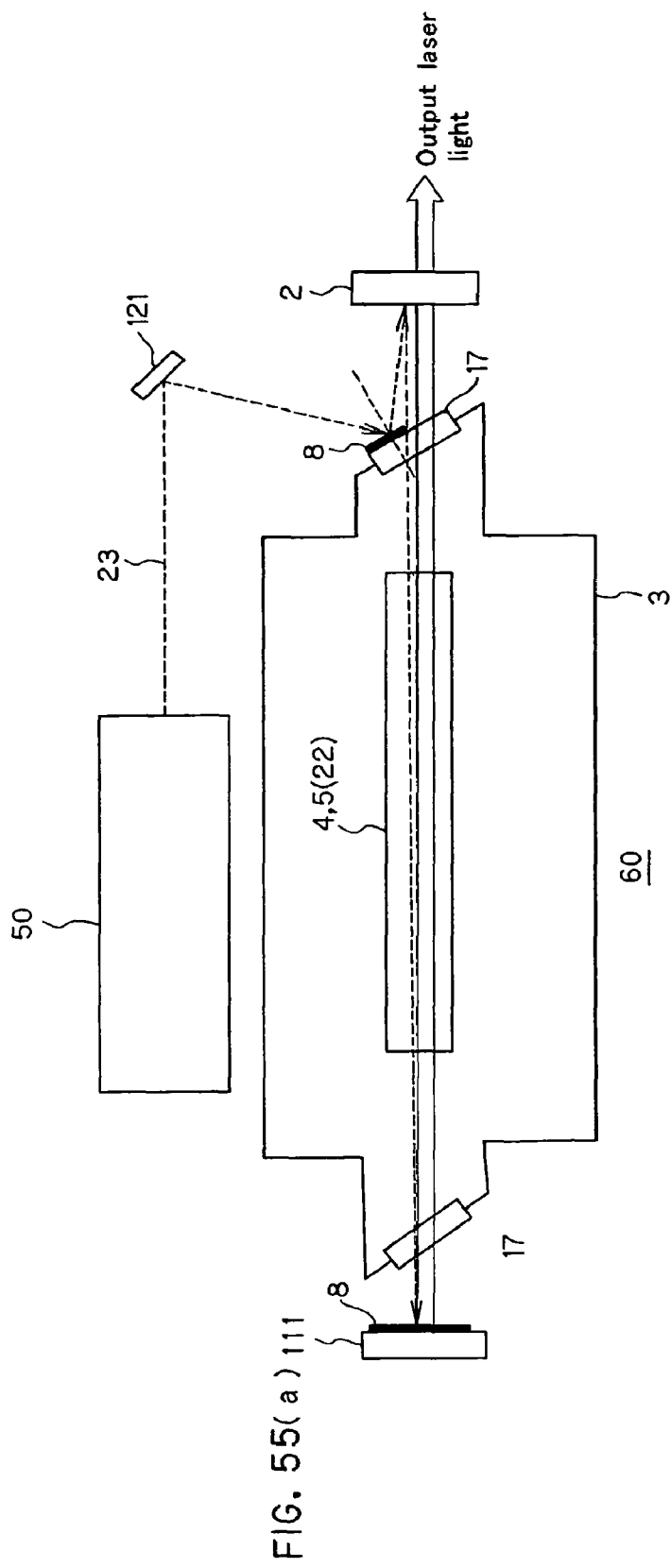
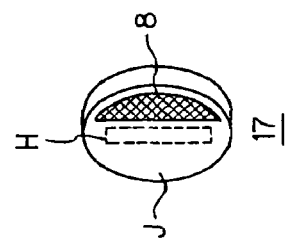
FIG. 55(a)
FIG. 55(b)

Section of the oscillation-stage laser beam

Section of the amplification-stage laser beam

Section of oscillation-stage laser beam

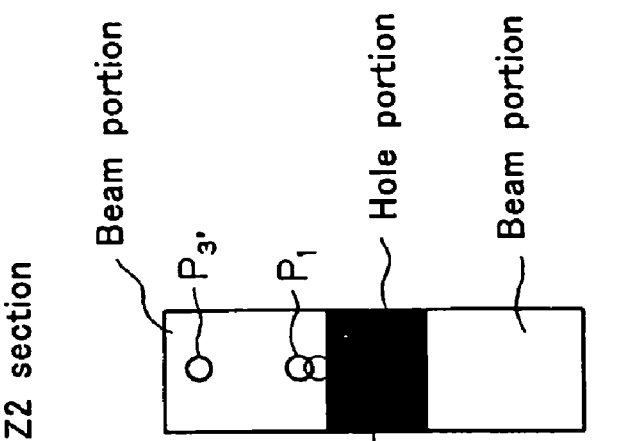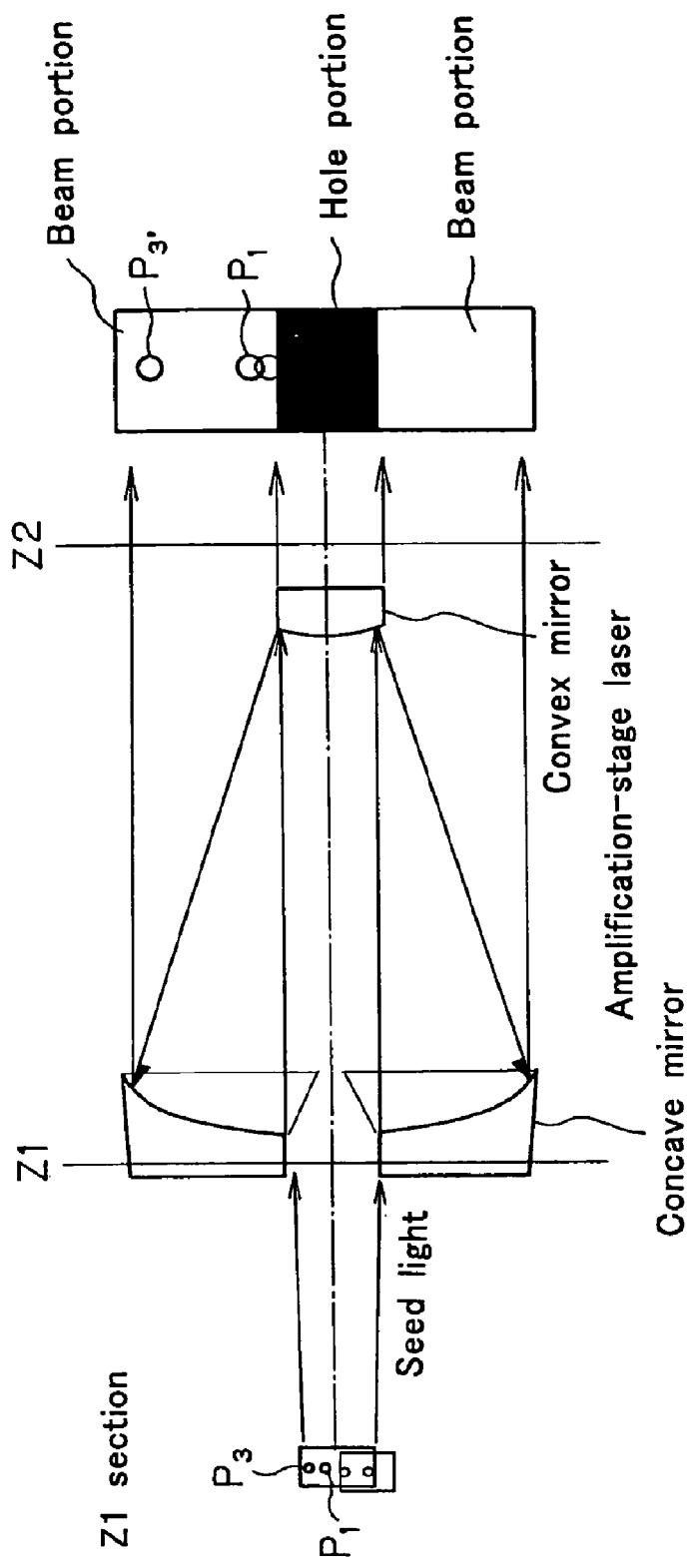

TWO-STAGE LASER SYSTEM FOR ALIGNERS

ART FIELD

The present invention relates generally to a two-stage laser system for aligners, and more particularly to a two-stage laser system well fit for semiconductor aligners, which is reduced in terms of spatial coherence.

BACKGROUND ART

So far, two-stage laser systems comprising an oscillation-stage laser and an amplification-stage laser adapted to amplify laser light emitted out of the oscillation-stage laser have been known so far in the art for the purpose of obtaining high outputs. Two modes, MOPA (Master Oscillator Power Amplifier) and MOPO (Master Oscillator Power Oscillator) are known for double-chamber laser systems. The former is a mode having no resonator in the amplification stage, and the latter is a mode having an unstable resonator in the amplification stage. The MOPA mode and the MOPO mode have merits and demerits over each other.

MOPA (a) Low spatial coherence (merit). That is, given the same share quantity (pinhole-to-pinhole spacing) in the beam transverse direction, the visibility of interference fringes is low. Notice that the share quantity and visibility will be explained later.
(b) Low energy stability (demerit). This is because output fluctuations are sensitive to fluctuations of synchronous excitation timing between the chambers.
(c) Output efficiency is lower than that of the MOPO mode; laser (seed) energy from the oscillation-stage laser must be more than that of the MOPO mode (demerit).
(d) Thick spectral line width (demerit). This is because the latter half of a laser pulse from the oscillation-stage laser contains a lot more roundtrips, and so the spectral line width is too narrow to amplify the tail of that latter half.

MOPO (a) High spatial coherence (demerit). That is, given the same share quantity (pinhole-to-pinhole spacing) in the beam transverse direction, the visibility of interference fringes is high.
(b) High energy stability (merit). This is because output fluctuations are insensitive to fluctuations of synchronous excitation timing between the chambers.
(c) Output efficiency is higher than that of the MOPA mode; laser (seed) energy from the oscillation-stage laser can be less than that of the MOPA mode (merit).
(d) Fine spectral line width (merit). This is because the latter half of a laser pulse from the oscillation-stage laser contains a lot more roundtrips, and so the spectral line width is narrow enough to amplify the tail of that latter half.

As described above, the MOPO mode is more favorable than the MOPA mode saving (a) spatial coherence; in other words, it will be more suitable as a light source for semiconductor aligners such as excimer laser or $F_2$ laser, if proper action is taken to reduce the spatial coherence.

However, the MOPO mode has now been found to have problems in conjunction with the use of an unstable resonator as mentioned above. The problems will now be discussed at great length.

In what follows, the "oscillation-stage laser" will be tantamount to the "line narrowing oscillation-stage laser". A MOPA system, and a MOPO system is basically made up of at least one oscillation-stage laser and one amplification stage or amplification-stage laser. When there is no resonator in the amplification-stage laser, that amplification-stage laser is herein called the amplification stage with no resonance of light. A system having a resonator in the amplification stage is called a MOPO system. When there is a resonator in the amplification stage, the amplification stage functions as an amplification-stage laser with resonance of light. Accordingly, when the amplification stage is compared with the amplification-stage laser, higher efficiency amplification is achievable with the amplification-stage laser than with the amplification stage, given equal excitation energy.

So far, the amplification-stage laser of an excimer laser MOPO system has incorporated an unstable resonator using a concave mirror having a seed light-introduction hole in its center as an input side mirror and a convex mirror as an output side mirror. Such a concave mirror/convex mirror combination of the unstable resonator constitutes a telephoto optical system having a geometrical magnification factor. Having an optical magnification of about 20, the unstable resonator is used for the purpose of efficiently obtaining high-output, high-coherence laser light in the MOPO system. Notice that the unstable resonator has so far been used primarily as a light source for physicochemical researches.

A system having an unstable resonator in an amplification-stage laser has been proposed as a light source for semiconductor aligners, as set forth in patent publication 1. Although this unstable resonator has an optical magnification reduced down to about 10, the inventors' experimentation has suggested that the spatial coherence is not reduced down to any sufficient level.

That is, the object of using the unstable resonator in a conventional MOPO system is to provide efficient amplification of seed light. A concave mirror that forms a part of the unstable resonator is located in the amplification-stage laser to inject the seed light all over the amplification-stage laser gain area, thereby providing efficient amplification of the seed light.

Patent Publication 1
U.S. Pat. No. 2,820,103
Non-Patent Publication 1
"Basics and Applications of Lasers", translated by Hitoshi Mochizuki and two others, pp. 30-33 (published from Maruzen Co., Ltd. on Jan. 20, 1986)
Non-Patent Publication 2
Sov. J. Quantum Electron. 16(5), May 1986, pp. 707-709

One of the specifications of much importance in a laser system for aligners is in-plane low coherence (spatial coherence) in a laser light profile section. This spatial coherence capability (coherence) is evaluated by comparison of the coherence of a partial beam profile at a given constant distance (share quantity) A in the beam profile. That distance indicated by A is a value determined by element-to-element spacing, etc. in a fly-eye lens used to eliminate brightness variations in an illumination system in a semiconductor aligner such as a stepper. Then, the spatial coherence at two points in the share quantity A is evaluated by visibility defined by the following formula:

$$\text{Visibility} = (\text{maximum fringe intensity } I_{max} - \text{minimum fringe intensity } I_{min}) \div (\text{maximum fringe intensity } I_{max} + \text{minimum fringe intensity } I_{min}) \quad (1)$$

Notice here that the "fringe intensity" means the intensity of interference fringes upon interference of light from two points. FIG. 71 is indicative in schematic of interference fringes of light from two points at a given share quantity A and their maximum and minimum fringe intensities $I_{max}$ and $I_{min}$, and FIG. 72 is indicative in schematic of interference fringes of light from two points at a given share quantity and their maximum and minimum fringe intensities $I_{max}$ and $I_{min}$, with an added laser portion. More specifically, FIG. 72 is a schematic representation of an optical arrangement for the evaluation of spatial coherence of a laser light source by a Young's interferometer as well as interference fringes of light from two points at a given share quantity (=pinhole-to-pinhole distance) and their maximum and minimum fringe intensities $I_{max}$ and $I_{min}$. Generally, the spatial coherence is determined depending on the size and intensity distribution of a light source, as viewed from the position of a pinhole that is a point of measurement.

FIG. 73 is indicative of the results of measurement of the visibility of a line narrowing laser and the results of measurement in the case of using the line narrowing laser as an oscillation-stage laser to provide amplification in an unstable resonator amplification-stage laser, as obtained in the inventors' experimentation. These results teach that it is required to satisfy the condition that the share quantity from a semiconductor aligner be equal to or greater than A and the visibility be equal to or less than Vt. Usually, the visibility of a single line narrowing laser satisfies this condition. However, when an unstable resonator having a magnification factor of 5 was used in the amplification-stage laser in this experimentation, the share quantity providing a visibility equal to or less than Vt increased up to B. B≈5×A; the share quantity providing the desired visibility equal to or less than Vt increases by the magnification factor of the unstable resonator. In other words, in the arrangement of FIG. 72 wherein the laser portion is added to FIG. 71, the spatial coherence is evaluated while a beam-expanding optical system comprising a combined concave mirror and convex mirror is located between the laser light source and the pinhole. In this case, the size of the light source, as viewed from the pinhole, decreases by the beam magnification factor. Thus, the share quantity providing the same visibility equal to or less than Vt increases by the magnification factor.

In view of the fact that when the unstable resonator is used in the amplification-stage laser, the share quantity increases by a quantity corresponding to the magnification of that unstable resonator, the inventors have made further experiments, using a MOPO system with a stable resonator the optical magnification of which is set at 1 using plane mirrors as both input- and output-side mirrors. As a result, it has been found that the share quantity A equivalent to that obtained with a single oscillation-stage laser, i.e., that of seed light can be achieved with a MOPO system using that resonator (FIG. 73). That is, the inventors have now discovered that as the unstable resonator is used in the amplification-stage laser of the MOPO system, it causes the share quantity to increase by the optical magnification factor of the unstable resonator, and that if a stable resonator is used, this can then be averted. As described later, this finding is one of the rudiments of the invention.

From another angle of view, why the spatial coherence and the share quantity increase with the use of the unstable resonator is now explained.

FIG. 74 is illustrative in (beam profile) section of laser light emitted out of an oscillation-stage laser. Consider now the coherence of laser light P1 and P2' spaced away by a distance A1 and laser light P1 and P2 spaced away by a distance A2 in the beam profile. As shown in FIG. 75, the laser light P1 and P2' at a short distance are put in order or substantially equal in terms of wave phase. With increasing distance, however, there is a little wave phase shift even at the same wavelength; laser light P1 and P2 at a relatively long distance are less likely to interfere spatially. In other words, a long pinhole-to-pinhole distance allows for a decrease in the visibility of interference fringes.

In the prior art, the amplification-stage laser resonator was an unstable resonator. As shown in FIG. 78(a), the unstable resonator comprises an input side concave mirror and an output side convex mirror, and is of the type that is capable of geometrically expanding the section of seed light. Accordingly, when both the amplification-stage laser and the oscillation-stage laser are of much the same size in excitation section (discharge section), seed light from the oscillation-stage laser is such that a partial beam portion having a radius 3A is cut out of the general beam section, as shown in FIG. 76. In the section cut out in this way, the closer the laser light P2 is to the laser light P3, the higher the visibility of interference fringe becomes. Although there is a low visibility at a distance A3, the visibility of interference fringe at distance A4 becomes higher with increasing coherence.

As described above, the prior art amplification-stage laser resonator is an expander system; laser light is expanded while high coherence is maintained. As a consequence, the post-amplification laser light P3 diverges to the position of P3' as shown in FIG. 77, while high coherence is maintained intact. Thus, even when the specifications for coherence are met at a distance A5 in the oscillation-stage laser, high coherence is still maintained even at a distance A6 beyond the distance A5 by the expansion of the beam of seed light after amplification, offering a problem that the specifications for low coherence are not met.

FIG. 78 is illustrative of how seed light (explained with reference to FIGS. 76 and 77) diverges in the amplification-stage laser using an unstable resonator. A laser light section at a position Z1 of the input side concave mirror (FIG. 78(b)) corresponds to FIG. 76, and a laser light section at a position Z2 of the output side convex mirror (FIG. 78(c)) corresponds to FIG. 77. In the prior art, the amplification-stage laser resonator was an unstable resonator. As shown in FIG. 81(a), the unstable resonator comprises an input side cylindrical concave mirror and an output side cylindrical convex mirror. Reference is now made to a resonator of the type that is capable of geometrically expanding the section of seed light in a longitudinal direction. Seed light oscillated out of the oscillation-stage laser is such that, as shown in FIG. 79, the visibility at a distance A3 (share quantity) between laser light P1 and P3 is higher in the section of injection of seed light than in the section of a beam in the amplification-stage laser amplified by the unstable resonator shown in FIG. 80. Given visibility equivalent to that in the oscillation-stage laser, the distance A4 between laser light P1 and P3 becomes long by the magnification factor of the unstable resonator, meaning that the spatial coherence becomes high.

With the prior art two-stage laser system for aligners that relies upon the MOPO mode, the spatial coherence distance becomes long in proportion to the magnification factor at which the beam of seed light is expanded by the unstable resonator, because the unstable resonator is used in the amplification-stage laser. Thus, the prior art two-stage laser is less than satisfactory for light sources for semiconductor aligners.

DISCLOSURE OF THE INVENTION

In view of such problems with the prior art as described above, the primary object of the invention is to provide a two-stage laser system well fit for semiconductor aligners, which is reduced in terms of spatial coherence while taking advantage of the high stability, high output efficiency and fine line width of the MOPO mode.

According to the invention, this object is accomplished by the provision of a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, said oscillation-stage laser and said amplification-stage laser each comprises a chamber filled with a laser gas, said oscillation-stage laser oscillates laser light having divergence, and said amplification-stage laser comprises a Fabry-Perot etalon type resonator, wherein said resonator is configured as a stable resonator.

Preferably in this case, the resonator comprises an input side mirror in which laser light oscillated out of said oscillation-stage laser is entered and an output side mirror through which amplified laser light outputs, wherein the input side mirror comprises a total-reflection mirror having a total-reflection mirror coating externally of an area through which laser light oscillated out of the oscillation-stage laser is introduced in the resonator, and the output side mirror comprises a planar, partial reflecting mirror.

The substrate of the input side mirror could be provided in its substantially central portion with a hole or slit shaped in such a way as to introduce laser light oscillated out of the oscillation-stage laser in the resonator.

The substrate of the input side mirror is formed of a transparent substrate, and a total-reflection mirror coating is applied to a peripheral area of the surface of the transparent substrate other than an area at a substantially central portion of the surface of the transparent substrate, wherein said area is shaped in such a way as to introduce laser light oscillated out of the oscillation-stage laser in the resonator, or a slit area including said shape.

The laser light oscillated out of the oscillation-stage laser could be introduced in the resonator from a periphery of the input side mirror or a peripheral portion thereof that is not applied with a total-reflection mirror coating.

Alternatively, the resonator could comprise an input side mirror in which the laser light oscillated out of the oscillation-stage laser is entered and an output side mirror through which the amplified laser light outputs, wherein the input side mirror comprises a partial reflecting mirror and the output side mirror comprises a planar, partial reflecting mirror.

The laser light oscillated out of the oscillation-stage laser could be introduced in the resonator from a periphery of the input side mirror.

The output side mirror in the resonator in the oscillation-stage laser and the input side mirror in the amplification-stage laser could be formed on each side surface of the same substrate.

The input side mirror comprises a plane mirror, a concave mirror or a cylindrical concave mirror.

Alternatively, the resonator could comprise an output side mirror in which the laser light oscillated out of the oscillation-stage laser is entered and through which the amplified laser light outputs, and a rear side mirror, wherein the substrate of the output side mirror is formed of a transparent substrate, an area of the output side mirror, through which the amplified laser light outputs, has a partial reflection capability, and the rear side mirror comprises a planar total-reflection mirror.

The resonator could comprise an output side mirror in which the laser light oscillated out of the oscillation-stage laser is entered and through which the amplified laser light outputs, and a right-angle prism, wherein the substrate of the output side mirror is formed of a transparent substrate, an area of the output side mirror, through which the amplified laser light outputs, has a partial reflection capability, and the right-angle prism comprises a total-reflection right-angle prism capable of reflecting all incident light.

The laser light oscillated out of the oscillation-stage laser is introduced in the resonator from a periphery of the output side mirror or a peripheral portion of the output side mirror having no partial reflection capability.

The output side mirror could be a partial reflecting mirror. In this case, the laser light oscillated out of the oscillation-stage laser could be introduced in the resonator from a periphery of the output side mirror.

The output side mirror could comprise a plane mirror, a concave mirror or a cylindrical concave mirror.

In the two-stage laser system for aligners according to the invention, the resonator could comprise an input side mirror in which the laser light oscillated out of the oscillation-stage laser is entered, wherein the input side mirror comprises a partial reflecting mirror, and an output side mirror, wherein the output light of the oscillation-stage laser is entered in the resonator through the partial reflecting mirror, and the optical axis of the resonator is in substantial alignment with the optical axis of the oscillation-stage laser.

The resonator could comprise a total-reflection rear side mirror and an output side mirror, wherein a beam splitter is located between the rear side mirror and a rear side laser window and on the optical axis of said resonator, the laser light oscillated out of the oscillation-stage laser is incident on the beam splitter, and the optical axis of laser light reflected from the beam splitter is in substantial alignment with the optical axis of the resonator.

The resonator could comprise a total-reflection rear side mirror and an output side mirror, wherein a beam splitter is located between the rear side mirror and a front side laser window and on the optical axis of the resonator, the laser light oscillated out of the oscillation-stage laser is incident on the beam splitter, and the optical axis of laser light reflected from the beam splitter is in substantial alignment with the optical axis of the resonator.

The resonator could comprise a total-reflection rear side mirror and an output side mirror, wherein a beam splitter, on which the laser light oscillated out of the oscillation-stage laser is incident, is located externally of the resonator and on the optical axis of the resonator, the laser light oscillated out of the oscillation-stage laser is incident on the beam splitter, the optical axis of laser light reflected from the beam splitter is in substantial alignment with the optical axis of said resonator, and the laser light is entered in the resonator through the output side mirror.

A front mirror in the oscillation-stage laser could comprise a partial reflecting mirror, and be shared by an input side mirror in which the laser light oscillated out of the oscillation-stage laser is entered.

In the two-stage laser system for aligners according to the invention, the optical axis of laser light oscillated out of the oscillation-stage laser and entered in the amplification-stage laser could be set at an angle with respect to the optical axis of the resonator in the amplification-stage laser.

A length about twice as long as the length of the resonator in the amplification-stage laser could be set longer than a time-based coherent length corresponding to the spectral line width of the oscillation-stage laser.

The two-stage laser system for aligners according could further comprise between the oscillation-stage laser and the amplification-stage laser a conversion optical system having at least one of a function of compressing the beam shape of laser light oscillated out of the oscillation-stage laser and a function of magnifying the divergence of laser light oscillated out of the oscillation-stage laser.

Preferably, the divergence of laser light entered in the amplification-stage laser should satisfy the following conditions:

$$\theta h \geq \text{Tan}^{-1}[\{(Ha-Hs)/2\} \cdot (1/L)/(P \cdot c/L)] \quad (2)$$
$$= \text{Tan}^{-1}\{(Ha-Hs)/(2 \cdot P \cdot c)\}$$

$$\theta v \geq \text{Tan}^{-1}[\{(Va-Vs)/2\} \cdot (1/L)/(P \cdot c/L)] \quad (3)$$
$$= \text{Tan}^{-1}\{(Va-Vs)/(2 \cdot P \cdot c)\}$$

Here $\theta v$ and $\theta h$ are the angles of divergence of laser light entered in the amplification-stage laser in the vertical and horizontal directions, respectively, P is an effective pulse width, c is the velocity of light, L is a resonator length, Vs and Hs are the beam diameters of laser light entered in the amplification-stage laser in the vertical and horizontal directions, respectively, and Va and Ha are the beam diameters of output light in the vertical and horizontal directions, respectively.

The invention also provides a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, the oscillation-stage laser and the amplification-stage laser each comprises a chamber filled with a laser gas, the oscillation-stage laser oscillates laser light having divergence, the amplification-stage laser comprises a ring resonator comprising an input/output partial reflecting mirror and a plurality of total-reflection mirrors for reflecting laser light entered via the partial reflecting mirror back to a position of the partial reflecting mirror, and the partial reflecting mirror and the plurality of total-reflection mirrors are each formed of a plane.

In this case, between the oscillation-stage laser and the amplification-stage laser there could be located a conversion optical system having a function of compressing the beam shape of laser light oscillated out of the oscillation-stage laser.

The optical path length in the ring resonator could be set longer than a time-based coherent length corresponding to the spectral line width of the oscillation-stage laser.

Further, the invention provides a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, the oscillation-stage laser and the amplification-stage laser each comprises a chamber filled with a laser gas, said amplification-stage laser comprises a Fabry-Perot etalon resonator, wherein the resonator is configured as a stable resonator, and the optical axis of laser light oscillated out of the oscillation-stage laser and entered in the amplification-stage laser is set at an angle with respect to the optical axis of the resonator in the amplification-stage laser.

Further, the invention provides a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, the amplified laser light leaves as output, wherein the oscillation-stage laser and the amplification-stage laser each comprises a chamber filled with a laser gas, the amplification-stage laser comprises a Fabry-Perot etalon resonator, wherein the resonator is configured as a stable resonator, and a length about twice as long as the length of the resonator in the amplification-stage laser is set longer than a time-based coherent length corresponding to the spectral line width of the oscillation-stage laser.

Further, the invention provides a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, the oscillation-stage laser and the amplification-stage laser each comprises a chamber filled with a laser gas, the amplification-stage laser comprises a Fabry-Perot etalon resonator, wherein the resonator is configured as a stable resonator, the optical axis of laser light oscillated out of the oscillation-stage laser and entered in the amplification-stage laser is set at an angle with respect to the optical axis of the resonator in the amplification-stage laser, and a length about twice as long as the length of the resonator in the amplification-stage laser is set longer than a time-based coherent length corresponding to the spectral line width of the oscillation-stage laser.

Further, the invention provides a two-stage laser system for aligners, comprising an oscillation-stage laser and an amplification-stage laser, wherein:

laser light output from said oscillation-stage laser is injected into said amplification-stage laser and is amplified therein, said amplified laser light is output from said amplification-stage laser, the oscillation-stage laser and the amplification-stage laser each comprises a chamber filled with a laser gas, the amplification-stage laser comprises a resonator comprising a rear side mirror and an output side mirror, the reflecting surfaces of the rear side mirror and the output side mirror are each formed of a plane, the normal lines to the rear side mirror and the output side mirror are set at an angle with respect to the optical axis of laser light oscillated out of the oscillation-stage laser and entered in the amplification-stage laser and at an angle with one another, and laser light oscillated out of the oscillation-stage laser is entered in the resonator from a side on which a distance between both mirrors is longer.

Preferably in this case, the resonator should be positioned such that laser light reflected at the rear side mirror or the output side mirror on which laser light oscillated out of the oscillation-stage laser is first incident is reflected toward a side on which the distance between both mirrors is shorter.

Preferably, the rear side mirror and the output side mirror should be mutually set in such a way as to make an angle of 0.01 mrad to 0.2 mrad inclusive.

In this case, too, a length about twice as long as the length of the resonator in the amplification-stage laser should be set longer than a time-based coherent length corresponding to the spectral line width of the oscillation-stage laser.

Throughout the above two-stage laser systems for aligners, the laser light oscillated out of the oscillation-stage laser could be introduced in the resonator from any side position of the resonator.

Throughout the above two-stage laser systems for aligners, each of the mirrors that form the resonator could be held by a mirror holder capable of moving each mirror in a substantially vertical direction to the optical axis direction of the resonator.

Throughout the above two-stage laser systems for aligners, the oscillation-stage laser could further comprise line narrowing means for line narrowing the oscillated laser light so as to be configured as a KrF excimer laser, an ArF excimer laser, and a molecule fluorine ($F_2$) laser.

Alternatively, the laser system could be configured as a molecule fluorine ($F_2$) laser system comprising wavelength select means for selecting one oscillation line from laser light oscillated in the oscillation-stage laser.

Still alternatively, the laser system could be configured as a molecule fluorine ($F_2$) laser system comprising wavelength select means for selecting one oscillation line from laser light produced on the output side of the amplification-stage laser.

In the two-stage laser system for aligners according to the invention, oscillation laser light having divergence is used as the oscillation-stage laser and the amplification-stage laser comprises a Fabry-Perot etalon resonator where the resonator is configured as a stable resonator or, alternatively, oscillation laser light having divergence is used as the oscillation-stage laser and the amplification-stage laser comprises a ring resonator comprising an input/output partial reflecting mirror and a plurality of total-reflection mirrors for reflecting laser light entered via the partial reflecting mirror back to the position of the partial reflecting mirror wherein the partial reflecting mirror and the plurality of total-reflection mirrors are each formed of a plane. Thus, the two-stage laser system for aligners according to the invention has the features of the MOPO mode that output fluctuations are insensitive to fluctuations of synchronous excitation timing between the chambers, high energy stability and high output efficiency are achievable, laser (seed) energy from the oscillation stage can be kept lower, the spectral line width is narrow because of the latter half of a laser pulse from the oscillation-stage laser makes a lot more roundtrips, and the line width is narrow because the tail of the latter half can be amplified, and has the features of the MOPA mode as well that the spatial coherence is low; that is, given the same share quantity (pinhole-to-pinhole space) in the beam transverse direction, the visibility of interference fringes and the spatial coherence are low.

If the optical axis of laser light oscillated out of the oscillation-stage laser and entered in the amplification-stage laser is set in such a way as to make an angle with respect to the optical axis of the resonator in the amplification-stage laser, then the spatial coherence is much more reduced.

If the length about twice as long as the length of the resonator in the amplification-stage laser is set longer than the time-based coherent length corresponding to the spectral line width of the oscillation-stage laser or the length of the optical path through the ring resonator is set longer than the time-based coherent length corresponding to the spectral line width of the oscillation-stage laser, it is then possible to prevent any interference fringe pattern from occurring on the beam profile of laser light produced out of the amplification-stage laser. It is thus possible to maintain the symmetry of the beam profile and hold back its fluctuations and, hence, provide uniform illumination of masks in an aligner. Thus, the invention provides a two-stage laser system well fit especially for semiconductor aligners.

The invention is in no sense limited to the use of the oscillation laser light having divergence as the oscillation-stage laser. For instance, if the optical axis of laser light oscillated out of the oscillation-stage laser and entered in the amplification-stage laser is set in such a way as to make an angle with respect to the optical axis of the resonator in the amplification-stage laser, it is then possible to obtain a two-stage laser system that does not only have the above features of the MOPO mode but also is reduced in terms of spatial coherence so that it lends itself well to semiconductor aligners.

Further, if the reflecting surfaces of the rear side mirror and the output side mirror are each formed of a plane, the normal lines to the rear side mirror and the output side mirror are set in such a way as to make an angle with respect to the optical axis of laser light oscillated out of the oscillation-stage laser and entered in the amplification-stage laser and with each other as well, and the laser light oscillated out of the oscillation-stage laser is entered in the resonator from the side on which the distance between both mirrors is longer, it is then possible to obtain a two-stage laser system that does not only have the above features obtained by setting the optical axis of laser light entered in the amplification-stage laser in such a way as to make an angle with respect to the optical axis of the resonator in the amplification-stage laser but also has an increased laser output and an extended pulse width and ensures the degree of flexibility in the injection of laser light entered in the amplification-stage laser with a decrease in the peak intensity of the oscillation-stage laser, and so is best suited for use with semiconductor aligners.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 12 is illustrative of the two-stage laser system for aligners according to the invention using another conversion optical system.

FIG. 14 is illustrative of part of one specific embodiment of the two-stage laser system for aligners of FIG. 13.

FIG. 16 is illustrative of the two-stage laser system for aligners, which comprises one modification to the input side mirror in the amplification-stage laser.

FIG. 17 is illustrative of another modification to the input side mirror in the resonator used in the amplification-stage laser.

FIG. 18 is illustrative of yet another modification to the input side mirror in the resonator used in the amplification-stage laser.

FIG. 19 is illustrative of the two-stage laser system for aligners, which comprises another modification to the input side mirror in the amplification-stage laser.

FIG. 23 is illustrative of a modification to the input side mirror usable in the embodiment of FIG. 20.

FIG. 27 is illustrative of one exemplary mirror holder.

FIG. 29 is illustrative of another embodiment of the amplification-stage laser in the two-stage laser system for aligners according to the invention.

FIG. 31 is illustrative of a two-stage laser system for aligners as in FIG. 16, wherein the input side mirror and the output side mirror in the resonator in the amplification-stage laser are arranged in nonparallel relations.

FIG. 39 is illustrative of why higher laser output and more extended pulse width are achievable in a nonparallel arrangement than in a parallel arrangement of the input side mirror and the output side mirror.

FIG. 44 is illustrative of the arrangement corresponding to FIG. 31 but with the use of the input side mirror of FIG. 43.

FIG. 47 is illustrative of another arrangement wherein seed light is entered as in FIG. 21 of the two-stage laser system for aligners according to the invention.

FIG. 48 is a top view illustrative of one embodiment wherein seed light is injected in the resonator in the amplification-stage laser from its side opposite to the laser exit side.

FIG. 52 is a top view illustrative of a further embodiment wherein seed light is injected in the resonator in the amplification-stage laser from its side opposite to the laser exit side, and shows the construction of the prism in that case.

FIG. 55 is a top view illustrative of an embodiment corresponding to FIG. 51 but with the injection of seed light from between the output side mirror and the chamber in the amplification-stage laser, and shows the construction of the window member in that case.

FIG. 81 is illustrative in further detail of how the seed light explained with reference to FIGS. 79 and 80 diverges in the amplification-stage laser using an unstable resonator.

BEST MODE FOR CARRYING OUT THE INVENTION

First of all, the principles of the two-stage laser system for aligners according to the invention are now explained.

Figure 73:
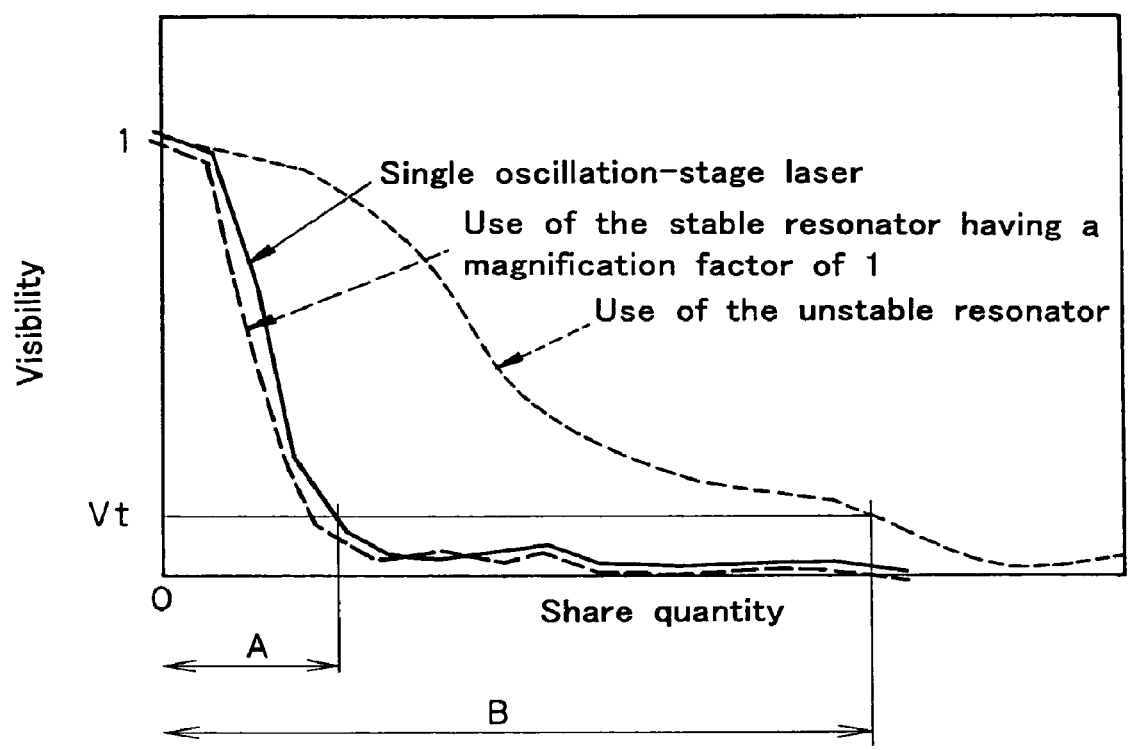
FIG. 73 is illustrative of the results of measurement of the visibility of a line narrowing laser, the results of measurement of visibility in the case where laser light is amplified in an unstable resonator amplification-stage laser, and the results of measurement of visibility in the case where laser light is amplified in a stable resonator amplification-stage laser.
Figure 74:
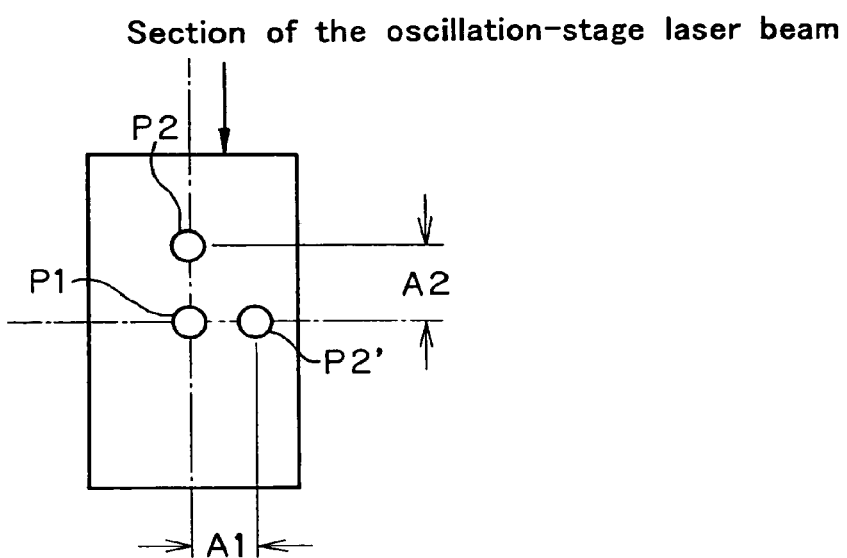
FIG. 74 is indicative of the section (beam profile) of laser light emitted out of the oscillation-stage laser.
Figure 75:
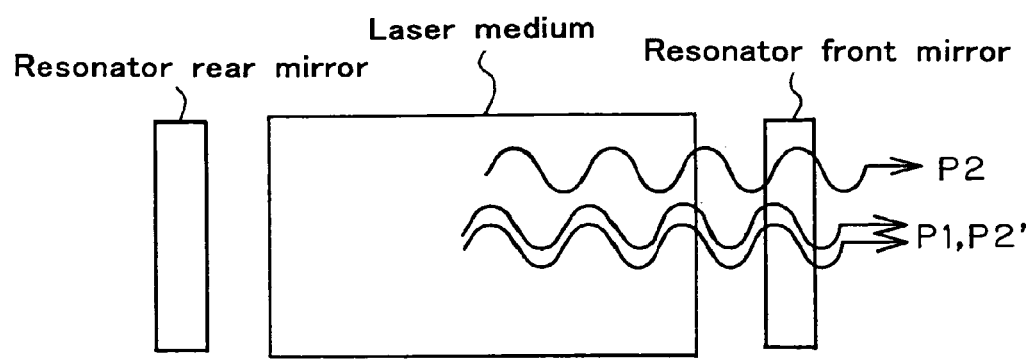
FIG. 75 is a view for studying coherence between laser light and laser light spaced away by a different distance in the beam profile.
Figure 76:
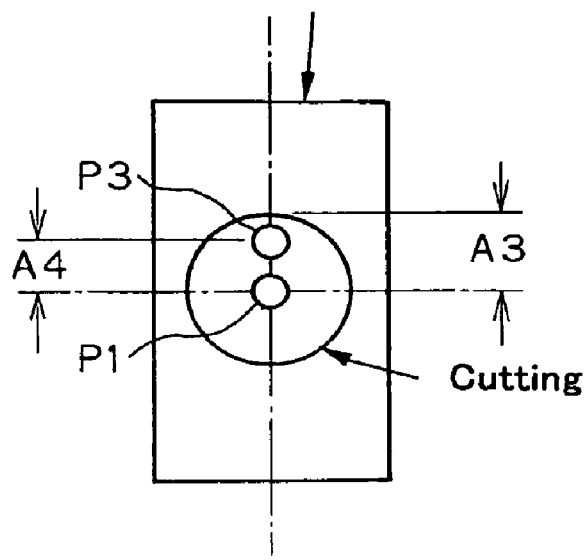
FIG. 76 is illustrative of how to cut a beam portion out of seed light from the oscillation-stage laser.
Figure 77:
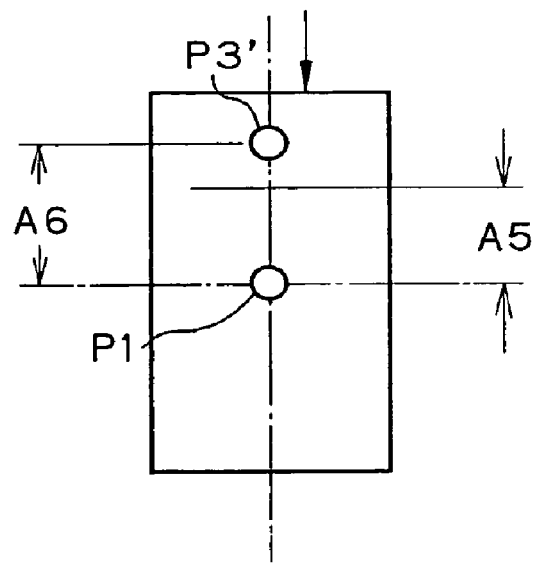
FIG. 77 is illustrative of how the post-amplification laser light diverges while high coherence is kept intact in the case where the laser is expanded in a prior art amplification-stage laser resonator.
Figure 78:
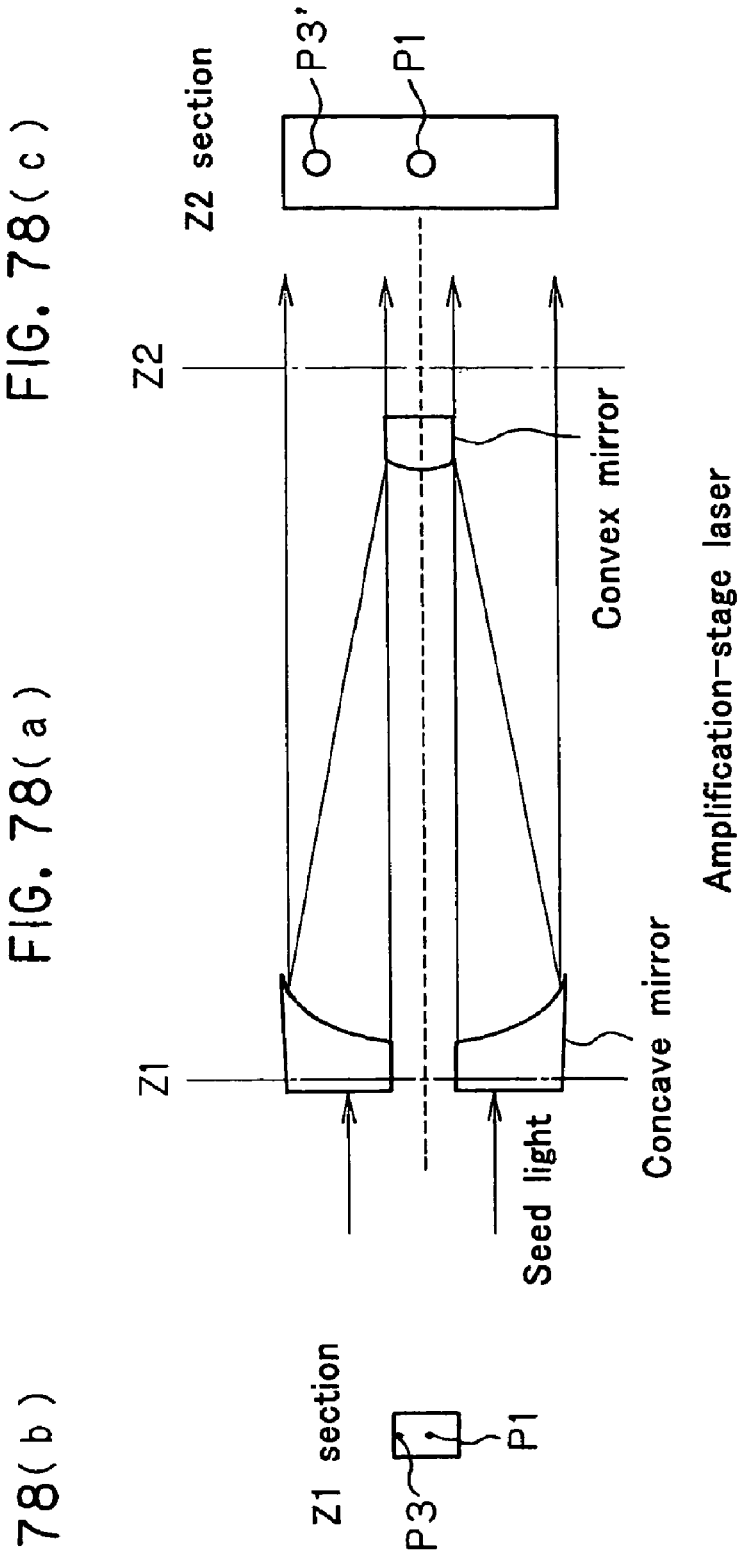
FIG. 78 is illustrative in further detail of how the seed light explained with reference to FIGS. 76 and 77 diverges in the amplification-stage laser using an unstable resonator.
Figure 79:
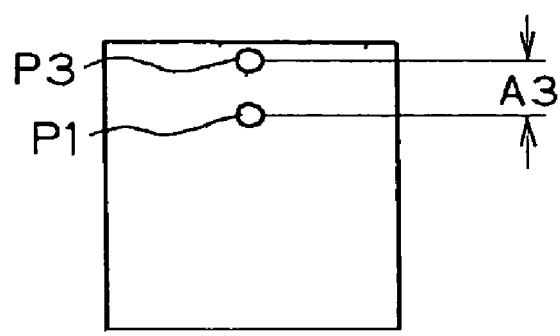
FIG. 79 is a view similar to FIG. 76.
Figure 80:
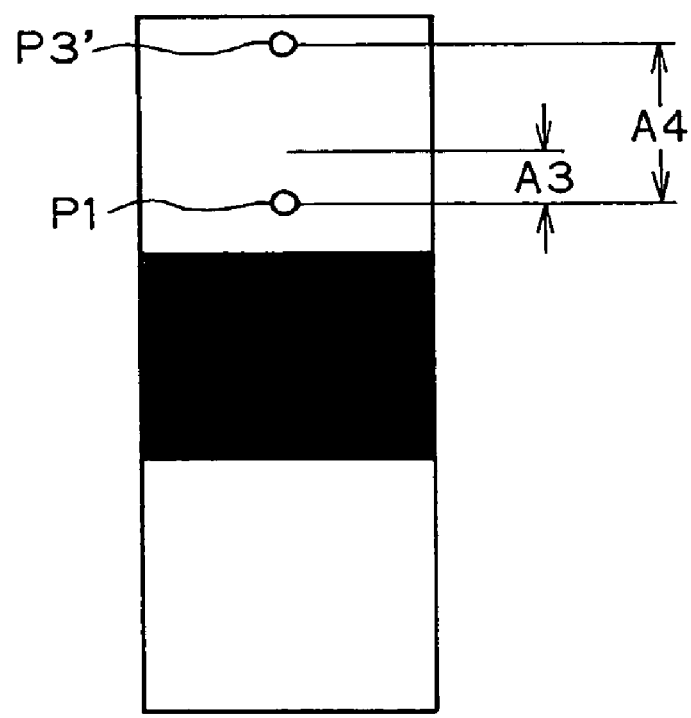
FIG. 80 is a view similar to FIG. 77.

As described with reference to FIG. 73, it has been found that in the MOPO system comprising an oscillation-stage laser and an amplification-stage laser in which laser light (seed light) oscillated out of the oscillation-stage laser is entered for amplification, and which comprises a resonator comprising an input side mirror and an output side mirror, if the resonator in the amplification-stage laser is configured as a stable resonator, it is then possible to achieve a low spatial coherence equivalent to that of the oscillation-stage laser.

Figure 1:
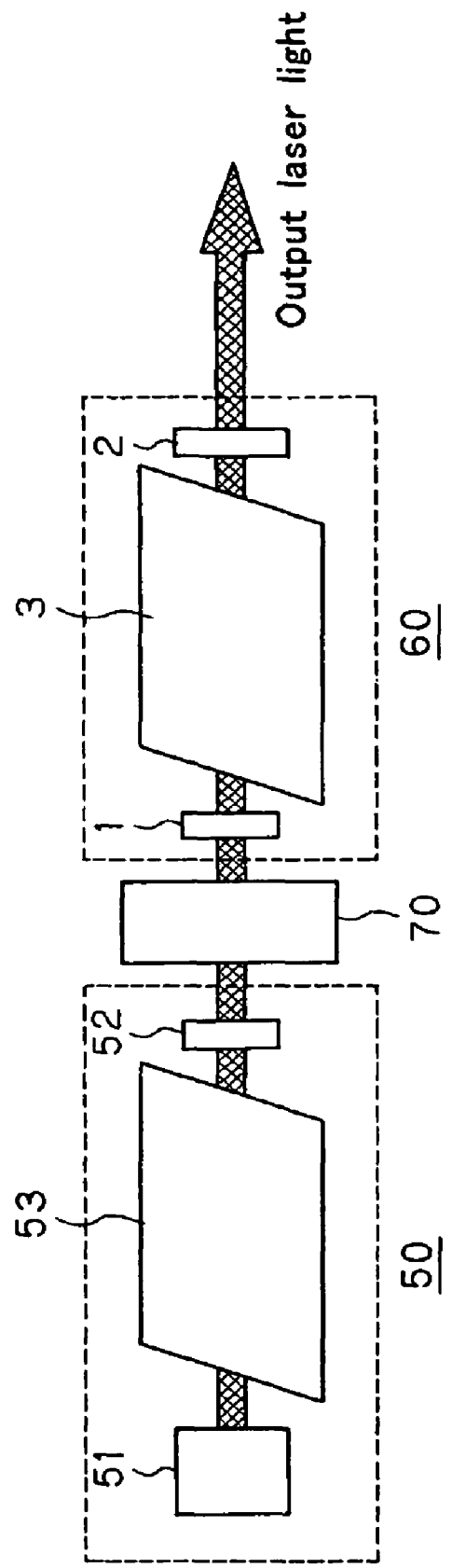
FIG. 1 is illustrative in schematic of the fundamental construction of the two-stage laser system for aligners according to the invention.

FIG. 1 is illustrative in schematic of the basic arrangement of the two-stage laser system for aligners according to the invention. The two-stage laser system for aligners according to the invention is a MOPO system as described above, which comprises an oscillation-stage laser (MO: Master Oscillator) 50, and an amplification-stage laser (PO: Power Oscillator) 60 in which seed light oscillated out of the oscillation-stage laser 50 is entered and amplified to produce laser light. The amplification-stage laser 60 is equipped with a Fabry-Perot etalon resonator comprising an input side mirror (rear side mirror) 1 and an output side mirror (front side mirror) 2, between which a chamber 3 filled with a laser gas is located. The amplification-stage laser 60 further comprises discharge electrodes, etc. for exciting the laser gas in the chamber 3 to form a gain area.

In the oscillation-stage laser 50, typically, a chamber 53 filled with a laser gas is provided in a laser resonator comprising a rear side mirror that also serves as an optical element in a line narrowing module 51 constructed from, for instance, an expanding prism and a grating (diffraction grating), and a front mirror 52. The oscillation-stage laser 50 further comprises discharge electrodes, etc. for exciting the laser gas in the chamber 53 to form a gain area.

Although not essential, between the oscillation-stage laser 50 and the amplification-stage laser 60, there is located a conversion optical system 70 for reducing the sectional area of a seed light beam entered from the oscillation-stage laser 50 in the amplification-stage laser 60 or converting the angle of divergence of seed light from the oscillation-stage laser 50.

In the laser system of the invention, if the resonator comprising the input side mirror 1 and the output side mirror 2 in the amplification-stage laser 60 is constructed of a stable resonator as described above, it is then possible to achieve a low spatial coherence equivalent to that of the oscillation-stage laser.

The stable resonator in the laser system must satisfy the following condition (a):

$$0 \leq (1-L/R1)(1-L/R2) \leq 1 \tag{a}$$

Here R1 is the radius of curvature of the input side mirror (rear side mirror) 1, R2 is the radius of curvature of the output side mirror 2, and L is a mirror-to-mirror spacing, provided that the radius of curvature of a concave mirror is defined as positive and the radius of curvature of a convex mirror as negative.

Such a stable resonator has a multimode as in the resonator used in the oscillation-stage laser 50, and by using such a stable resonator at the amplification-stage laser 60, it would be possible to achieve a low spatial coherence equivalent to that of the oscillation-stage laser 50.

However, only with the use of such a stable resonator at the amplification-stage laser 60, seed light is not geometrically magnified in the stable resonator, when the amplified laser light leaves the stable resonator, failing to bury the gain area of the laser gas in the amplification-stage laser 60 with seed light for efficient amplification.

Therefore, light having divergence is used as the seed light oscillated out of the oscillation-stage laser 50 in the invention, and using the divergence of that seed light, the gain area of the laser gas is buried with the seed light that diverges while a plurality of reflections occur in the stable resonator, so that high-efficient amplification can take place.

Gas lasers used as light sources in semiconductor aligners, for instance, fluorine molecule ($F_2$) laser, KrF excimer laser and ArF excimer laser make multimode oscillations. In general, the oscillated laser light diverges to some degrees, and the use of such a gas laser for the oscillation-stage laser 50 will allow the seed light entering the amplification-stage laser 60 to have divergence. It is noted, however, that the angle of divergence of that seed light could be controlled through an optical system as described later; the angle of divergence of the seed light entering the amplification-stage laser 60 could be controlled within the range as desired.

Therefore, the minimum divergence required for the seed light is defined depending on the pulse width in the amplification-stage laser 60, as follows.

Figure 2:
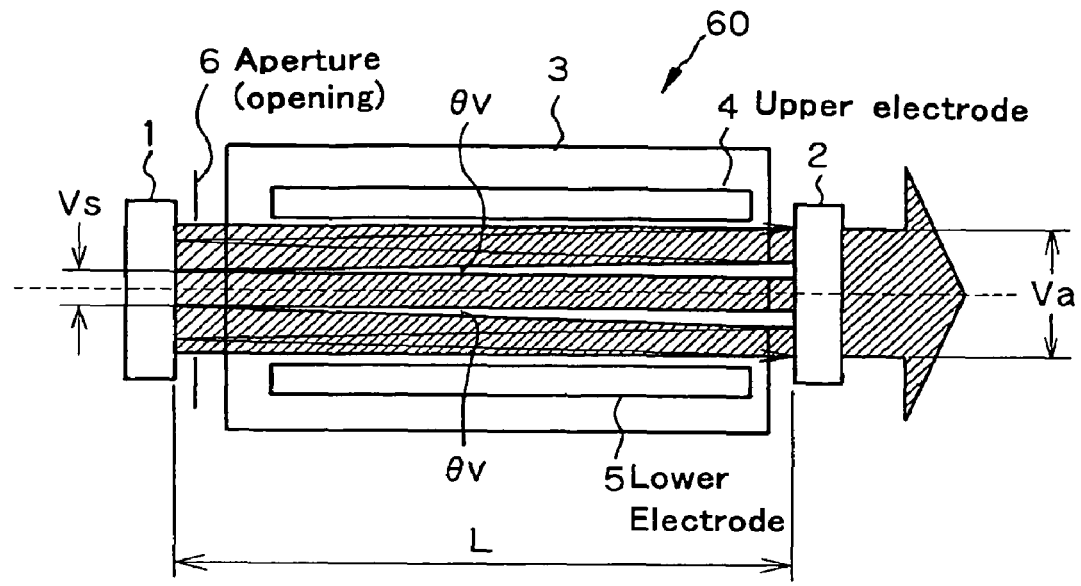
FIG. 2 is illustrative of how the divergence needed for seed light in the invention is defined.
Figure 2:
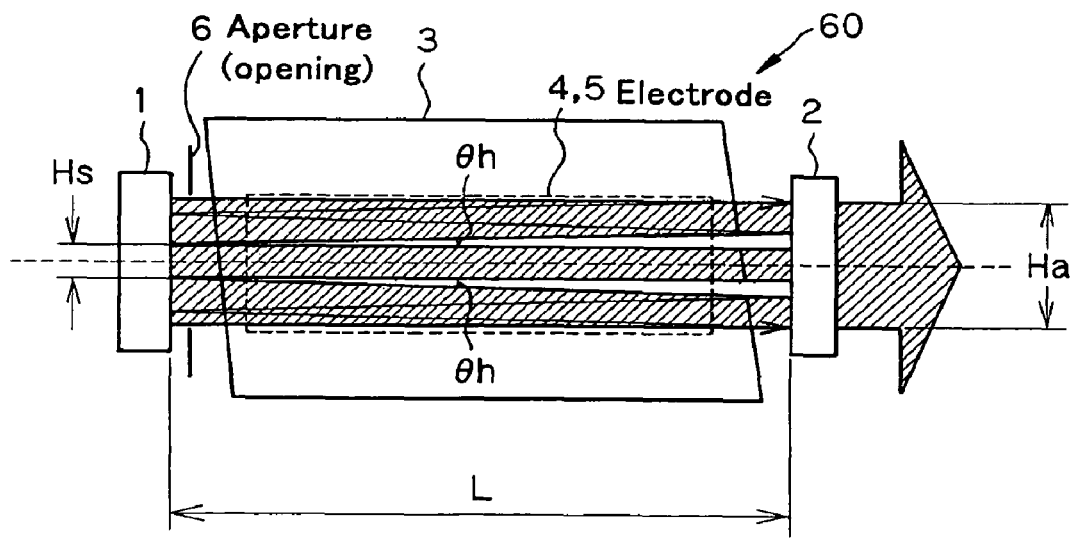

FIGS. 2(a) and 2(b) are illustrative in vertical and horizontal sections, respectively, of the definition of divergence required for the seed light. As shown, the resonator in an amplification-stage laser 60 comprises an input side mirror 1 and an output side mirror 2, between which there is positioned a chamber 3 filled with a laser gas. In this embodiment, the laser gas within the chamber 3 is excited by discharge between an upper electrode 4 and a lower electrode 5 to form a gain area. Further between the input side mirror 1 and the output side mirror 2, there is located an aperture (opening) 6 that will determine the beam size of output laser light.

Upon entrance from the input side mirror 1, seed light reflects plural times in the resonator in the amplification-stage laser 60 within the duration of pulse width, so that the gain area (discharge area) can be buried with the seed light having divergence. Therefore, the seed light of an effective pulse width P in the amplification-stage laser 60 must have the angles of divergence, θv and θh, in the vertical and horizontal directions, as defined below. Here, P is the effective pulse width, c is the velocity of light, L is a resonator length, Vs and Hs are beam diameters in the vertical and horizontal directions of the seed light, and Va and Ha are beam diameters in the vertical and horizontal direction of amplified light, provided that each beam diameter is measured at a position of a peak strength of $1/e^2$.

$$\theta h \geq \operatorname{Tan}^{-1}[\{(Ha - Hs)/2\} \cdot (1/L)/(P \cdot c/L)] \tag{2}$$
$$= \operatorname{Tan}^{-1}\{(Ha - Hs)/(2 \cdot P \cdot c)\}$$

$$\theta v \geq \operatorname{Tan}^{-1}[\{(Va - Vs)/2\} \cdot (1/L)/(P \cdot c/L)] \tag{3}$$
$$= \operatorname{Tan}^{-1}\{(Va - Vs)/(2 \cdot P \cdot c)\}$$

Here θv and θh are the angles of divergence of laser light entered in the amplification-stage laser in the vertical and horizontal directions, respectively, P is the effective pulse width, c is the velocity of light, L is the resonator length, Vs and Hs are the beam diameters of laser light entered in the amplification-stage laser in the vertical and horizontal directions, respectively, and Va and Ha are the beam light of output light in the vertical and horizontal directions, respectively.

For instance, when Vs=0 mm, Va=16 mm, L=1,000 mm and the effective pulse width (the width of laser pulses actually injected in the amplification-stage laser 60) P=10 ns, seed light having a divergence of 1 mrad≦θv will be needed, and when Hs=1 mm, Ha=3 mm, L=1,000 mm and the effective pulse width P=10 ns, seed light having a divergence of 0.3 mrad≦θh will be required.

While, in the above discussions, both the input and output side mirrors 1 and 2 of the resonator in the amplification-stage laser 60 are assumed to comprise plane mirrors, yet it is required that the output side mirror 2 that is the reflecting mirror for reflecting the seed light first be a plane mirror (R2=∞) to bury the gain area using the divergence of the seed light. On the contrary, the input side mirror 1 could be either a plane mirror or a concave mirror included in the range that satisfies the above formula (a), that is, the range capable of meeting L≦R1.

When the above formulae (2) and (3) are satisfied, narrow-banded laser light from the oscillation-stage laser 50 fills the gain area (discharge area) by the divergence effect in the amplification-stage laser 60, as shown in FIGS. 2(a) and 2(b). In the area filled with the laser light from the oscillation-stage laser 50, induction emission takes place while keeping the spectral characteristics of the oscillation-stage laser 50 intact, so that the amplification-stage laser 60 oscillates with narrow-band laser spectra having similar characteristics to those of the oscillation-stage laser 50.

Some embodiments of the construction of the resonator used with the amplification-stage laser 60 are now explained with reference to FIGS. 3-8, throughout which (a1) is a front view, (a2) is a longitudinal section, (a2') is a cross section and (a3) a rear view as viewed from the input side of the input side mirror 1, and (b1) is a front view and (b2) is a sectional view as viewed from the input side of the output side mirror 2. Notice here that an arrow added to (a2) is indicative of an input direction of seed light and an arrow added to (b2) is indicative of an output direction of output laser light.

Figure 3:
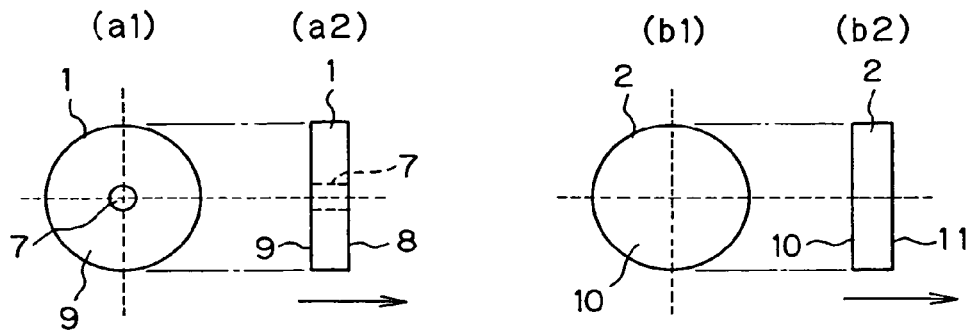
FIG. 3 is illustrative of the construction of one embodiment of the resonator mirrors used in the amplification-stage laser.

In the embodiment of FIG. 3, the input side mirror 1 is formed of a plane substrate having a seed light-introduction circular hole 7 in its center portion. The plane substrate is applied on its (output side) back surface with a high-reflectivity (total-reflection) mirror coating 8. The (input side) front surface of the plane substrate may or may not have an antireflection coating 9. The output side mirror 2 is formed of a plane substrate that is applied on its (input side) front surface with a partial reflecting mirror coating 10 and on its (output side) back surface with an antireflection coating 11.

Throughout the invention, it is noted that a wedge could be provided on the seed light input side surface of the input side mirror 1 substrate (to position a wedge surface obliquely, not vertically, with respect to incident light), so that the seed light is reflected at that surface in such a way as not to go back to the oscillation-stage mirror 50. Likewise throughout the invention, a wedge could be provided on the plane substrate of the output side mirror 2 to keep feeble back-surface reflection against going back into the resonator.

Figure 4:
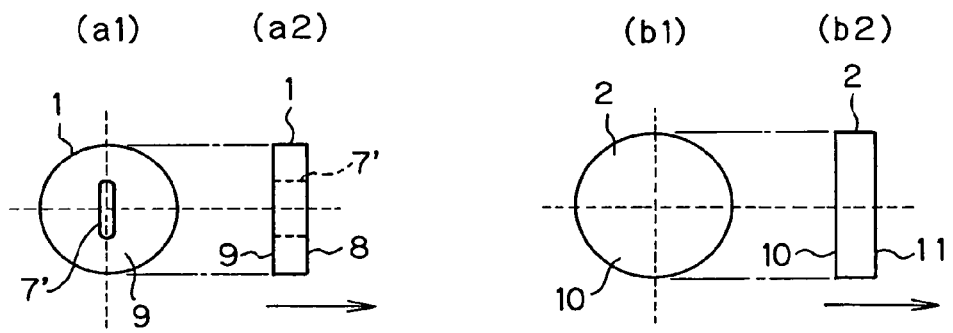
FIG. 4 is illustrative of the construction of another embodiment of the resonator mirrors used in the amplification-stage laser.

In the embodiment of FIG. 4, the input side mirror 1 is formed of a plane substrate that has a seed light-introduction longitudinal slit 7' in its center portion. The plane substrate is applied on its (output side) back surface with a high-reflectivity mirror coating 8. The (input side) front surface of the plane substrate may or may not have an antireflection coating 9. The output side mirror 2 is formed of a plane substrate that is applied on its (input side) front surface with a partial reflecting mirror coating 10 and on its (output side) back surface with an antireflection coating 9. In this embodiment, the longitudinal slit 7' is of shape and size substantially equal to the sectional shape of the input side mirror 1 for the seed light from the oscillation-stage laser 50 or seed light deformed by a conversion optical system 70 interposed between the oscillation-stage laser 50 and the amplification-stage laser 60.

Figure 5:
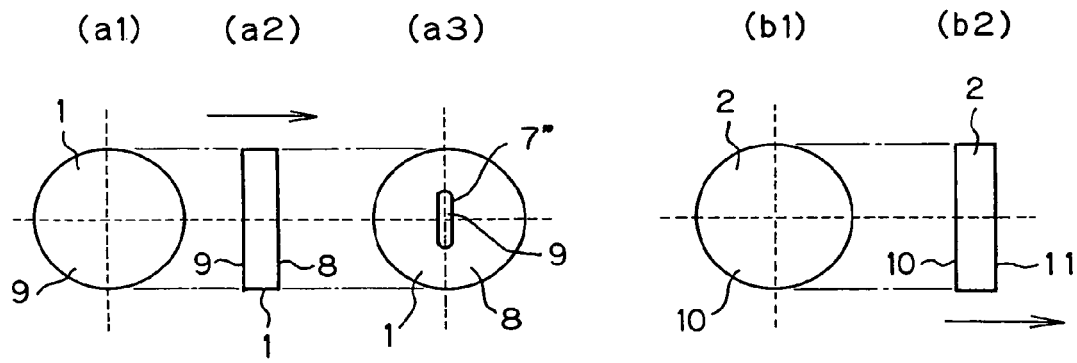
FIG. 5 is illustrative of the construction of yet another embodiment of the resonator mirrors used in the amplification-stage laser.

In the embodiment of FIG. 5, the input side mirror 1 is formed of a transparent plane substrate that is applied on its (output side) back surface with a high-reflectivity mirror coating 8 except a central, longitudinal area 7". The (input side) front surface of the plane substrate may or may not have an antireflection coating 9. The output side mirror 2 is formed of a plane substrate that is applied on its (input side) front surface with a partial reflecting mirror coating 10 and on its (output side) back surface with an antireflection coating 11. In this embodiment, a slit 7" is provided in the high-reflectivity mirror coating 8 instead of providing the seed light-introduction slit 7' in the substrate (FIG. 4).

Figure 6:
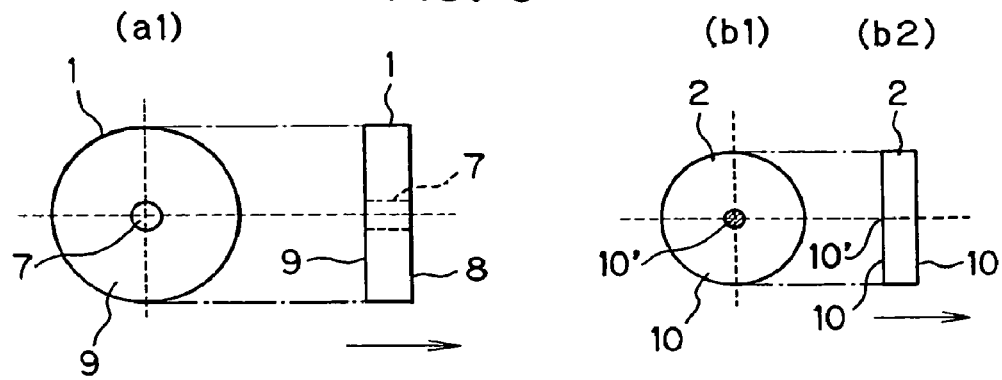
FIG. 6 is illustrative of the construction of a further embodiment of the resonator mirrors used in the amplification-stage laser.

In the embodiment of FIG. 6, the input side mirror 1 is constructed as in FIG. 3, and a modification is made to the partial reflecting mirror coating 10 of the output side mirror 2. The output side mirror 2 is formed of a plane substrate that has a mirror coating 10' of relatively low reflectivity at its (input side) center surface portion, with a mirror coating 10 of relatively high reflectivity applied around the coating 10'. On the portion having the mirror coating 10' of relatively low reflectivity in this embodiment, the seed light introduced from a circular hole 7 in the input side mirror 1 is directly incident without undergoing repeated reflections between the input side mirror 1 and the output side mirror 2; the reflectivity of that portion remains relatively low because the amplified laser light is weakened by a reduction in the length of the seed light passing through a gain area.

Generally, the partial reflecting mirror coating applied on the output side mirror 2 has the optimum reflectivity at which laser outputs reach a maximum. As the partial reflecting mirror coating 10 on the output side mirror 2 is allowed to have the optimum reflectivity, satisfactory laser output efficiency might be obtained. As discussed above, however, there is a decrease in energy at the center of output beam shape depending on the distance where the seed light obtains gains, which will otherwise cause the section of laser light (discharge direction) to have an uneven output profile.

In the coating on the output side mirror 2 according to this embodiment, the mirror coating 10' at the center of the output side mirror 2 and the mirror coating 10 applied around it are varied in reflectivity in such a way as to obtain as uniform an output profile as possible. This works somewhat against laser output efficiency, because both the coatings have often difficulty in having the optimum reflectivity at which laser outputs reach a maximum. However, the output profile across the section of an output laser beam becomes satisfactory.

In the above embodiment, by way of illustration but not by way of limitation, the reflectivity of the mirror coating 10' at the center of the output side mirror 2 is set lower than that of the mirror coating 10' around it.

As a matter of course, the reflectivity at which the above maximum laser output is not obtained is higher or lower than the above optimum reflectivity. In other words, the mirror coating has a plurality of reflectivities at which there are obtained given laser outputs lower than the above maximum laser outputs. In the above embodiment, therefore, even when the reflectivity of the mirror coating 10' at the center of the output side mirror 12 is set higher than that of the mirror coating 10 applied around it, effects equivalent to those of the above embodiments will often be obtained.

Figure 7:
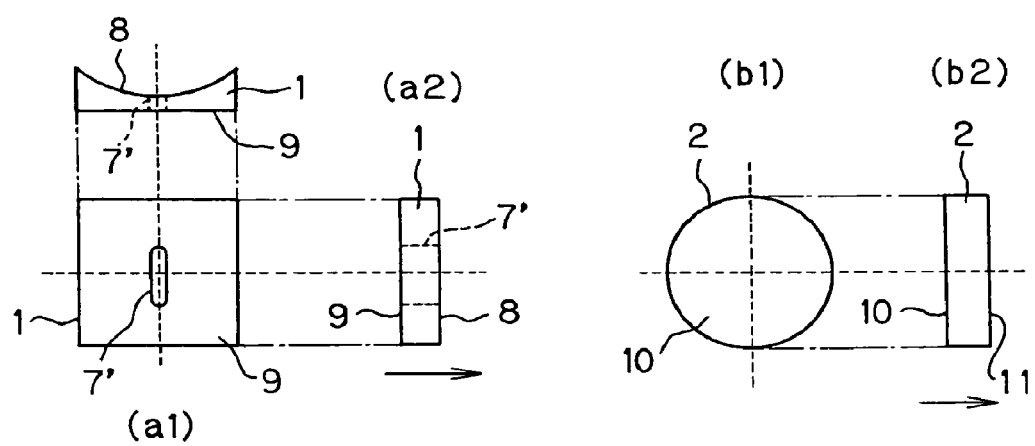
FIG. 7 is illustrative of the construction of a further embodiment of the resonator mirrors used in the amplification-stage laser.
Figure 8:
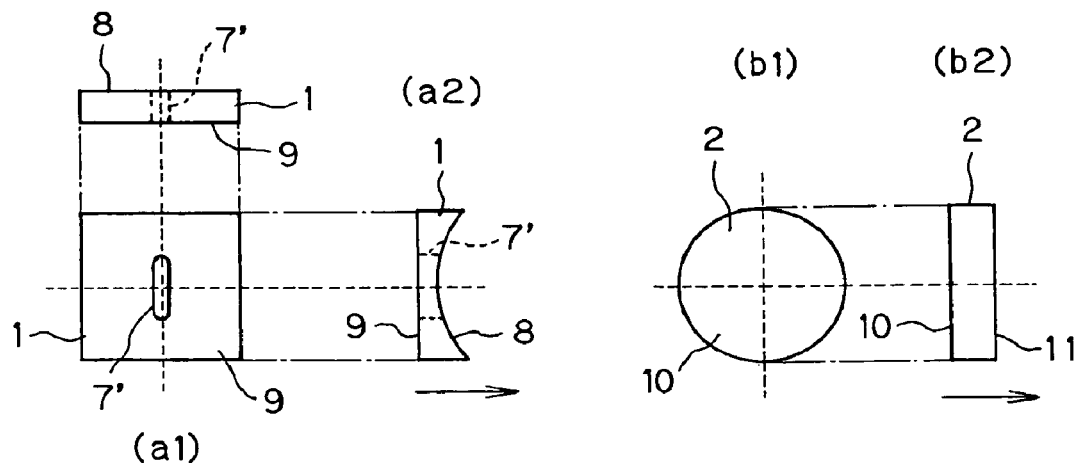
FIG. 8 is illustrative of the construction of a further embodiment of the resonator mirrors used in the amplification-stage laser.

In the embodiments of FIGS. 7 and 8, the input and output side mirrors 1 and 2 are constructed as in FIG. 4. However, the (output side) back surface of the substrate of the input side mirror 1 has a cylindrical concave shape rather than a planar shape. In FIG. 7, the generating line of that cylindrical concave surface directs vertically (in the longitudinal direction of the longitudinal slit 7'), and in FIG. 8, the generating line directs horizontally (in the direction vertical to the longitudinal direction of the longitudinal slit 7'). In either case, the radius of curvature of that cylindrical concave surface is set in such a way as to satisfy the above condition L≦R1.

Specifically but not exclusively, FIGS. 3-8 are illustrative of mirror arrangements for the resonator used with the amplification-stage laser 60. Combinations of them or modifications to them could be used. For instance, the surface of the input side mirror 1 to be provided with the high-reflectivity mirror coating 8 could be configured in a spherical concave form.

A partial reflecting mirror coating could be provided all over the output side surface of the input side mirror 1. In this case, fabrication could be facilitated because of no need of providing such a circular hole 7 as depicted in FIG. 3 or such a slit 7" provided with the antireflection coating 9 as depicted in FIG. 5. It is noted, however, that there is a lowering in the efficiency of utilization of the seed light, because a part of the seed light is reflected upon incidence and is not injected in the amplification-stage laser 60.

The conversion optical system 70 interposed between the oscillation-stage laser 50 and the amplification-stage laser 60 is now explained. As already described, this conversion optical system 70 is provided if required, and has primarily both or either one of two functions.

Figure 9:
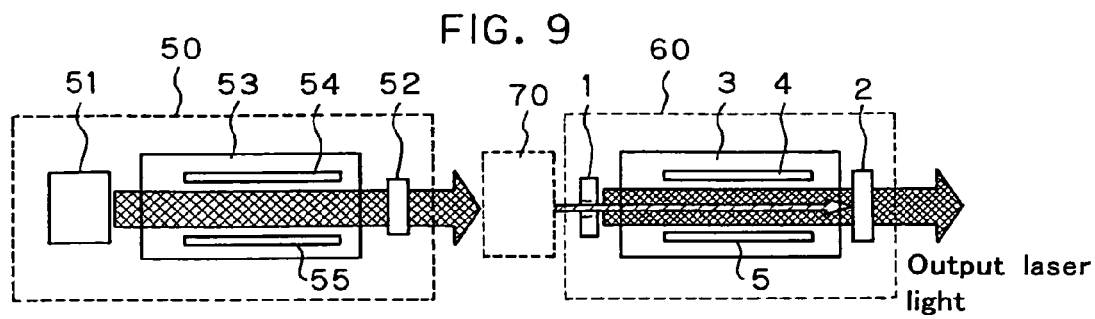
FIG. 9 is illustrative of the conversion optical system interposed between the oscillation-stage laser and the amplification-stage laser.

Generally, as the energy density of the seed light entering the amplification-stage laser 60 becomes too low, it is difficult to obtain any sufficient amplification factor at the amplification-stage laser 60. In that case, it is desired that the conversion optical system 70 be provided such that the beam diameter of the seed light is reduced to increase the energy density before the seed light enters the amplification-stage laser 60, as depicted in FIG. 9.

Figure 10:
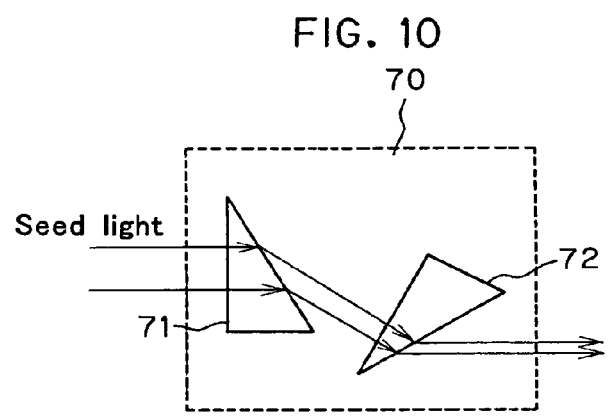
FIG. 10 is illustrative of one exemplary conversion optical system.

Such a seed light beam reduction optical system uses such beam diameter reduction prisms 71 and 72 as depicted in FIG. 10. In this case, each prism 71, 72 comprises a rectangular refracting prism wherein as input light enters vertically an entrance side plane, it passes almost vertically through the entrance side plane and is refracted at an exit side oblique surface, so that the section of the beam in the paper is reduced. With a plurality of, preferably, an even number of, such prisms 71 and 72, therefore, the beam diameter of the seed light in a one-dimensional direction (longitudinally or transversely) or a two-dimensional direction (longitudinally or transversely) can be reduced to increase the energy density.

Figure 11:
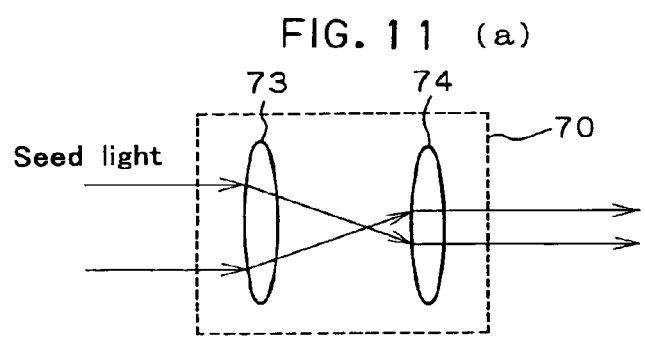
FIG. 11 is illustrative of another exemplary conversion optical system.
Figure 11:
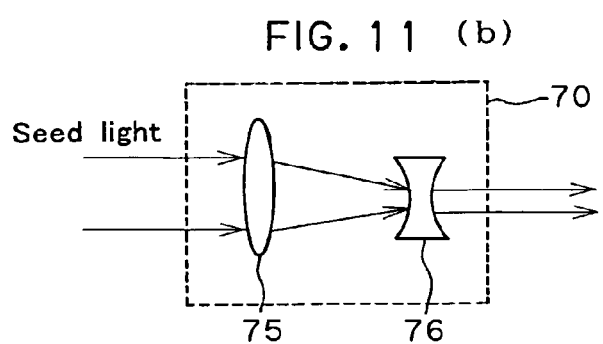

Alternatively, the seed light beam reduction optical system could use such a telephoto optical system as depicted in FIGS. 11(a) and 11(b). In the optical system of FIG. 11(a), a positive lens 73 having a longer focal length and a positive lens 74 having a shorter focal length are located at a co-focal point, enabling the beam diameter to be reduced by the focal length ratio. In the optical system of FIG. 11(b), a positive lens 75 having a longer focal length and a negative lens 76 having a shorter focal length are again located at a co-focal point. In this case, too, the beam diameter is reduced by the focal length ratio (absolute value).

One function of the conversion optical system 70 is to reduce the beam diameter of such seed light as mentioned above, thereby increasing the energy density, and another function is to enlarge the angles of divergence, $\theta v$ and $\theta h$, of the seed light entering the amplification-stage laser 60 in such a way as to satisfy formulae (2) and (3) in the case where the divergence of the seed light oscillated out of the oscillation-stage laser 50 does not satisfy formulae (2) and (3). To perform the second function, i.e., to tweak the angles of divergence, $\theta v$ and $\theta h$, of the seed light, such a telephoto optical system as depicted in FIGS. 11(a) and 11(b) is used to adjust the distance between the positive lenses 73 and 74, and the distance between the positive lens 75 and the negative lens 76.

By the way, gas lasers used as light sources for semiconductor aligners, for instance, fluorine molecule ($F_2$) laser, KrF excimer laser and ArF excimer laser, are excited by discharge between discharge electrodes 54 and 55 to form a gain area; the section of the seed light from the oscillation-stage laser 50 has a longitudinally slender shape (because the discharge electrodes 54 and 55 are provided to sandwich it from above and below). When the seed light has a longitudinally slender shape in section, its horizontal direction divergence is likely to satisfy the relation of formula (2); however, its vertical direction divergence becomes small, often failing to satisfy the relation of formula (3). In that case, a negative cylindrical lens 77 having a cylindrical concave surface 78 with the generating line in the horizontal direction, negative refracting power in the vertical direction alone, divergence in the vertical direction and no refracting power in the horizontal direction, as shown in the three-view drawing of FIG. 12(b), is provided as the conversion optical system 70 to be interposed between the oscillation-stage laser 50 and the amplification-stage laser 60, as depicted in FIG. 12(a), thereby enabling both the angles of divergence, $\theta v$ and $\theta h$, of the seed light entering the amplification-stage laser 60 in the vertical and horizontal directions to satisfy the relations of the above formulae (2) and (3).

Figure 13:
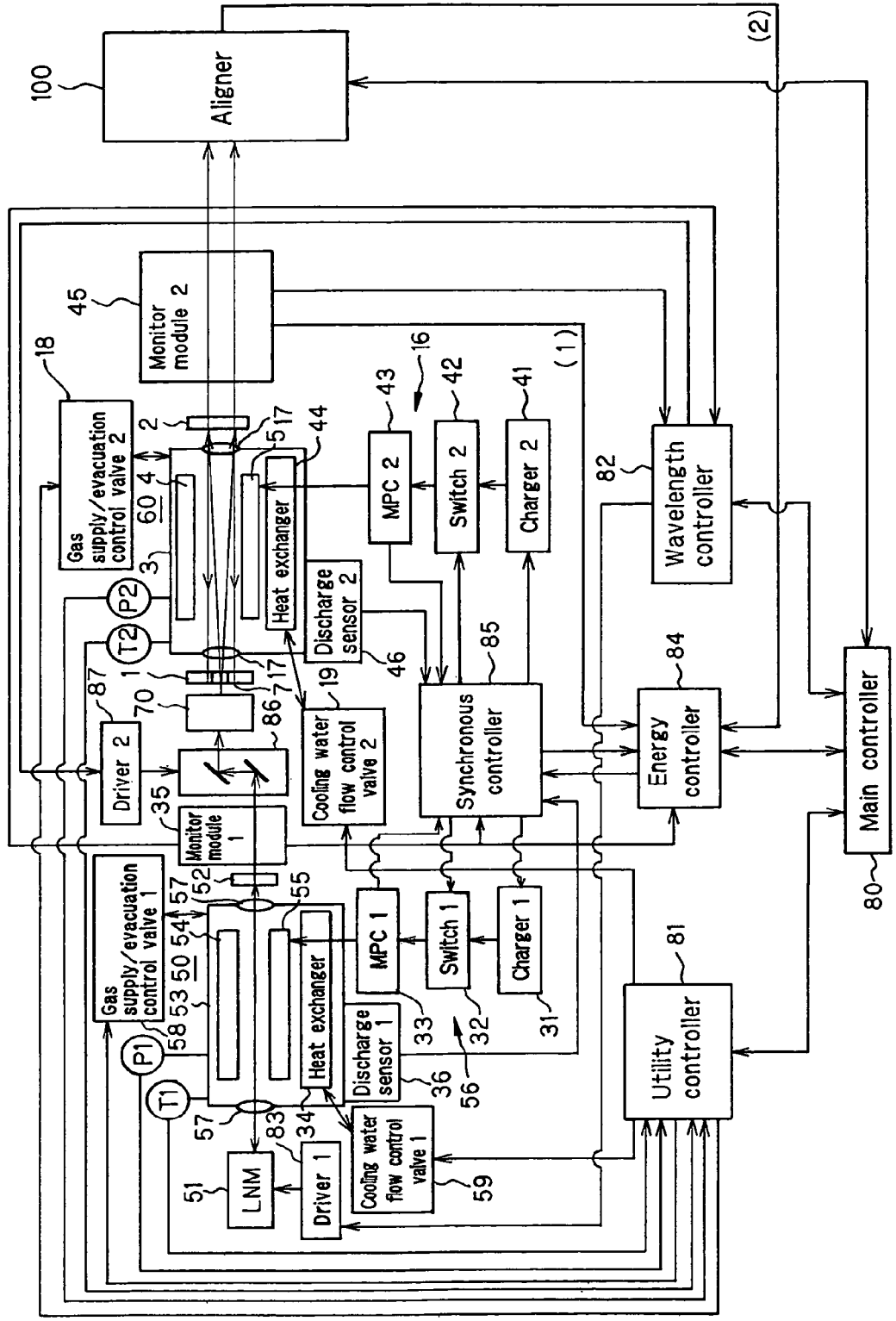
FIG. 13 is a general representation of one embodiment of the two-stage laser system for aligners comprising the basic features of the invention.

One exemplary construction of the two-stage laser system for aligners comprising the essential features of the invention is now explained with reference to FIG. 13 showing the generation construction thereof.

When the MOPO system according to the invention is a fluorine molecule ($F_2$) laser system, a chamber 53 in the oscillation-stage laser 50 and a chamber 3 in the amplification-stage laser 60 are each filled with a laser gas comprising fluorine ($F_2$) gas and buffer gas comprising helium (He), neon (Ne) or the like. When the MOPO system is a KrF excimer laser system, the chamber 53 in the oscillation-stage laser 50 and the chamber 3 in the amplification-stage laser 60 are each filled with a laser gas comprising krypton (Kr) and fluorine ($F_2$) gases and buffer gas comprising helium (He), neon (Ne) or the like. When the MOPO system is an ArF excimer laser system, the chamber 53 in the oscillation-stage laser 50 and the chamber 3 in the amplification-stage laser 60 are each filled with a laser gas comprising argon (Ar) and fluorine ($F_2$) gases and buffer gas comprising helium (He), neon (Ne) or the like. The laser chamber 53 in the oscillation-stage laser 50 has a discharge portion comprising a pair of discharge electrodes 54 and 55, and the laser chamber 3 in the amplification-stage laser 60 has a discharge portion comprising a pair of discharge electrodes 4 and 5. These discharge portions have a pair of cathodes 55, 5 and a pair of anodes 54, 4 located vertically in a parallel direction to the paper. High voltage pulses are applied to these pairs of electrodes 54 and 55, and 4 and 5 from the associated power sources 56 and 16, thereby producing discharges between these electrodes.

At both ends of axial extension from the pairs of electrodes 54 and 55, and 4 and 5 in the chambers 53 and 3 in the oscillation-stage laser 50 and amplification-stage laser 60, there are located window members 57 and 17, each formed of a material transparent to laser oscillated light such as $CaF_2$. Exposed surfaces of the window members 57 and 17 opposite to the interiors of the chambers 53 and 3 are located parallel with each other and at such a Brewster angle with respect to laser light as to reduce reflection losses. The window members 57 and 17 are also positioned in such a way as to place the P-polarized component of laser light in the horizontal direction.

A cross-flow fan, not shown in FIG. 13, is housed in each chamber 53, 3 to circulate the laser gas therein and send the laser gas into the discharge portion. Each of the oscillation-stage laser 50 and the amplification-stage laser 60 comprises a $F_2$ gas supply system and a buffer gas supply system for supplying $F_2$ gas and buffer gas to the chamber 53, 3, and a gas evacuation system for evacuating the laser gas in the chamber 53, 3. In FIG. 13, these are collectively designated as a gas supply/evacuation control valve 58 and a gas supply/evacuation control valve 18. Notice that the KrF laser system and the ArF laser system comprise a Kr gas supply system and an Ar gas supply system, respectively. The gas pressures in the chambers 53 and 3 are monitored by pressure sensors P1 and P2, respectively, and gas pressure information is sent to a utility controller 81 that controls the gas supply/evacuation valves 58 and 18, thereby controlling the gas composition and pressure in the oscillation-stage chamber 53 and the amplification-stage chamber 3, respectively.

Laser outputs change with gas temperatures. To this end, gas temperature control is carried out. The gas temperature is monitored by temperature sensors T1 and T2 added to the respective chambers 53 and 3, and temperature signals are sent to the utility controller 81 that controls the flow of coolant water by coolant water flow control valves 59 and 19, respectively. As a result, the amounts of exhaust heat in the respective heat exchangers 34 and 44 in the chambers 53 and 3 are controlled for temperature control.

The oscillation-stage laser 50 comprises a line narrowing module (LNM) 51 constructed from an expanding prism and a grating (diffraction grating), and a laser resonator is constructed of an optical element in the line narrowing module 51 and a front mirror 52. Although not shown, a line narrowing module using etalon and a total-reflection mirror instead of the expanding prism and grating could be used.

A part of laser light emitted out of the oscillation-stage laser 50 and the amplification-stage laser 60 is split by means of a laser splitter not shown and guided to monitor modules 34 and 45, respectively, which monitor the laser light characteristics of the oscillation-stage laser 50 and the amplification-stage laser 60, respectively, such as outputs, line widths and center wavelengths. In FIG. 13, the monitor modules 35 and 45 are installed in both the oscillation-stage laser 50 and the amplification-stage laser 60, although it is acceptable to use either one of them.

Center wavelength signals from the monitor modules 35 and 45 are sent to a wavelength controller 82 that drives the optical element in the line narrowing module 51 through a driver 83 to make a selection from wavelengths and performs wavelength control in such a way that the center wavelength of the oscillation-stage laser 50 becomes the desired wavelength. Notice that the above wavelength control could be carried out by issuing commands from the wavelength controller 82 to the driver 83 on the basis of wavelength information from the monitor module 45 to which a part of laser light emitted out of the amplification-stage laser 60 is guided in such a way that the wavelength of laser light emitted out of the oscillation-stage laser 50 becomes the given wavelength.

Laser output signals from the monitor modules 35 and 45 are sent to an energy controller 84. Then, applied voltage is controlled by way of a synchronous controller 85, and control is done in such a way that the energy of the oscillation-stage laser 50 and the amplification-stage laser 60 has the desired value. The output signals of the monitor module 45 could be sent to the energy controller 84 as shown at (1) in FIG. 13, or alternatively outputs at an output monitor provided on the side of a semiconductor aligner 100, although not shown, could be supplied to the energy controller 84 as shown at (2).

After passing through the monitor module 35, the laser light (seed laser light) from the oscillation-stage laser 50 passes through a beam steering unit 86 comprising a reflecting mirror, etc. and then through the conversion optical system 70. Then, the laser light is guided to the amplification-stage laser 60 for injection. The conversion optical system 70 comprises a mechanism wherein, as previously described, the angle of divergence of the laser light from the oscillation-stage laser 50 is controlled to such a value as to allow the oscillation-stage laser light to be injected in the amplification-stage laser 60 at a given angle of divergence. With the MOPO system of the invention, the stable resonator made up of an input side mirror (rear side mirror) 1 and an output side mirror (front side mirror) 2 is used on the amplification-stage laser 60 in such a way that amplification could take place even with a limited input. The input side mirror 1 is holed at 7 (FIG. 3). Passing through the hole 7, the laser is reflected as shown by an arrow in FIG. 13, and the injected seed laser light is expanded by the hole, passing effectively through the discharge portion to increase the power of the laser light. Finally, the laser leaves the output side mirror 2.

Instead of providing a spatial opening for the hole 7 in the input side mirror 1, it is acceptable to use a mirror substrate with only a hole portion applied with an antireflection coating (see FIG. 5).

By way of a power source 56 built up of a charger 31/switch 32/MPC (magnetic pulse compression circuit) 33 and a power source 16 built up of a charger 41/switch 42/MPC (magnetic pulse compression circuit) 43, high voltage pulses are applied to a pair of discharge electrodes 54 and 55 in the oscillation-stage laser 50 and a pair of discharge electrodes 4 and 5 in the amplification-stage laser 60, respectively, to give rise to discharge between the electrodes 54 and 55 and between the electrodes 4 and 5. This discharge in turn causes excitation of the laser gases filled in the laser chambers 53 and 3, respectively.

At the respective power sources 56 and 16, capacitors are charged by the chargers 31 and 41. As the switches 32 and 42 are held on, energy charged in the capacitors is transferred as voltage pulses to the magnetic pulse compression circuits 33 and 43 where they are compressed for application to the pair of electrodes 54 and 55 and the pair of electrodes 4 and 5. Although not shown, the power sources 56 and 16 are each provided with a step-up transformer that could be used to boost up voltage pulses.

The switches 32 and 42 are put on or off in response to operating commands (trigger signals) from the synchronous controller 85.

The synchronous controller 85 sends trigger signals to the power source 56 built up of a charger 31/switch 32/MPC (magnetic pulse compression circuit) 33 and the power source 16 built up of a charger 41/switch 42/MPC (magnetic pulse compression circuit) 43 such that discharge is generated at the amplification-stage laser 60 at a timing of injecting the laser emitted out of the oscillation-stage laser 50 in the amplification-stage laser 60. As there is a discharge timing lag between the oscillation-stage laser 50 and the amplification-stage laser 60, the laser light emitted out of the oscillation-stage laser 50 will be not efficiently amplified. The synchronous controller 85 gleans information about when discharge starts to occur at the oscillation-stage laser 50 and the amplification-stage laser 60 from discharge sensors 36 and 46, respectively, and laser output information from the energy controller 85 to set a delay time between the trigger signals sent to the power source 56 for the oscillation-stage laser 50 and the trigger signals sent to the power source 16 for the amplification-stage laser 60.

The utility controller 81, energy controller 84 and wavelength controller 82 are connected to the main controller 80. The main controller 80 is connected to the aligner 100. In response to commands from the aligner 100, the main controller 80 is operable to allocate the respective controls to the respective controllers 81, 84 and 82, allowing the respective controllers 81, 84 and 82 to execute the respective controls.

The laser light emitted out of the oscillation-stage laser 50 is aligned by the beam steering unit 86 made up of two mirrors such that it passes through a discharge area in the amplification-stage laser 60. The two mirrors that form the beam steering unit 86 are driven by a driver 87 for angle control, so that the direction of travel of the laser light issuing from the oscillation-stage laser 50 is controlled.

How to control the beam steering unit 86 is now specifically explained. For instance, suppose here that the direction of travel of laser light given out of the oscillation-stage laser 50 was not aligned such that it passed through the discharge area in the amplification-stage laser 60. A part or the whole of the laser light emitted out of the oscillation-stage laser 50 will then be cut off or reflected in an undesired direction, for instance, by the discharge electrodes 4 and 5 in the amplification-stage laser 60, failing to leave the amplification-stage laser 60 or causing laser power to become smaller than the desired value. To avert this, the beam steering unit 86 is controlled in such a way as to have a maximum laser light output while that output is monitored on the monitor module 45. This is explained with reference to FIG. 13. The results of monitoring by the monitor module 45 are sent to the wavelength controller 82 that, on the basis of output results received from the monitor module 45, gives a command to the driver 87 to drive and control the beam steering unit 86 such that the output reaches a maximum, thereby controlling the direction of travel of the laser light issuing from the oscillation-stage laser 50.

Part of one specific embodiment of the two-stage laser system for aligners of such construction is shown in FIG. 14. FIGS. 14(*a*) and 14(*b*) are an top view and a side view of that part. An ArF excimer laser of 193 nm wavelength is used for each of the oscillation- and amplification-stage lasers 50 and 60, and a resonator built up of a planar input side mirror 1 and a planar output side mirror 2 as shown in FIG. 3 is used in the amplification-stage laser 60. By way of the beam steering unit 86 made up of two mirrors, the seed light from the oscillation-stage laser 50 is injected in the input side mirror 1 with a hole 7 in the resonator in the amplification-stage laser 60. The input side mirror 1 is applied on its reflecting surface or its chamber 3 side surface with a total-reflection coating, and the output side mirror 2 is a partial reflecting mirror. The hole 7 has a diameter of about 2 mm (=Vs=Hs), the amplification-stage laser 60 has a discharge size of Ha=16 mm and Va=3 mm, and the resonator length L is about 1 m. The effective injection pulse width of the oscillation-stage laser 50 is P=20 ns.

Figure 15:
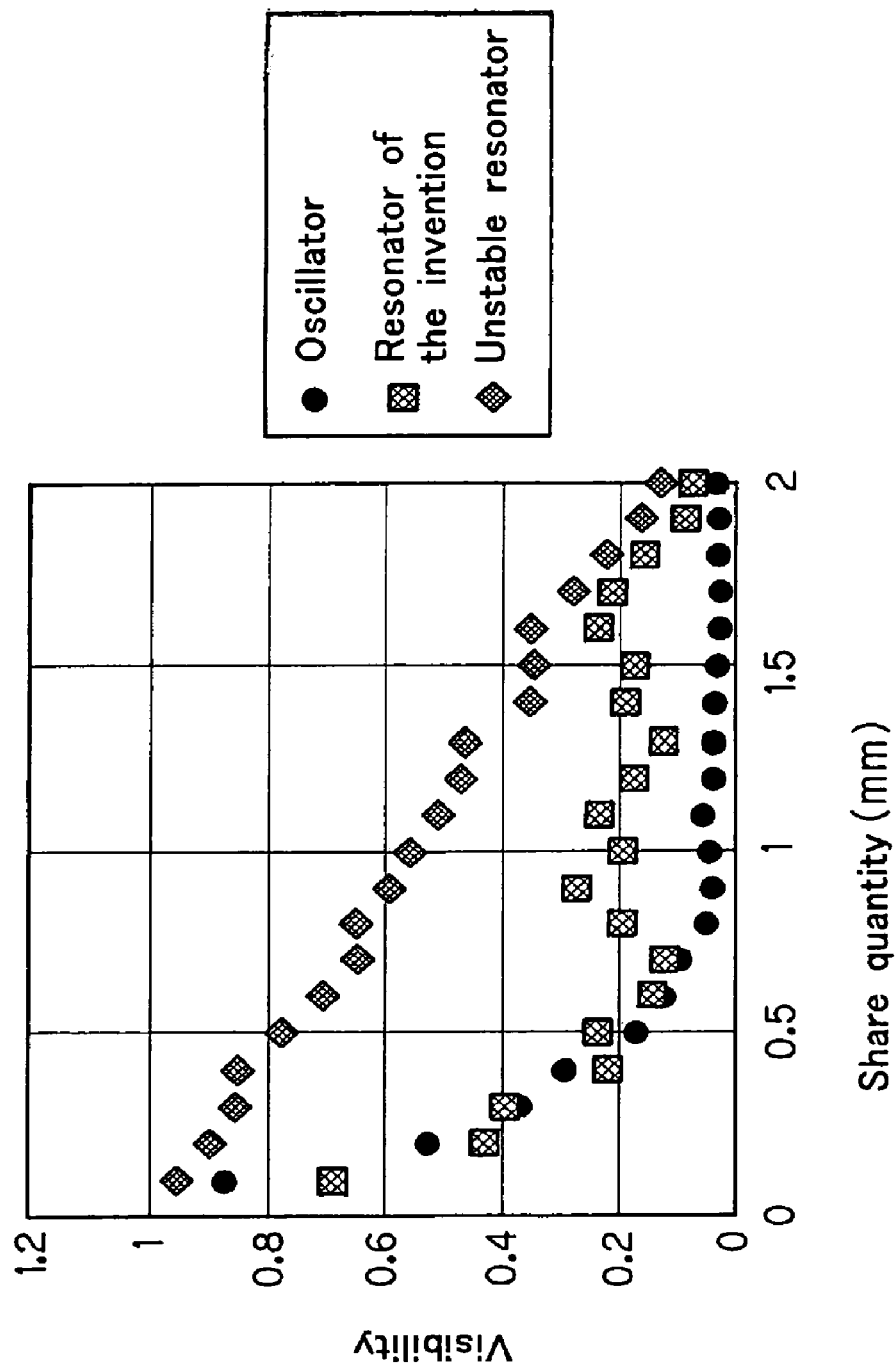
FIG. 15 is illustrative of share quantity of low coherence versus visibility relations in the arrangement of FIG. 14.

With such an arrangement, there were obtained data of such low coherence (share quantity versus visibility relations) as shown in FIG. 15. FIG. 15 shows not only the share quantity versus visibility relations obtained from the oscillation-stage laser 50 (oscillator) in this embodiment (using the resonator of the invention; similar to FIG. 73) but also the share quantity versus visibility relations in the case of using a prior art unstable resonator.

Under the above conditions, the angle of divergence in the horizontal direction, θh, must satisfy the requirement of 0.05 mrad<θh, and the angle of divergence in the vertical direction, θv, must satisfy the requirement of 1.2 mrad<θv. In the oscillation-stage laser 50 according to the above embodiment, the angle of divergence in the horizontal direction, θh, is 1 mrad and the angle of divergence in the vertical direction, θv, is 3 mrad; they satisfy the above conditions (2) and (3). For this reason, any conversion optical system 70 is not used in this embodiment.

From these results, it has been found that low coherence equivalent to that in a prior art MOPA laser system is achievable while maintaining line widths and energy stability comparable to those in the prior art MOPA laser system using an unstable resonator.

By the way, the introduction of the seed light from the oscillation-stage laser 50 in the resonator in the amplification-stage laser 60 are achievable by the hole 7, 7' provided in the center portion of the input side mirror 1, the slit 7" formed in the center portion of the high-reflectivity mirror coating 8 applied on the input side mirror 1, and a partial reflecting mirror coating applied all over the input side surface of the input side mirror 1, as described with reference to FIGS. 3-8. However, there are available some other modifications, as described below.

FIG. 16 is illustrative of part of one exemplary modification. FIG. 16(*a*) is a top view, FIG. 16(*b*) is a side view, and FIG. 16(*c*) is a view of the input side mirror 1 in the amplification-stage laser 60, as viewed from its chamber 3 side. In the input side mirror 1 in the amplification-stage laser 60 according to this modification, two high-reflectivity, rectangular plane mirrors 1₁ and 1₂ are arranged side by side on the same plane with a gap 21 between their edges. The two plane mirrors 1₁ and 1₂ are located such that the gap 21 is narrower than a discharge area 22 formed by discharge electrodes 4 and 5 in the amplification-stage laser 60. In other words, the seed light 23 is introduced through the slit 21 formed between the two plane mirrors 1₁ and 1₂. The high-reflectivity mirror planes of the two plane mirrors 1₁ and 1₂ lie within the same plane, and so the two plane mirrors 1₁ and 1₂ have the same function as one mirror having a slit. In this embodiment, the same function that the input side mirror 1 of FIG. 4 has is achieved by use of two high-reflectivity mirrors 1₁ and 1₂. Even with such an arrangement, it is possible to obtain line widths and energy stability equivalent to those of a prior art MOPO system using an unstable resonator and low coherence comparable to that in a prior art MOPA laser system.

In the input side mirror 1 of FIG. 16, the two high-reflectivity (total-reflection), rectangular plane mirrors 1₁ and 1₂ are arranged side by side on the same plane with the gap 21 formed between their edges. However, the longitudinal slit 7' formed in the center portion of the input side mirror 1, as shown in FIG. 5, could be configured as the same slit that forms the gap 21 in the embodiment of FIG. 17, as shown in FIGS. 17 and 18.

In FIGS. 17 and 18, (*a*) is a front view of the input side mirror 1 as viewed from its output side (the chamber 3 side), (*b*) is a longitudinal section, and (*c*) and (*d*) are illustrative of in what position relation the input side mirror 1 is located with respect to a discharge area 22, as viewed from the output side of the input side mirror 1.

In the embodiment of FIGS. 17 and 18, the input side mirror 1 is formed of a CaF₂ or other plane substrate transparent to ultraviolet light. The output side surface (FIG. 17(*a*)) of the plane substrate is applied with a high-reflectivity (total-reflection) mirror coating 8 except a central slit-form area and a peripheral edge, and an antireflection coating 9 is applied on a slit-form area 21 at the center portions of the input and output side surfaces and on the peripheral edges thereof. FIG. 17 shows an example of the plane substrate having a rectangular shape, and FIG. 18 shows an example of the plane substrate having a circular shape.

With the input side mirror 1 of FIG. 16 (FIG. 16(*c*)), there is difficulty in the application of coating as far as the mirror end faces (peripheral portions) for the purpose of holding the mirror during vapor deposition. In addition, it is not easy to process the ends of a CaF₂ or other substrate into right-angle faces with high precision; usually, there is a chip off the ends during fabrication. Without chip-free application of a high-reflectivity (total-reflection) coating 8 as far as the ends, the substrate ends having a decreased reflectivity will cause losses leading to an oscillation efficiency drop.

If such an input side mirror 1 as shown in FIGS. 17 and 18 is used with the laser system shown in FIGS. 16(*a*) and 16(*b*), on the other hand, it will be easy to process the ends of the high-reflectivity (total-reflection) coating 8; it will be possible to apply the high-reflectivity coating 8 as far as the boundary between the seed light 23 and the amplified laser light in the amplification-stage laser 60.

The size of the input side mirror 1 shown in FIGS. 17 and 18 should desirously be such that, as shown in FIGS. 17(*c*) and 17(*d*) and FIGS. 18(*c*) and 18(*d*), the longitudinal length of the center slit-form area 21 applied with the antireflection coating 9 is longer than the discharge area 22 defined by the discharge electrodes 4 and 5 in the amplification-stage laser 60.

As shown, the input side mirror 1 is located externally of the laser chamber 3. Thus, even when the distance between the discharge electrodes 4 and 5 is designed to become longer, the laser light from the laser chamber 3 is unlikely to lie off the input side mirror 1 as long as that distance is within the range of the longitudinal size of the center slit-form area 21 applied with the antireflection coating 9.

FIGS. 17(c) and 18(c) show that the longitudinal direction of the center slit-form area 21 applied with the antireflection coating 9 substantially matches that of the discharge area 22 defined by the discharge electrodes 4 and 5 in the amplification-stage laser 60, and FIGS. 17(d) and 18(d) illustrate that the longitudinal direction of the center slit-form area 21 applied with the anti-reflection coating 9 is substantially orthogonal to that of the discharge area 22 defined by the discharge electrodes 4 and 5 in the amplification-stage laser 60.

In the input side mirror 1 shown in FIGS. 17 and 18, it is noted that the slit-form area 21 at the end faces of the input- and output-side surfaces as well as the peripheral portion of the plane substrate may not have the antireflection coating 9. With such an arrangement wherein only two sites are provided with the high-reflectivity (total-reflection) coating 8 and there is no antireflection coating 9, the robustness of the input side mirror 1 to laser light can be improved due to no possibility of any coating deterioration.

In the exemplary laser system of FIG. 16, the total-reflection mirror 1 (FIG. 16(c), FIG. 17 and FIG. 18) and the partial reflecting mirror 2 are each formed of a plane mirror; however, the invention is not always limited to them as long as the stable resonator is set up by both mirrors 1 and 2.

FIG. 19 is illustrative of part of another embodiment as in FIG. 16. In this embodiment, the input side mirror 1 in the amplification-stage laser 60 is built up of one high-reflectivity (total-reflection), hole-free plane mirror. One such input side mirror 1 is decentered in the horizontal direction with respect to the seed light from the oscillation-stage laser 50, and located such that its edge is positioned within or near the discharge area 22 defined by the discharge electrodes 4 and 5 in the amplification-stage laser 60. The seed light 23 is introduced in the amplification-stage laser 60 from outside along that edge. With this arrangement, it is possible to prevent pits from occurring in the profile of laser light produced out of the amplification-stage laser 60 (there are spots of weak intensity in a center beam portion). Notice that the optical axis of the seed light 23 could be slightly inclined with respect to the optical axis of the input- and output-side mirrors 1 and 2 in such a way as to fill the discharge area with the seed light.

As a result of experimentation, the inventors have now found that if seed light is injected in the amplification-stage laser 60 in such a way as to fill the discharge area therewith while the optical axis C of the seed light 23 is slightly inclined with respect to the optical axis D of the input- and output-side mirrors 1 and 2, it is then possible to obtain much lower coherence so that the efficiency of amplification and oscillation at the amplification-stage laser 60 can be much more enhanced.

Figure 20A:
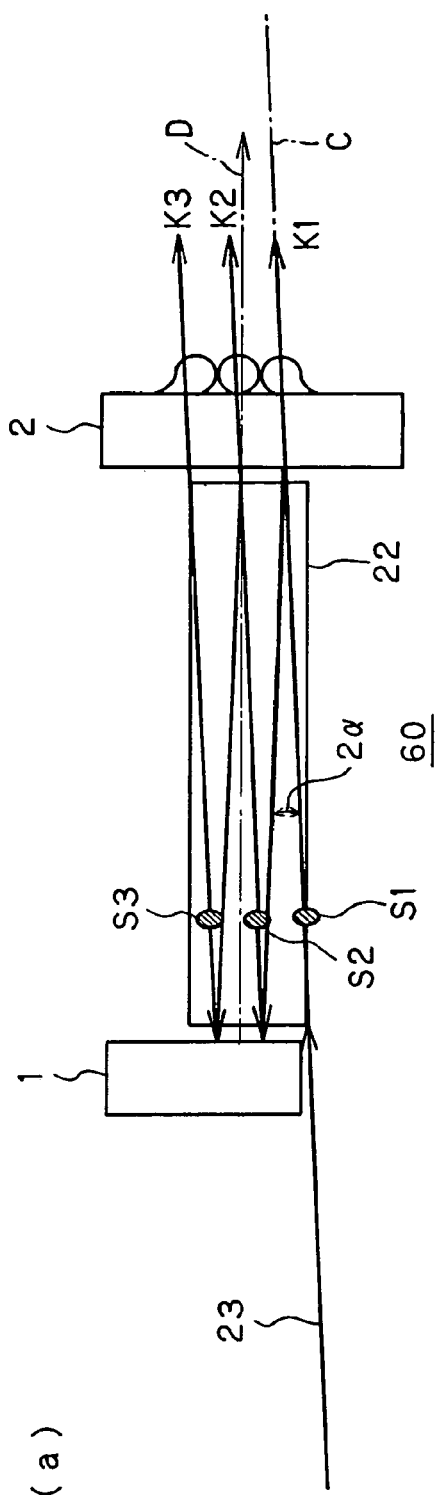
FIG. 20 is illustrative of the principles of operation when the optical axis of the resonator in the amplification-stage laser and the optical axis of seed light make an angle.
Figure 20B:
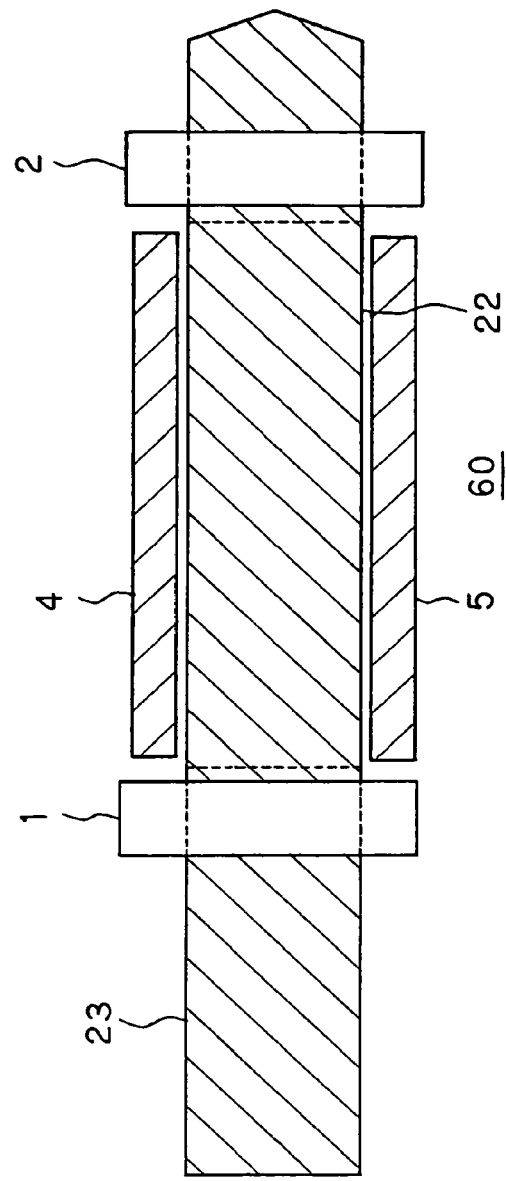

A possible reason for this is now explained with reference to FIG. 20. FIG. 20 is indicative of the principles of how the amplification-stage laser 60 operates upon entrance of the seed light 23 from the end of the discharge area 22 while the optical axis C of the seed light 23 is slightly inclined with respect to the optical axis D of the input- and output-side mirrors 1 and 2. FIGS. 20(a) and 20(b) are a top view and a side view of the resonator in the amplification-stage laser 60, respectively.

As shown in the top view of FIG. 20(a), the narrow-banded seed light 23 leaving the oscillation-stage laser 50 (see FIG. 19) passes through the end of the input side mirror (total-reflection mirror) 1, and is injected in the amplification-stage laser 60 from the side of the discharge area 22. This seed light 23 enters the discharge area 22 while its optical axis C is at a slight angle α (of e.g., about 0.5 mrad) with respect to the optical axis of the resonator in the amplification-stage laser 60, and is amplified through the discharge area 22, entering the output side mirror (partial reflecting mirror) 2. A part of laser light amplified upon entrance in the output side mirror 2 is produced as laser light K1 after passing through the output side mirror 2. Another part of laser light amplified upon entrance in the output side mirror 2 is reflected by the output side mirror 2.

This reflected light again passes through the discharge area 22 for amplification, and then goes back to the discharge area for amplification after entering the input side mirror 1 and reflection thereat. The amplified laser light enters the output side mirror 2, and a part of it is produced as laser light K2 after passing through it while another is reflected back to the discharge area. After such resonation is repeated, laser light K3 is produced as the output of the amplification-stage laser 60. Here the angle of incidence of the seed light 23 on the output side mirror 2 and the angles of incidence and reflection of the amplified light on and at the input- and output-side mirrors 1 and 2 are indicated by α with respect to the optical axis D of the resonator in the amplification-stage laser 60. In this connection, FIG. 20(a) is also illustrative in schematic of the intensity distributions of output laser light K1, K2 and K3.

In this way, the seed light 23 is subjected to multiple reflections between the output side mirror (partial reflecting mirror) 2 and the input side mirror (total-reflection mirror) 1 in a zigzag fashion, as shown in the top view of FIG. 20(a). This state will give birth to effects equivalent to the case where a plurality of point light sources (S1, S2 and S3) are provided to the output side mirror 2. Spatial coherence becomes low with increasing light source size. Consequently, with the optical axis C of the seed light 23 at a slight angle with respect to the optical axis D of the input- and output-side mirrors 1 and 2, the amplification and oscillation of laser light having low spatial coherence could be possible in the amplification-stage laser 60.

With the resonator in the amplification-stage laser 60 shown in FIG. 20, there are mutual misalignments in the exit positions of output laser light K1, K2 and K3 (in the embodiment of FIG. 20, such misalignments occur at a given spacing of, e.g., about 1 mm, in the horizontal direction), and so the profile (energy distribution) of the laser light leaving the output side mirror 2 comes close to a top hat form (a rectangular wave-form distribution), allowing the energy density within a laser light plane to become lower than that of a Gaussian beam. As a result, it is possible to reduce damages to the optical elements in the amplification-stage laser 60 (such as window member 17, input side mirror 1 and output side mirror 2) as well as to optical elements for shaping the laser beam leaving the amplification-stage laser 60 (such as a total-reflection mirror, a beam expander or the like located in a beam delivery unit for connecting together the two-stage laser system for aligners and an aligner).

Throughout the invention, the angle of inclination, α (in rad), of the optical axis D of the resonator in the amplification laser 60 with respect to the optical axis C of the seed light 23 should desirously satisfy the relation of the following condition:

$$0.0005 \leq 2\alpha L \leq 0.0015 \qquad (4)$$

Here L is the length of the resonator in the amplification-stage laser 60.

Although described in detail later, it is preferable that the optical path difference due to the resonator in the amplification-stage laser 60 (an optical path difference between laser light K1 and K2 or between K2 and K3) is set longer than the time-based coherent length corresponding to the spectral line width of the narrow-banded seed light 23 produced out of the oscillation-stage laser 50, because laser light K1, K3 and K3 do not interfere one another with the result that there are no interference fringes on the beam profile of the laser light produced out of the amplification-stage laser 60. This in turn leads to not only improvements in the symmetry of the beam profile of the output laser beam but also reductions in its fluctuations. Thus, it is possible to provide uniform illumination to masks in the aligner and the subjects to be exposed to light (e.g. wafers).

Further, if the seed light 23 is injected in the discharge area 22 while its optical axis C is slightly inclined with respect to the optical axis D of the resonator in the amplification-stage laser 60 as described above, then the discharge area 22 in the amplification-stage laser 60 can then be filled in it with the seed light 23 or its amplified light even at a small angle of divergence of the seed light 23. This in turn allows for the oscillation of the amplification-stage laser 60 by amplified resonation.

In this embodiment, the input- and output-side mirrors 1 and 2 are each formed of a plane mirror; however, the invention is not necessarily limited to them as long as the stable resonator is made up of both mirrors. For instance, if the input side mirror 1 or the output side mirror 2 is formed of a cylindrical concave mirror, further reductions of spatial coherence are then possible. That is, as the cylindrical concave mirror is located such that the generating line direction substantially matches the center axis of the discharge direction, it gives rise to a lot more resonance modes, resulting in further reductions of spatial coherence in the vertical direction to the discharge direction.

Figures 21A, 21B, 21C:
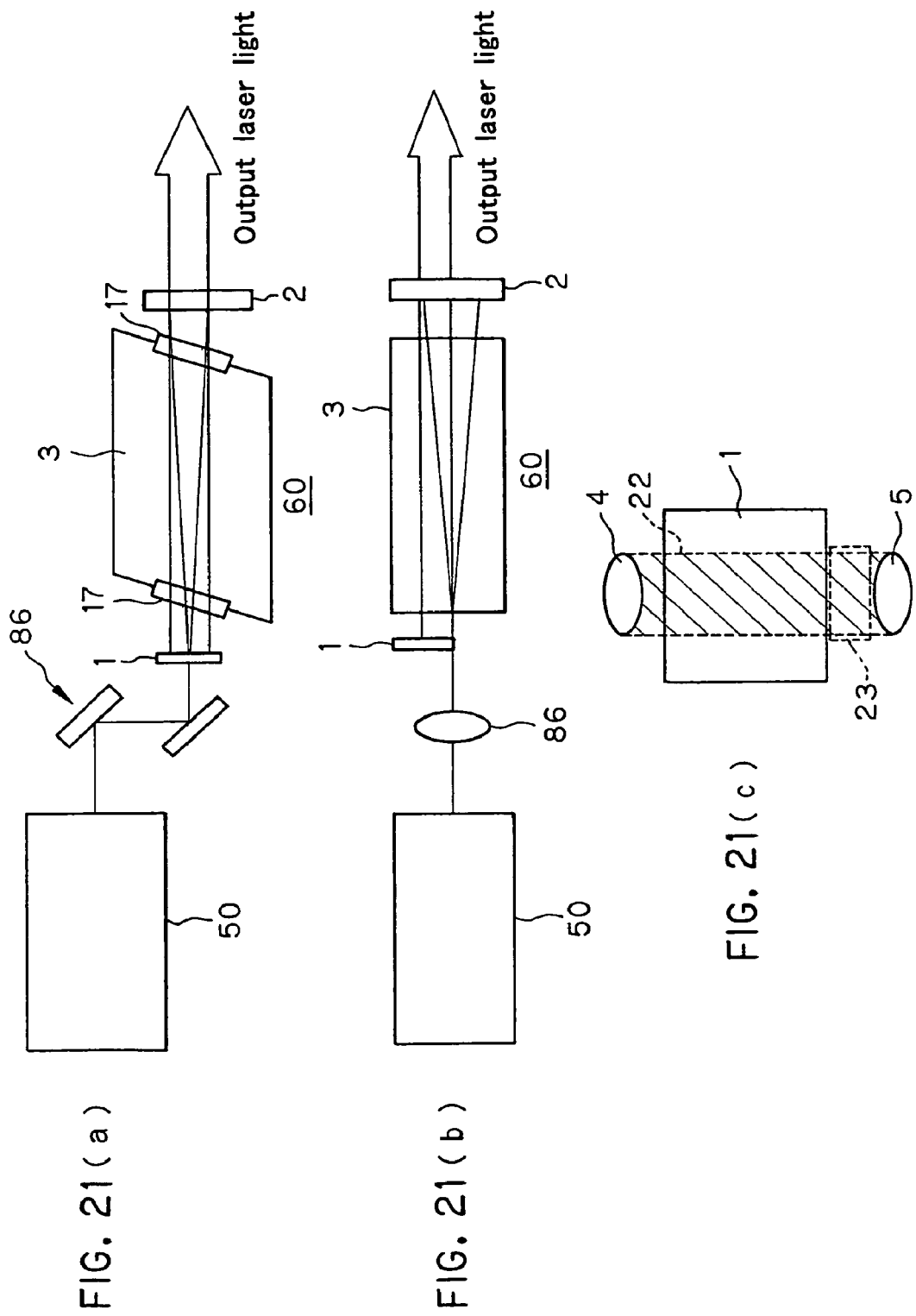
FIG. 21 is illustrative of the two-stage laser system for aligners, which comprises yet another modification to the input side mirror in the amplification-stage laser.

FIG. 21 is illustrative of part of yet another embodiment, as in FIG. 16. In this embodiment, the input side mirror 1 in the amplification-stage laser 60 is made up of one high-reflectivity (total-reflection), hole-free plane mirror. One such input side mirror 1 is decentered in the vertical direction to the seed light from the oscillation-stage laser 50 or upward in FIG. 21. The seed light 23 is then introduced in the discharge area from outside along an edge of the decentered input side mirror 1 that lies on the opposite side with respect to the direction of decentration. With this arrangement, it is possible to prevent pits from occurring on the profile of laser light produced out of the amplification-stage laser 60 (there are spots of weak intensity in a center beam portion). It is acceptable to fill the discharge area with the seed light 23 while the optical axis of the seed light 23 is slightly inclined with respect to the optical axis of the input- and output-side mirrors 1 and 2. As previously stated, this arrangement allows for a lot lower coherence, so that the amplification and oscillation of the amplification-stage laser 60 can occur with efficiency.

Figures 22A, 22B:
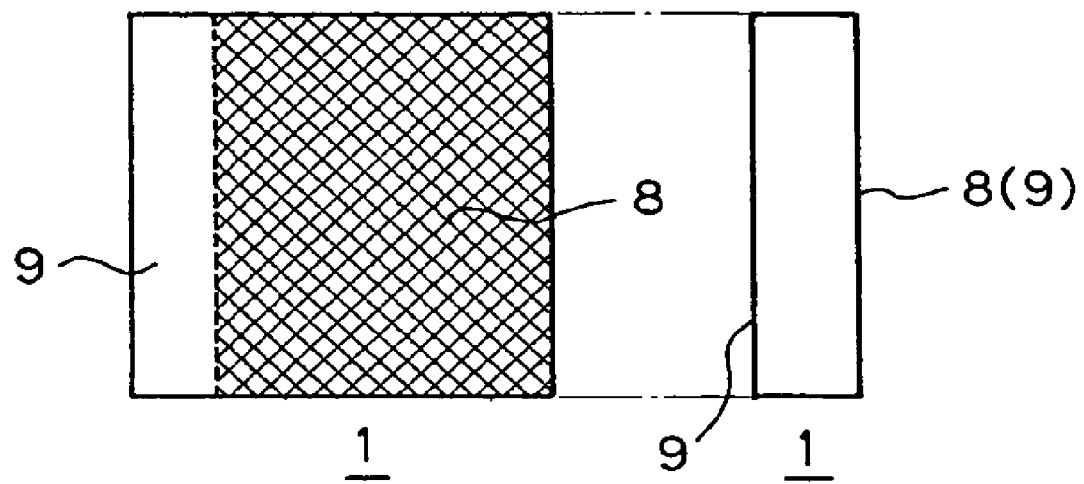
FIG. 22 is illustrative of a modification to the input side mirror usable in the embodiment of FIG. 19.
Figures 24A, 24B:
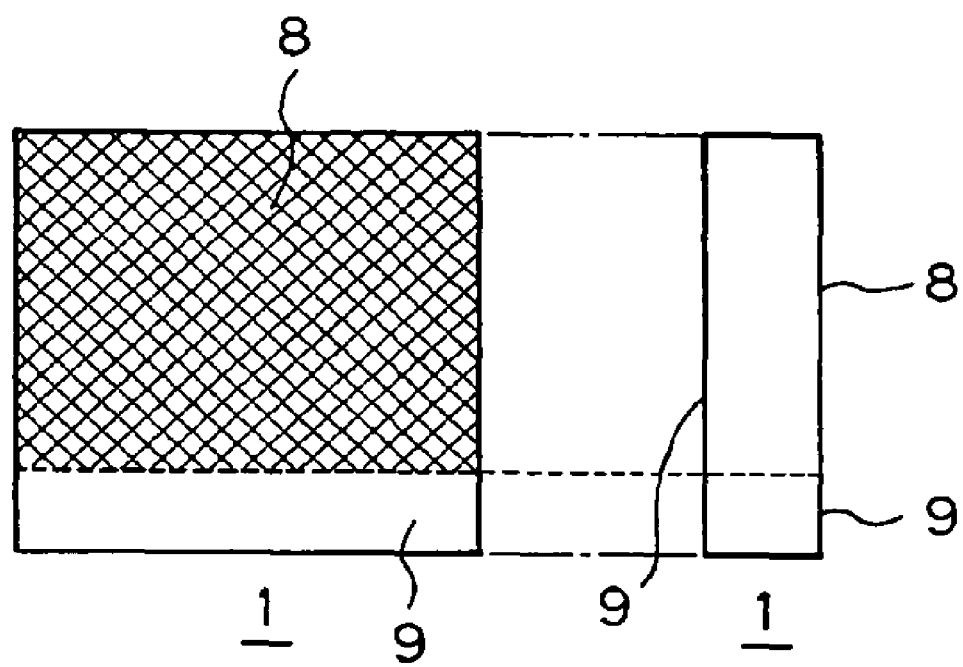
FIG. 24 is illustrative of a modification to the input side mirror usable in the embodiment of FIG. 21.

In the embodiments of FIG. 19 and FIG. 21, the input side mirror 1 is made up of one high-reflectivity (total-reflection), hole-free plane mirror 1. However, it is noted that another input side mirror 1 could be achieved by applying an antireflection coating 9 to a seed light-incident area of the output side surface of a $CaF_2$ or other plane substrate transparent to ultraviolet light and a high-reflectivity (total-reflection) mirror coating 8 to the remaining area, as shown in FIG. 22, FIG. 23 and FIG. 24, respectively, with (a) being a view as viewed from the chamber 3 side and (b) being a sectional view. With each of the input side mirrors 1 shown in FIGS. 16-21, there is difficulty in applying coating as far as the ends of the mirror for the purpose of keeping the mirror during vapor deposition. It is also not easy to process the ends of the $CaF_2$ or other substrate into right-angle faces with high accuracy. Usually, there is a chip off the ends during fabrication. Without chip-free application of a high-reflectivity (total-reflection) coating 8 as far as the ends, the substrate ends having a decreased reflectivity will cause losses leading to an oscillation efficiency drop. If each of such input side mirrors 1 as shown in FIG. 22, FIG. 23 and FIG. 24 is used, processing of the ends of the high-reflectivity (total-reflection) coating 8 will then be facilitated, so that the high-reflectivity coating 8 will be applied as far as the boundary between the seed light 23 and the amplified laser light in the amplification-stage laser 60.

Referring here to FIGS. 23(c) and 23(d), there is shown in what relation the input side mirror 1 is positioned with respect to the discharge area 22 in the two-stage laser system shown in FIG. 19 or FIG. 21. Specifically, FIGS. 23(c) and 23(d) are views as viewed from the output side of the input side mirror 1 (the side on which the seed light 23 is incident). FIG. 23(c) shows that the direction of the end of an area applied with a high-reflectivity (total-reflection) coating 8 on the side of the mirror, which is not its peripheral edge side, substantially matches the longitudinal direction of the discharge area 22 defined by the discharge electrodes 4 and 5, and FIG. 23(d) shows that the direction of the end of the area applied with the high-reflectivity (total-reflection) coating 8 on the side of the mirror, which is not its peripheral edge side, is substantially orthogonal to the longitudinal direction of the discharge area 22 defined by the discharge electrodes 4 and 5. In FIGS. 23(c) and 23(d), it is preferable that the area ratio of an area X where the area of the input side mirror 1 applied with the high-reflectivity (total-reflection) coating 8 makes an intersection with the discharge area 22 and an area Y where the area of the input side mirror 1 applied with the antireflection coating 9 makes an intersection with the discharge area 22 is at least X<Y. The reason is that when X>Y, the light oscillated from the amplification-stage laser 60 goes back to the oscillation-stage laser 50, doing damage to the optical elements in the oscillation-stage laser 50 (especially the front mirror 52), and bring about a drop of the laser output produced out of the front mirror 52 in the oscillation-stage laser 50 (the output of the seed light 23).

The size of the input side mirror 1 shown in FIG. 22, FIG. 23 and FIG. 24 should desirously be such that the length of the end of the area applied with the high-reflectivity (total-reflection) coating 8 on the side of the mirror, which is not its peripheral edge side, is longer than the length of the discharge area 22 defined by the discharge electrodes 4 and 5 in the amplification-stage laser 60 in its longitudinal direction.

As shown, the input side mirror 1 is located externally of the laser chamber 3. Thus, even when the distance between the discharge electrodes 4 and 5 is designed to become longer, the laser light from the laser chamber 3 is unlikely to lie off the input side mirror 1 as long as that distance is within the range of the length of the end of the area applied with the high-reflectivity (total-reflection) coating 8 and the antireflection coating 8 on the side of the mirror, which is not its peripheral edge side.

In the input side mirror 1 shown in FIG. 22, FIG. 23 and FIG. 24, portions of the plane substrate other than its portion applied with the high-reflectivity (total-reflection) coating 9 may not be applied with the anti-reflection coating 8. With such an arrangement wherein only one site is provided with the high-reflectivity (total-reflection) coating 8 and there is no antireflection coating 9, the robustness of the input side mirror 1 to laser light can be improved due to no possibility of any coating deterioration.

In the exemplary two-stage laser system as described above, when the seed light 23 from the oscillation-stage laser 50 is injected in the amplification stage-laser 60, the seed light 23 is injected from one mirror (the input side mirror 1) of the mirrors forming the resonator in the amplification stage-laser 60 while the seed light 23 is produced as amplified laser light out of another mirror (the output side mirror 2). In what follows, an account will be given of some embodiments wherein a mirror for the injection of seed light 23 from the oscillation-stage laser 50 and a mirror which the amplified seed light 23 leaves have a sharing mirror function.

Figure 25:
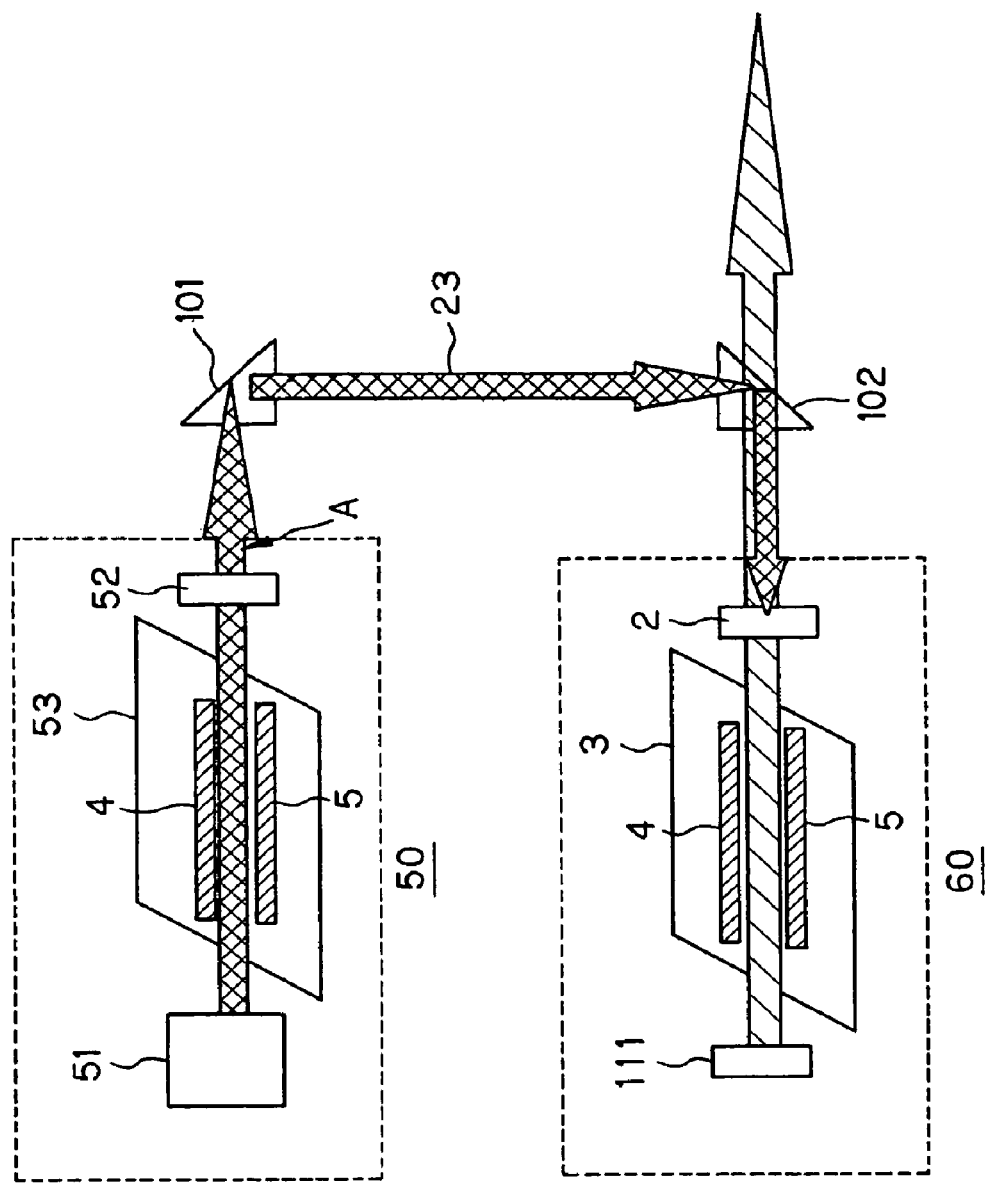
FIG. 25 is illustrative of part of another embodiment of the two-stage laser system for aligners according to the invention.

FIG. 25 is illustrative of one exemplary arrangement for entrance from the output side mirror 2 of the seed light 23 from an oscillation-stage laser 50. FIG. 25 is illustrative in side arrangement of the oscillation-stage laser 50 and the amplification-stage laser 60. The seed light from the line narrowing oscillation-stage laser 50 comprising a line narrowing module 51 is reflected by two 45° right-angle prisms 101 and 102 in this order, entering an exit side mirror (partial reflecting mirror) 2 that is one mirror forming a resonator in the oscillation-stage laser 60. A substantial part of the seed light 23 passes through the exit side mirror 2 for injection in the amplification-stage laser 60, although the remaining slight part is reflected at the entrance surface of the exit side mirror 2. The injected seed light 23 passes through the discharge area 22 defined by discharge electrodes 4 and 5 in the amplification-stage laser 60 for reflection by a rear side mirror (total-reflection mirror) 111 that is another mirror forming the resonator in the amplification-stage laser 60, whereupon the reflected seed light 23 again passes through the discharge area 22, leaving the output side mirror 2.

In this embodiment, too, it is acceptable to inject the seed light 23 having such divergence as to satisfy the above conditions (2) and (3) in the amplification-stage laser 60. Further, if the seed light is injected in such a way as to fill the discharge area while the optical axis C of the seed light 23 is slightly inclined with respect to the optical axis D of the rear- and output-side mirrors 111 and 2, much lower coherence is then achievable so that efficient amplification and oscillation take place at the amplification-stage laser 60.

Figures 26A, 26B:
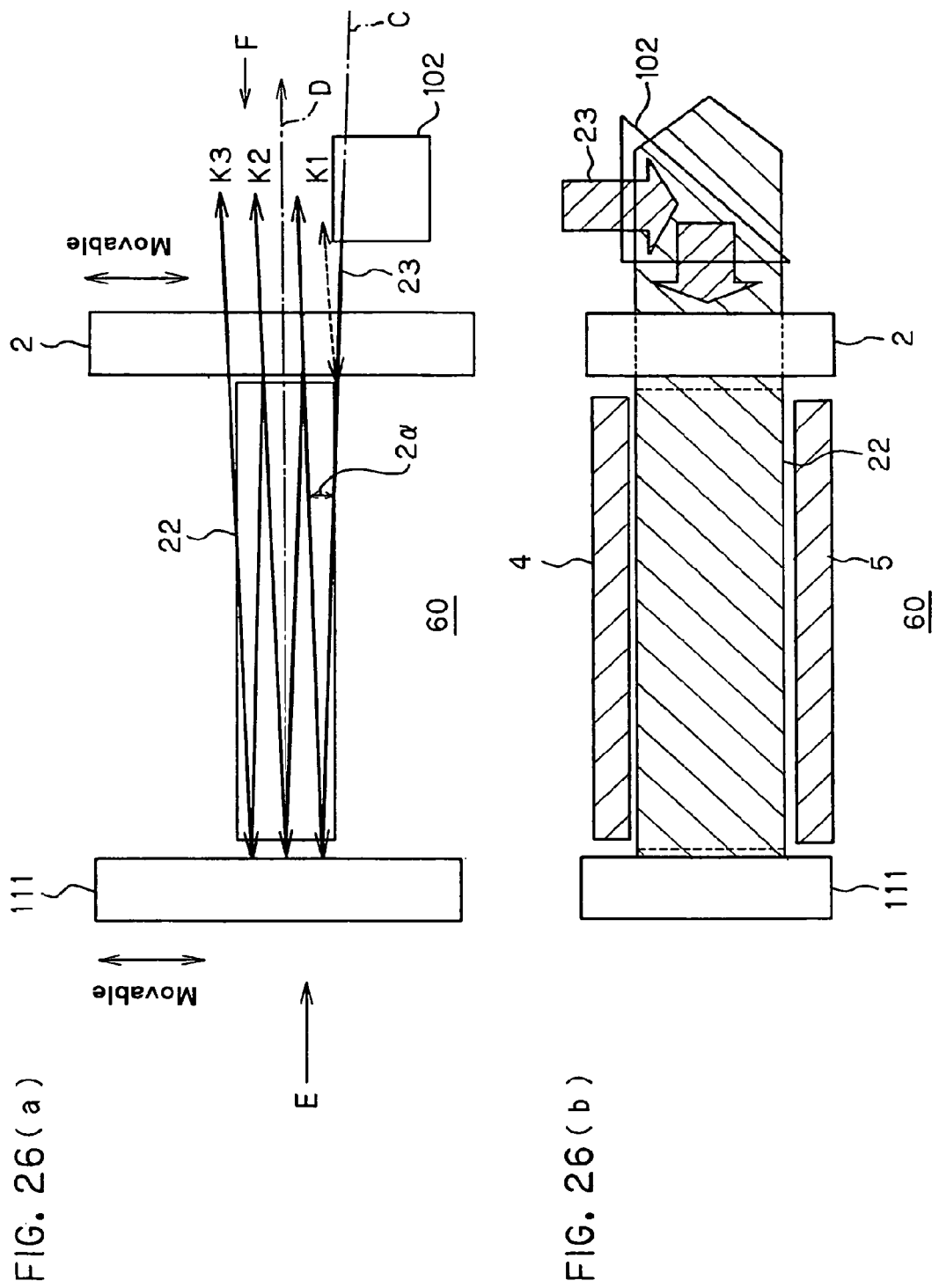
FIG. 26 is illustrative of the amplification-stage laser that forms a part of the two-stage laser system for aligners shown in FIG. 25.

FIG. 26 is illustrative of the amplification-stage laser 60 in the embodiment of FIG. 25, wherein the seed light 23 is entered in the discharge area 22 in the amplification-stage laser 60 from its end while the optical axis C of the seed light 23 is slightly inclined with respect to the optical axis D of the rear side mirror 111 and the output side mirror 2. Specifically, FIGS. 26(*a*) and 26(*b*) are a top view and a side view of the resonator in the amplification-stage laser 60, respectively.

As shown in the top view of FIG. 26(*a*), the narrow-banded seed light 23 produced out of the oscillation-stage laser 50 is reflected by two 45° right-angle prisms 101 and 102 in this order (see FIG. 25), entering the exit side mirror 2 that is one mirror that forms the resonator in the amplification-stage laser 60. A substantial part of the seed light 23 transmits through the exit side mirror 2, although the remaining slight part is reflected at the entrance surface of the exit side mirror 2 (as indicated by a broken line). The transmitted seed light 23 is injected from the side of a discharge area 22 in the amplification-stage laser 60.

Entering the discharge area 22 while the optical axis C of the seed light 23 is set at a slight angle of inclination, α, with respect to the optical axis D of the resonator in the amplification-stage laser 60, the seed light 23 is amplified in the discharge area 22, entering a rear side mirror 111 where it is subjected to total reflection. The reflected light again passes through the discharge area 22 for amplification, and a part of the amplified laser light transmits through the exit side mirror (partial reflecting mirror) 2 and is produced as laser light K1. The remaining part of the amplified laser light is reflected by the exit side mirror 2, going back to the discharge area 22 for amplification.

Then, the amplified laser light is again incident on the rear side mirror 111 where it is subjected to total reflection. The reflected light again passes through the discharge area 22 for amplification, and a part of the amplified laser light transmits through the exit side mirror (partial reflecting mirror) 2 and is produced as laser light K2. The remaining part of the amplified laser light is reflected by the exit side mirror 2, going back to the discharge area 22. By repetition of such resonation, laser light K3 is produced as the output of the amplification-stage laser 60.

Here, the angle of incidence of the seed light 23 on the output side mirror 2 and the angles of incidence and reflection of the amplified light on and at the rear side mirror 111 and output side mirror 2 are each set at an angle, α, with respect to the optical axis D of the resonator in the amplification-stage laser 60. In this way, the seed light 23 is subjected to zigzag multiple reflections between the output side mirror (partial reflecting mirror) 2 and the rear side mirror (total-reflection mirror) 111, as shown in the top view of FIG. 26(*a*). Thus, much lower spatial coherence is achievable on the same principles as described with reference to the principles of operation of FIG. 20. Notice here that the output side mirror (partial reflecting mirror) 2 has a reflectivity of, e.g., 30%. Then, the efficiency of incidence of the seed light 23 on the amplification-stage laser 60 will become 70%.

The advantage of this mode is that uniform coatings can be applied all over the surfaces of the rear side mirror 111 and output side mirror 2 that form together the resonator in the amplification-stage laser 60; it is not necessary to apply such partial coatings as shown in FIG. 17, FIG. 18, FIG. 22, FIG. 23, and FIG. 24. This leads to another advantage that the mirrors are easy and less expensive to fabricate, and the quality and robustness of the coatings are improved as well. Since the output side mirror (partial reflecting mirror) 2 has a higher reflectivity, it is acceptable to apply no coating to the injection site, when the efficiency of injection of the seed light 23 becomes worse.

In this embodiment, the rear side mirror 111 and the output side mirror 2 are each formed of a plane mirror; however, the invention is by no means limited to it as long as the stable resonator is set up by both mirrors. For instance, if the rear side mirror 111 or the output side mirror 2 is configured as a cylindrical concave mirror, much lower spatial coherence is then achievable. Specifically, as the cylindrical concave mirror is located such that its generating line direction substantially matches the center axis of the discharge direction, it results in a lot more resonance modes so that much lower coherence is achievable in the vertical direction to the discharge direction.

On the other hand, the energy of laser light in the resonator in the amplification-stage laser 60 will become higher than that of the laser light produced out of the output side mirror 2 after amplification. This will offer a problem in conjunction with the robustness of the rear side mirror 111 and output side mirror 2 to laser light. However, this problem can be solved by timed movement of the effective portions of these mirrors; that robustness can be much more improved, as exemplified in FIG. 27.

FIG. 27 is illustrative of mirror holders for holding the rear side mirror 111 and the output side mirror 2, respectively, as viewed from directions indicated by arrows E and F in FIG. 26(*a*). Specifically, FIG. 27(*a*) is illustrative of a mirror holder 210 with a moving stage attached to it, as viewed from the rear side mirror 111 side (the E side of FIG. 26(*a*)), and FIG. 27(*b*) is illustrative of a mirror holder 211 with a moving stage attached to it, as viewed from the output side mirror 2 side (the F side of FIG. 26(*a*)). These mirror holders 210 and 211, each with the moving stage attached to it, are fixed to a plate for the fixation of the resonator in the amplification-stage laser 60, not shown.

The mirror holder 210 for holding the rear side mirror 111 is now explained. The rear side mirror 111 is fixed to a mirror holder portion 206, and the mirror holder portion 206 is movably fixed to a mirror holder stage plate 203 via mirror holder guides 204 and 205. The mirror holder portion 206 is movable by the mirror holder guides 204 and 205 in the horizontal direction (indicated by an arrow in FIG. 27(*a*)) with the optical axis remaining invariable.

One end of the mirror holder stage plate 203 on a side at a right angle with the side provided with the mirror holder guides 204 and 205 is provided with a screw-fixing plate 202 having a female thread portion. At this female thread portion there is held a knobbed screw 201. The knobbed screw 201 is fixed at its distal end with a ball 212. The knobbed screw 201 is threaded in place such that the ball 212 comes into contact with a side portion of the mirror holder portion 206.

On the other hand, the other end portion of the mirror holder stage plate 203 on the side at a right angle with the side provided with the mirror holder guides 204 and 205 is provided with a spring-fixing member 208. One end of a spring 209 is fixed to the spring-fixing member 208. The other end of the spring 209 is inserted over a projection 207 attached to the mirror holder portion 206. The spring 209 is designed and located such that its resilient force allows the mirror holder portion 206 to be forced against the ball 212 fixed to the distal end of the knobbed screw 201. Notice here that the projection 207 attached to the mirror holder 206 is located at a position substantially coaxial with the knobbed screw 201.

With such an arrangement, as the knobbed screw 201 is rotated, it allows the rear side mirror 111 to translate horizontally with its optical axis remaining invariable. The mirror holder 211 for holding the exit side mirror 2 is constructed as in the mirror holder 210.

Preferably in this embodiment, the mirror holders 210 and 211 should be symmetric with respect to a plane vertical to the paper sheet of FIG. 27 passing through an XX axis such that the knobbed screws 201 of the mirror holders 210 and 211 are positioned on the same side as the amplification-stage laser 60 and their maintenance sides are positioned in the same direction.

In the embodiment of FIG. 27, if the rear side mirror 111 and the output side mirror 2 are moved using the mirror holders 210 and 211, then the same mirrors 111 and 2 are each used three times with the output laser light 213, so that the service life of each mirror can be extended three times. In this embodiment, the mirror holder portion 206 is operable to move in one direction alone. However, the invention is not limited to it; for instance, the mirror holder portion 206 could be located on a two-axis stage. In FIG. 27, there is not shown the mirror inclination-adjustment mechanism necessary for the adjustment of the optical axis of the rear side mirror 111 and the output side mirror 2; however, that mechanism could be located on the mirror holder 206.

Another embodiment of the arrangement wherein the mirror for the injection of the seed light 23 from the oscillation-stage laser 50 and the mirror for producing the amplified laser light out of the seed light 23 have a sharing mirror function is now explained with reference to FIG. 28.

Figures 28A, 28B:
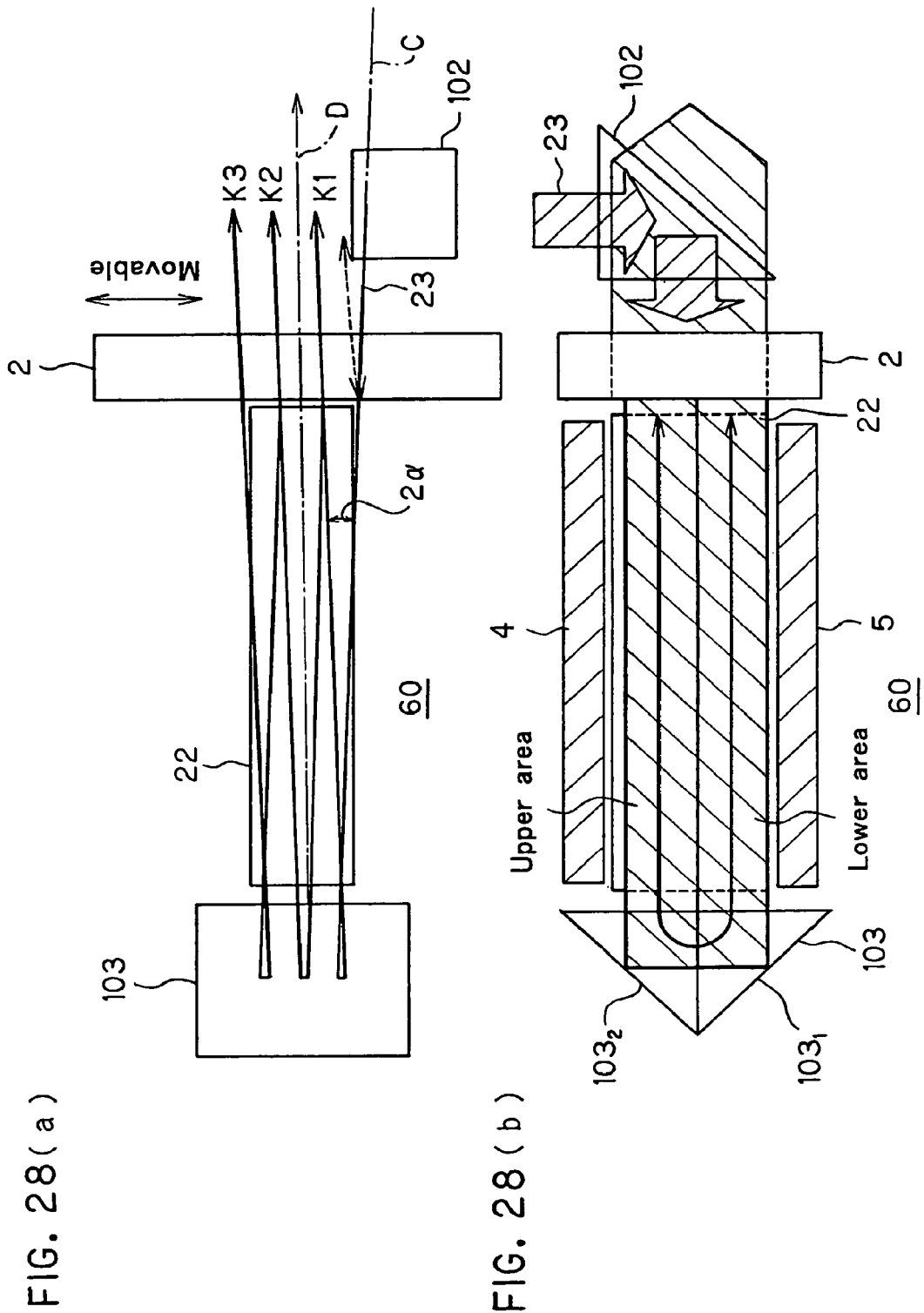
FIG. 28 is illustrative of part of yet another embodiment of the two-stage laser system for aligners according to the invention.

The amplification-stage laser 60 shown in FIG. 28 is used as the amplification-stage laser 60 in the two-stage laser system shown in FIG. 25 in place of the amplification-stage laser 60 shown in FIG. 26. A structural difference with the amplification-stage laser 60 shown in FIG. 26 is that an optical element for turning light back using a total-reflection right-angle prism (roof prism) 103 is used in lieu of the rear side mirror (total-reflection) mirror 11 in the resonator located in the amplification-stage laser 60 of FIG. 26. Other components are the same as in FIG. 26.

That is, FIG. 28 shows the amplification-stage laser 60 wherein the optical axis C of the seed light 23 is slightly inclined with respect to the optical axis D of the total-reflection right-angle prism 103 and the output side mirror 2 to enter the seed light 23 in the discharge area 22 in the amplification-stage laser 60 from its end. Specifically, FIGS. 28(*a*) and 28(*b*) are a top view and a side view of the resonator in the amplification-stage laser 60, respectively.

In this embodiment, too, the optical axis C of the seed light 23 is slightly inclined with respect to the optical axis D of the total-reflection right-angle prism 103 and the output side mirror 2 to inject the seed light 23 in such a way as to fill the discharge area, as previously described. Therefore, much lower coherence is achievable, and so efficient amplification and oscillation are achievable at the amplification-stage laser 60.

As shown in the top view of FIG. 28(*a*), the narrow-banded seed light 23 produced out of the oscillation-stage laser 50 is reflected by two 45° right-angle prisms 101 and 102 in this order (see FIG. 25), entering the output side mirror (partial reflecting mirror) 2 that is one optical element forming the resonator in the amplification-stage laser 60. A substantial part of the reflected light transmits through the exit side mirror 2, although the remaining slight part is reflected at the entrance surface of the exit side mirror 2 (indicated by a broken line in FIG. 28(*a*). The transmitted seed light 23 is injected from the side of the discharge area 22 in the amplification-stage laser 60.

This seed light 23 enters the amplification-stage laser 60 with its optical axis C set at a slight angle of inclination, α, with respect to the optical axis D of the resonator in the amplification-stage laser 60. In the discharge area 22, the seed light 23 is amplified, and then subjected to Fresnel total reflection at the surfaces $103_1$ and $103_2$ of the total-reflection right-angle prism 103 (reflection at an angle of incidence larger than the critical angle).

Notice here that this embodiment works differently than the embodiment of FIG. 26. More specifically, the incident laser light is totally reflected twice at the surfaces $103_1$ and $103_2$ of the total-reflection right-angle prism 103, so that the output laser light goes back the way that it has come. This turned-back laser light again passes through the discharge area 22 where it is amplified. A part of the amplified light transmits through the exit side mirror (partial reflecting mirror) 2, and is produced as laser mirror K1. The rest is reflected by the exit side mirror 2, going back to the discharge area 22 where it is amplified.

Then, the amplified laser light again enters the total-reflection right-angle prism 103 where it is totally reflected. The totally reflected light again goes back the way that it has come, again passing through the discharge area 22 where it is amplified. A part of the amplified laser light transmits through the exit side mirror (partial reflecting mirror) 2, and is produced as laser light K2. The rest is reflected by the exit side mirror 2, going back to the discharge area 22 where it is amplified. By repetition of such resonance, laser light K3 is produced as the output of the amplification-stage laser 60.

Here the angle of incidence of the seed light 23 on the output side mirror 2 and the angles of incidence and reflection of the amplified light on and at the total-reflection right-angle prism 103 and the output side mirror 2 becomes α. In this way, as shown in the top view of FIG. 28(*a*), the seed light 23 is subjected to zigzag multi-reflection between the output side mirror (partial reflecting mirror) 2 and the total-reflection right-angle prism 103. Thus, lower spatial coherence is achievable on the same principles as described with reference to FIG. 23 that is illustrative of the principles of operation.

With the embodiment explained with reference to FIG. 28, the additional following advantages are obtainable in addition to the advantages equivalent to those previously explained with reference to FIG. 26. In this embodiment, the laser light is turned back by the total-reflection right-angle prism 103. For this reason, even when there is an uneven amplification intensity distribution in the longitudinal direction (discharge direction) of the amplification gain that is the discharge area 22, the symmetry and stability of the output laser light in the longitudinal direction are improved because the laser light passes through both upper and lower regions of the discharge area 22.

More specifically, as the frequency of repetition of laser oscillation grows (e.g., 3,000 to 4,000 Hz), discharge between the discharge electrodes 4 and 5 causes standing waves to occur due to acoustic waves, giving rise to uneven amplification gain distribution and refractive index in the longitudinal direction (discharge direction). On the contrary, if the laser light is turned back by the total-reflection right-angle prism 103 for re-amplification, then it is possible to maintain the post-amplification uniformity, symmetry and stability of the laser light. It is also possible to achieve much lower coherence. Notice here that to obtain such advantages, the ridgeline of the reflecting surfaces $103_1$ and $103_2$ of the total-reflection right-angle prism 103 (the ridgeline of the roof) must be directed in a substantially vertical direction to the discharge direction (see FIG. 28(*b*)).

In this embodiment, the entrance surface of the total-reflection right-angle prism 103 may or may not be applied with an antireflection coating. However, the entrance surface of the total-reflection right-angle prism 103 must be inclined with respect to the reflecting surface of the output side mirror 2 for the purpose of preventing parasitic oscillation with respect to the amplification resonator and the optical axis C of the seed light.

In the above embodiment of the two-stage laser system, when the seed light 23 is injected from the oscillation-stage laser 50 in the amplification-stage laser 60, the seed light 23 is injected therein from one mirror (input side mirror 1) forming the resonator therein, and the seed light 23 is produced as amplified laser light out of the other mirror (output side mirror 2). The mirror for the injection of the seed light 23 from the oscillation-stage laser 50 and the mirror out of which the seed light 23 is produced as amplified laser light have a sharing function. In any case, the seed light 23 passes through the discharge area 22 just upon entrance and transmission of the seed light 23 in and through one mirror that forms the resonator in the amplification-stage laser 60.

Figure 30B:
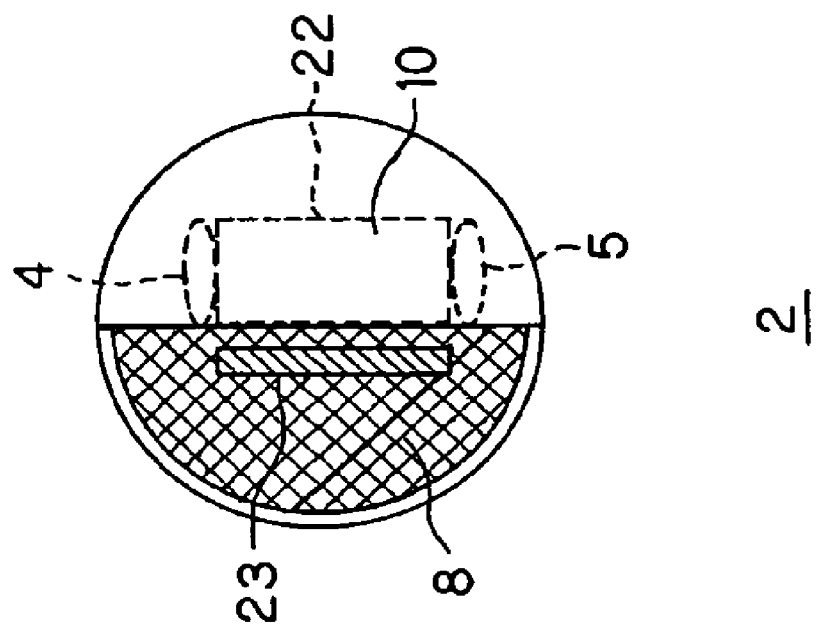
FIG. 30 is illustrative of one embodiment of the resonator mirrors used in the amplification-stage laser of FIG. 29.
Figure 30A:
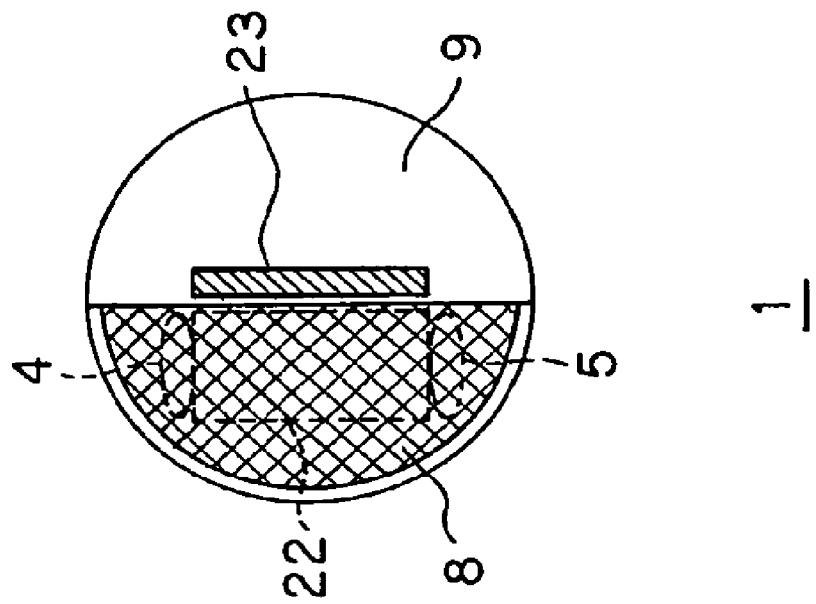

FIG. 29 and FIG. 30 show a modification to the embodiment of the invention wherein the seed light 23 is injected in the amplification-stage laser 60 from one mirror (input side mirror 1) that forms the resonator therein and produced as amplified laser light out of the other mirror (output side mirror 2). More specifically, the seed light 23 enters and transmits through the input side mirror 1 in the amplification-stage laser 60, and arrives at the output side mirror 2 through an area other than the discharge area 22, where it is reflected. Then, the reflected light passes through the discharge area 22.

If viewed from the discharge area 22, this embodiment will be equivalent to the case where the mirror for the injection of the seed light 23 from the oscillation-stage laser 50 and the mirror out of which the seed light 23 is produced as amplified laser light have a sharing function. That is, the seed light 23 enters the discharge area 22 from its output side, where it is amplified, and then leaves the discharge area 22.

FIG. 29 is illustrative of one exemplary embodiment of the amplification-stage laser 60. Specifically, FIGS. 29(*a*) and 29(*b*) are a top view and a side view of the resonator in the amplification-stage laser 60.

As shown in the view of FIG. 30(*a*) as taken from a direction indicated by an arrow E in FIG. 29(*a*), the construction of the input side mirror 1 in this embodiment is the same as that of the input side mirror 1 shown in FIG. 22, FIG. 23 and FIG. 24. That is, an antireflection coating 9 is applied to the area of a $CaF_2$ or other plane substrate transparent to ultraviolet light, which is to receive the seed light 23, and a high-reflectivity (total-reflection) coating 8 is applied to the rest.

On the other hand, the construction of the output side mirror 2 is shown in the view of FIG. 30(*b*) as taken from a direction indicated by an arrow F in FIG. 29(*a*). A high-reflectivity (total-reflection) mirror coating 8 is applied to the area of a $CaF_2$ or other plane substrate transparent to ultraviolet light, which is to receive the seed light 23, and a partial reflecting mirror coating 10 is applied to the rest.

Referring to FIG. 29, the seed light 23 produced out of the oscillation-stage laser 50 (see FIG. 19 or FIG. 21) enters and transmits through a transmitting portion of the input side mirror 1 (the area provided with the anti-reflection coating 9) and then through an area of the amplification-stage laser 60 other than the discharge area 22, and enters a total-reflection portion of the output side mirror 2 (the area applied with the high-reflectivity (total-reflection) mirror coating 8), at which it is totally reflected toward the discharge area 22.

In the amplification-stage laser 60 shown in FIG. 29, the optical axis C of the seed light 23 is inclined by a slight angle α with respect to the optical axis D of the resonator.

In this embodiment, too, the optical axis C of the seed light 23 is slightly inclined with respect to the optical axis D of the resonator to fill the discharge area with the seed light by injection. Therefore, much lower coherence is achievable, and efficient amplification and oscillation take place at the amplification-stage laser 60 as well, as previously described.

Upon incidence on the total-reflection portion of the output side mirror 2 and total reflection toward the discharge area 22, the seed light 23 passes through the discharge area 22 where it is amplified. Then, the amplified laser light enters the total-reflection portion of the input side mirror 1 (the area applied with the high-reflectivity (total-reflection) mirror coating 8), where it is totally reflected.

The reflected light again passes through the discharge area 22 where it is amplified, entering the partial reflecting portion of the output side mirror 2 (the area applied with the partial reflecting mirror coating 10), where it is amplified. A part of the amplified laser light transmits through the output side mirror 2, leaving it as laser light K1. The rest is reflected there, going back to the discharge area 22.

The reflected light that has gone back to the discharge area 22 again passes through the discharge area 22 where it is amplified. Then, the amplified light enters the total-reflection portion of the input side mirror 1, where it is totally reflected. Then, the amplified laser light enters the partial reflecting portion of the output side mirror 2, where it is amplified. A part of the amplified laser light transmits through the output side mirror 2, leaving it as laser light K2. The rest is reflected there, going back to the discharge area 22. By repetition of such resonance, T3 is produced as the output of the amplification-stage laser 60.

Here the angle of incidence of the seed light 23 on the output side mirror 2 and the angles of incidence and reflection of the amplified light on and at the input side mirror 1 and the output side mirror 2 become a with respect to the optical axis D of the resonator in the amplification-stage laser 60.

In this way, the seed light 23 is subjected to zigzag multiple reflections between the output side mirror 2 and the input side mirror 1, as shown in the top view of FIG. 29(*a*).

The advantage of this embodiment is that the seed light 23 can be injected with efficiency in the amplification-stage laser. FIG. 30(*a*) is illustrative of in what relation the input side mirror 1 is positioned to the discharge area and the seed light 23 as viewed from a direction indicated by an arrow E in FIG. 29(*a*), and FIG. 30(*b*) is illustrative of in what relation the output side mirror 2 is positioned to the discharge area and the seed light 23 as viewed from a direction indicated by an arrow F in FIG. 29(*a*).

In this embodiment, the seed light 23 is entered from a transmitting portion of the input side mirror 1 in the discharge area 22 in the amplification-stage laser 60 at a position slightly spaced away from it. As viewed from a direction E (see FIG. 29(*a*)), the discharge area 22 is positioned such that it overlaps the total-reflection portion of the input side mirror 1 and the end of the discharge area 22 substantially matches the end of the total-reflection portion (FIG. 30(*a*)). As viewed from a direction F (see FIG. 29(*a*)), the discharge area 22 is positioned such that the boundary line between the total-reflection portion and the partial reflection portion of the output side mirror 1 substantially matches the end of the discharge area 22 and the discharge area 22 overlaps the partial reflection portion (FIG. 30(*b*)).

No application of the coating 10 to the transmitting portion of the input side mirror 1 and the partial reflecting portion of the output side mirror 1 provides three advantages as described just below.

(1) A common material can be used for both mirrors 1 and 2.

(2) Both mirrors 1 and 2 are easier to fabricate.

(3) There is no partial reflecting film (coating 10) at the partial reflecting portion of the output side mirror 2; robustness is improved because of no coating deterioration (even when there is no partial reflecting mirror coating 10, Fresnel reflection allows the output side mirror to work as a partial reflecting mirror).

When, as in the embodiment of FIG. 20 or FIG. 29, the seed light 23 is injected from the input side mirror 1 in the amplification-stage laser with its optical axis C slightly inclined with respect to the optical axis D of the resonator, too, it is acceptable to use the total-reflection right-angle prism (roof prism) employed in the embodiment of FIG. 28 in place of the input side mirror 1 applied with the high-reflectivity (total-reflection) mirror coating 8.

By the way, the inventors have found that when the seed light 23 is entered in the discharge area 22 in the amplification-stage laser 60 from its end while, as in FIG. 20, FIG. 26 and FIG. 29, the optical axis C of the seed light 23 is slightly inclined with respect to the optical axis D of the plane input side mirror 1 or the rear side mirror 111 and the plane output side mirror that form the resonator in the amplification-stage laser 60, it is possible to run the laser system more efficiently while keeping low-coherent characteristics, for instance, by properly inclining the input side mirror 1 or the rear side mirror 111 with respect to the output side mirror 2.

First of all, consider the degree of flexibility in the condition for the injection of seed light 23. Typically in the arrangement of FIG. 31 analogous to that of FIG. 19, the length, L, of the resonator is defined by the distance between the input side mirror (or the rear side mirror) 1 and the output side mirror 2 in the amplification-stage laser 60, and the effective width of the discharge area 22 effective for amplification is defined as Wx (mm) in the section of FIG. 19(*a*), and Wy (mm) in the section of FIG. 19(*b*).

Figure 32:
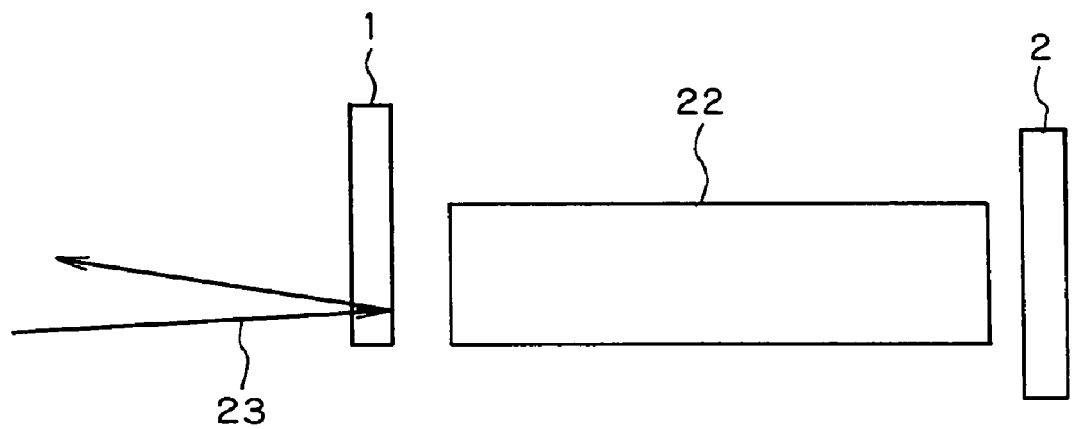
FIG. 32 is illustrative of under what conditions laser output can be effectively taken while laser light makes a given frequency of roundtrips in the resonator in the amplification-stage laser.
Figure 33:
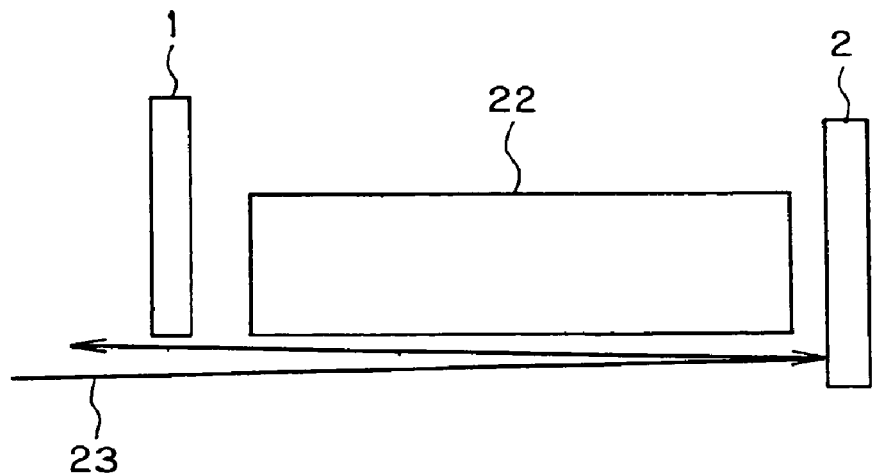
FIG. 33 is illustrative, as in FIG. 32, of under what conditions laser output can be effectively taken while laser light makes a given frequency of roundtrips in the resonator in the amplification-stage laser.
Figure 34:
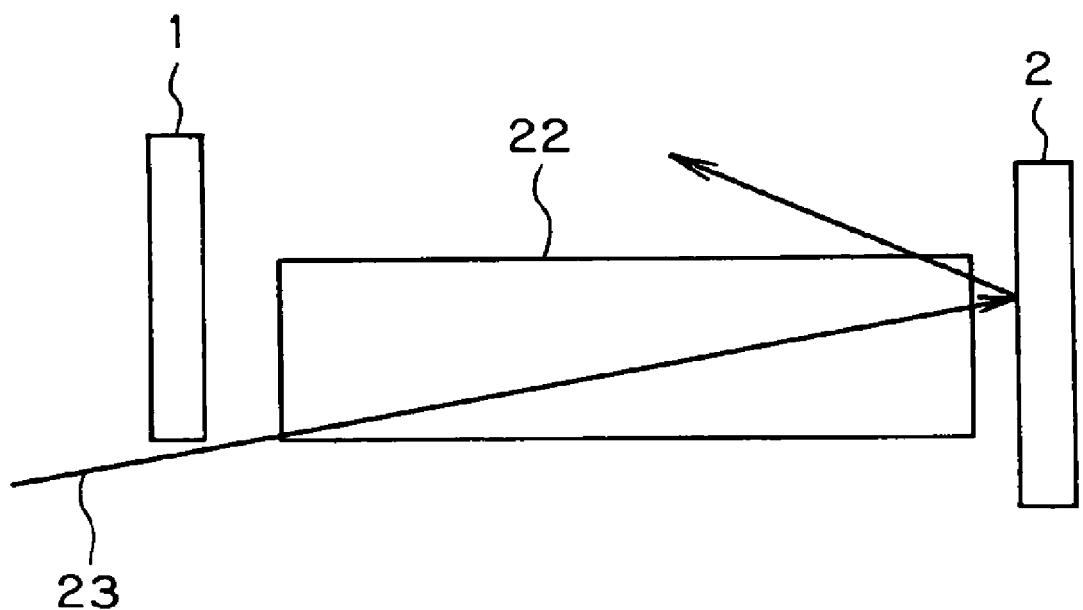
FIG. 34 is illustrative, as in FIG. 32, of under what conditions laser output can be effectively taken while laser light makes a given frequency of roundtrips in the resonator in the amplification-stage laser.

In view of the position and angle of the seed light 23 at the position of the input side mirror 1, consider the condition under which the seed light 23 can make a given frequency of roundtrips in the resonator (input side mirror 1 and output side mirror 2) in the amplification-stage laser 60 to effectively obtain it as laser output. For instance, when the seed light 23 enters a portion of the input side mirror (rear side mirror) 1 applied with a high-reflective coating, as shown in the schematic section of FIG. 32 as taken in the vertical direction (x direction) to the resonator in the amplification-stage laser 60 and the discharge direction of the discharge area 22, it will be reflected by the input side mirror (rear side mirror) 1 at whatever angle. Therefore, the seed light will be incapable of being effectively taken as laser output.

Next, consider the incidence of the seed light 23 from a position near the edge portion of the input side mirror (rear side mirror) 1. As the angle of incidence is too shallow (or as the seed light 23 is incident at an angle almost vertical to the output side mirror 2), the seed light 23 will be incapable of entering the discharge area 22, and it will be incapable of entering the high-reflectivity mirror coating area of the input side mirror (rear side mirror) 1 upon making roundtrips in the resonator; in any case, the seed light 23 will escape from the system.

As the angle of incidence is too tight (or the seed light 23 is obliquely incident on the output side mirror 2), conversely, the seed light 23 will deviate from the discharge area 22 after reflection at the output side mirror 2; it will not provide any effective laser output.

From such points of view, it is possible to derive the condition necessary for the position and angle of the seed light 23 at the input side mirror (rear side mirror) 1, under which the seed light 23 makes a given frequency of roundtrips in the resonator in the amplification-stage laser 60 to provide effective output laser light.

Figure 35:
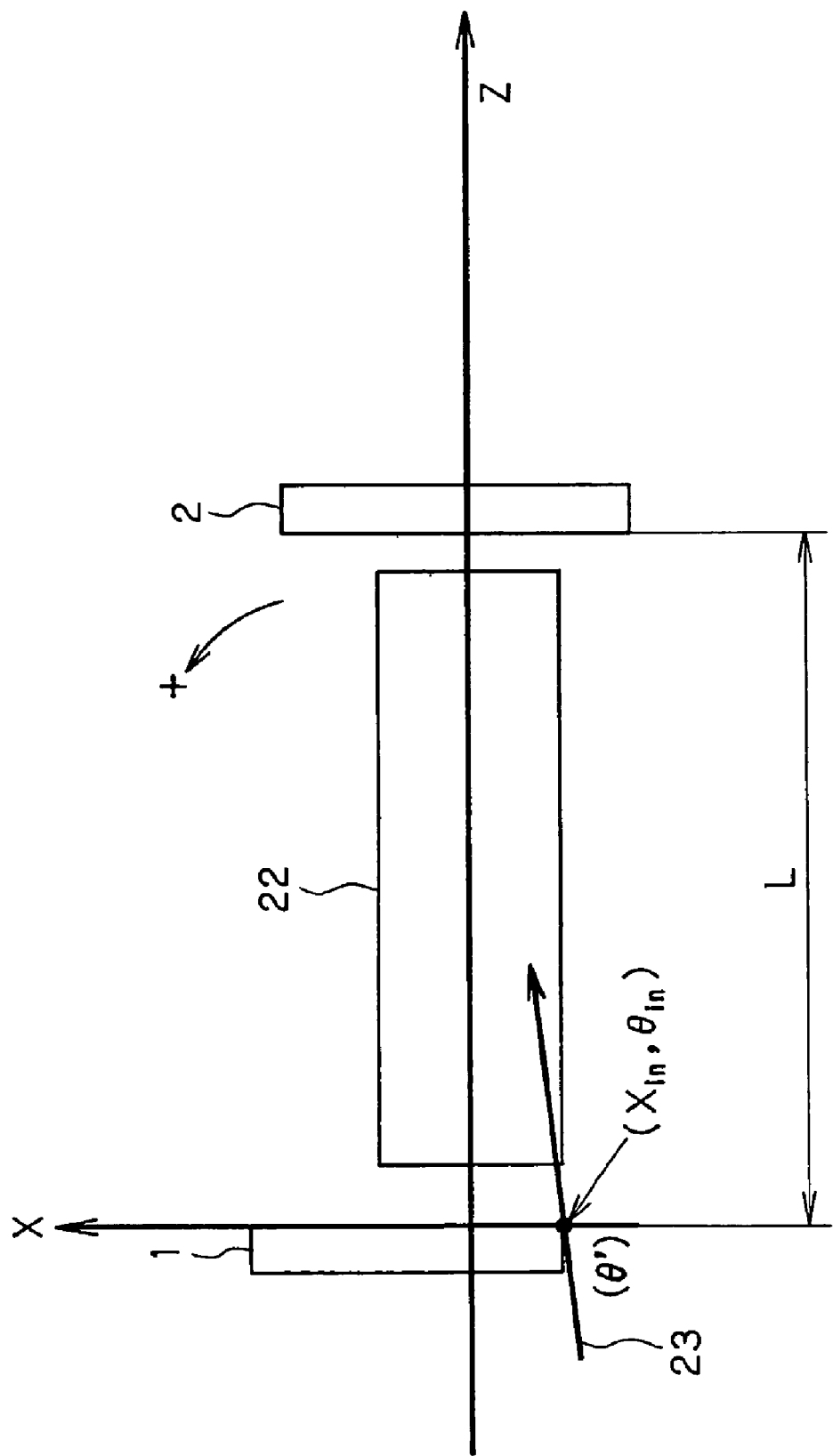
FIG. 35 is illustrative of how to calculate the relations between the position and the angle of injection of seed light at the position of the input side mirror (rear side mirror) necessary to effectively take laser output out of the output side mirror without deviation from the discharge area.

As shown in FIG. 35 as an example, assume that a z-axis is set in a direction that passes the center of the discharge area 22 and runs along the discharge electrodes; an x-axis is set in a direction vertical to the discharge direction, the origin is set at the position of the input side mirror (rear side mirror) 1; with respect to the x-axis, an upper site of the paper is taken as positive; and with respect to the angles of the seed light 23 and the mirror 1, 2, the counterclockwise direction is taken as positive, and when the normal axis to the mirror lies in a z-axis direction, those angles are taken as zero. Here let Xin and θin be the position and angle of injection of the seed light 23 at the position of the input side mirror (rear side mirror) 1, L be the resonator length, θ' be the angle of inclination of the input side mirror (rear side mirror) 1, and the angle of inclination of the output side mirror 2 be zero. Then, the positions Xn and Xn+0.5 of the seed light 23 at an n-th roundtrip (the position of the input side mirror (rear side mirror) 1) or a n+0.5-th roundtrip (the position of the output side mirror 2) are written as $$Xn = Xin + 2n \cdot L \cdot \theta in + 2n(n-1)L \cdot \theta' \quad (5)$$

$$Xn + 0.5 = Xin + (2n+1) \cdot L \cdot \theta in + 2n^2 \cdot L \cdot \theta' \quad (6)$$

From these equations, the position and angle of injection of the seed light 23 at the position of the input side mirror (rear side mirror) 1 needed to take effective laser output out of the output side mirror 2 with no deviation from the discharge area 22 are calculated depending on the frequency of roundtrips to be taken into account.

Figure 36:
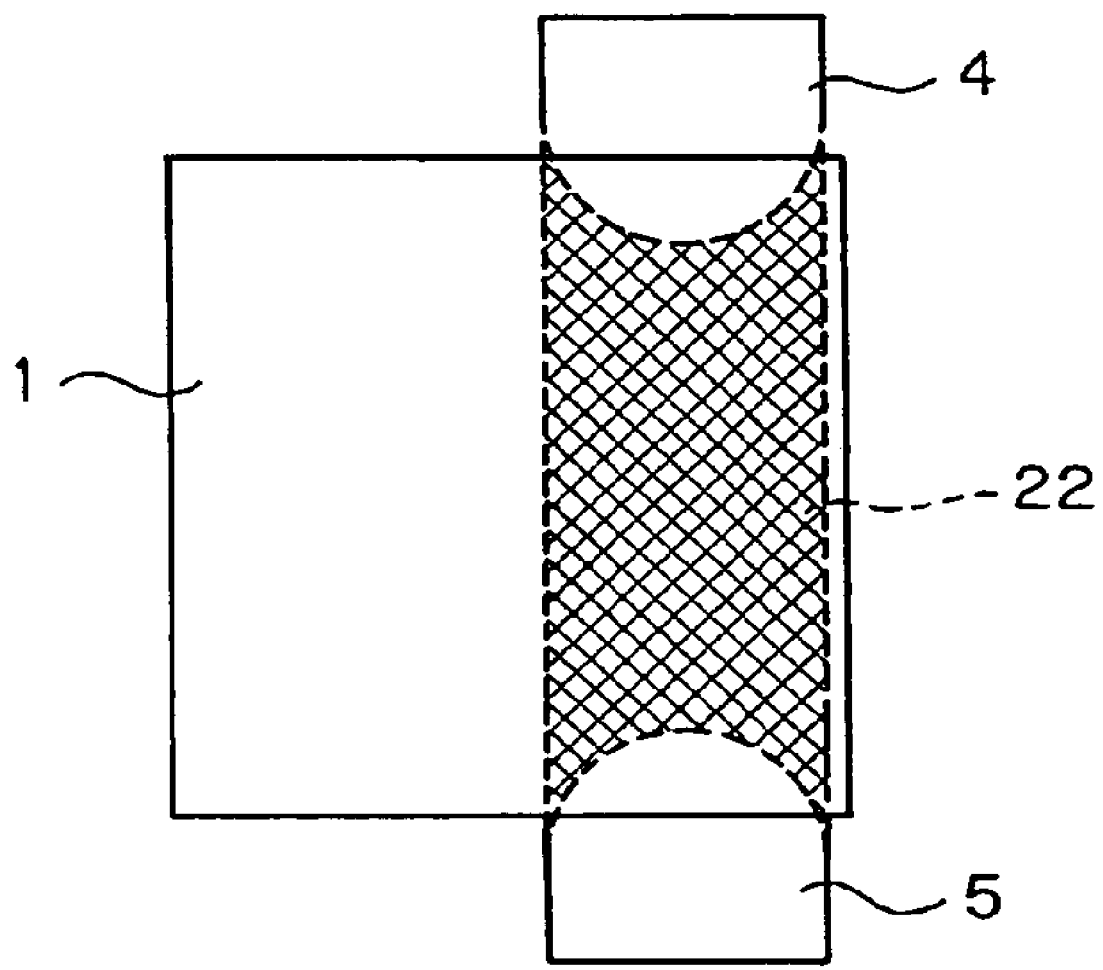
FIG. 36 is illustrative of the embodiment of FIG. 31 as viewed from the side opposite to the chamber, wherein the edge of the input side mirror is in alignment with the end of the discharge area.

Typically, consider now the embodiment (FIG. 31) wherein the input side mirror 1 is decentered in the horizontal direction (x-axis direction), and assume that the seed light makes six roundtrips under the conditions that the resonator length is L=1 m, the discharge width is Wx=2.5 mm, the input side mirror 1 is arranged parallel with the output side mirror 2, and the edge of the input side mirror 1 is in alignment with the end of the discharge area 22 (FIG. 36). As long as the polygonal region condition shown in FIG. 27 is satisfied, it is possible to obtain effective laser output. Although depending on the size, beam divergence angle, etc. of the seed light 23 to be injected, it is desired that the area of this polygonal region be as large as possible.

Figure 37:
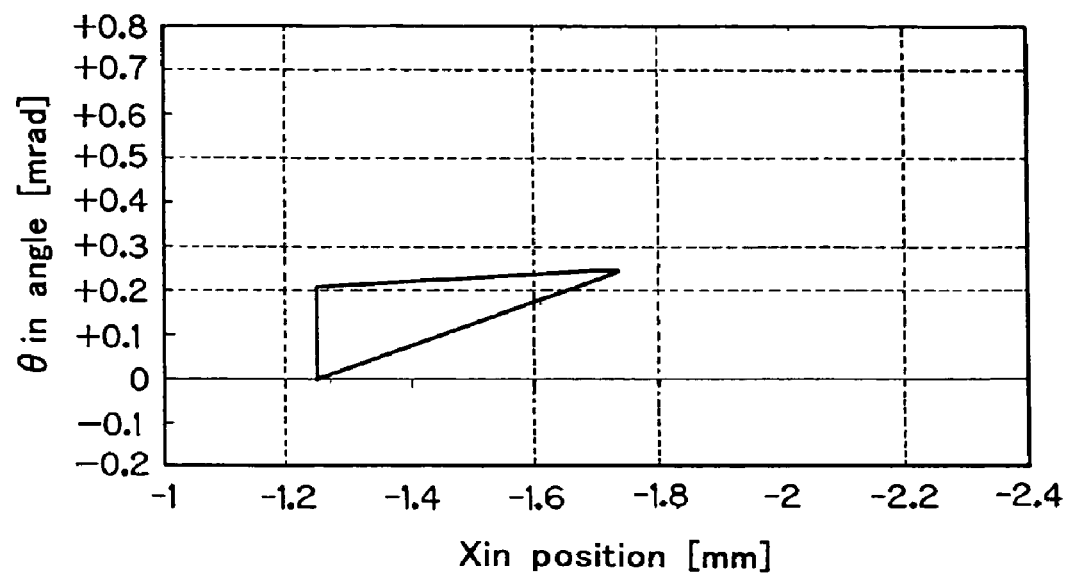
FIG. 37 is illustrative of one area out of which laser output can be effectively taken in a parallel arrangement of the input side mirror and the output side mirror, wherein the edge of the input side mirror is in alignment with the end of the discharge area.
Figure 38:
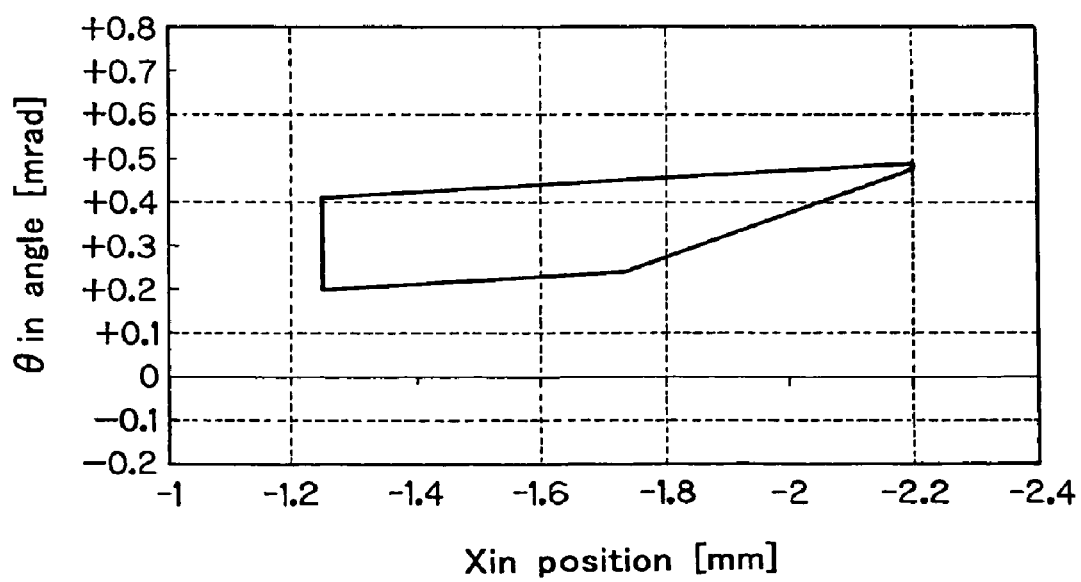
FIG. 38 is illustrative of an area out of which laser output can be effectively taken with the input side mirror inclined.

In FIG. 37, the input side mirror 1 is arranged parallel with the output side mirror 2. When the input side mirror 1 is inclined by +0.04 mrad, on the other hand, a region capable of effectively taking laser light may be found from FIG. 38. As can be seen from FIG. 38, slight inclination of the input side mirror 1 ensures that there is an increase in the area of the region capable of effectively taking laser light (which results in an increase in the degree of flexibility in the injection of the seed light 23), and low coherence is achievable as in the case of a parallel arrangement. It is thus possible to achieve a laser system having improved output.

In this case, the input side mirror 1 is inclined with respect to the output side mirror 2 in such a direction that in view of the distance L between the input side mirror 1 and the output side mirror 2, the seed light 23 oscillated out of the oscillation-stage laser 50 is incident from the side where the mirror-to-mirror spacing becomes wide with the inclination of one mirror.

With this arrangement wherein the resonator built up of two plane mirrors in the amplification-stage laser 60 is set such that one mirror is slightly inclined, not in parallel, with respect to the other, the width of spectra occurring through discharge at the amplification-stage laser 60 decreases in gain relative to broad natural light emissions, with the result that the broadband ratio becomes lower than that in the arrangement wherein two mirrors are arranged in parallel. In other words, it is required for the oscillation-stage laser 50 to have the desired peak intensity so as to meet the requirement for the desired broadband ratio or lower, as set forth in Japanese Patent Application No. 2003-130447. As described above, however, if the resonator is built up of two non-parallel mirrors, then the peak level can be much more reduced down.

In view of the frequency of roundtrips in the resonator, there is a large difference between when the resonator mirrors are parallel and when they have a mutual proper inclination, which ensures that there is an extension of the pulse width of laser light. In consideration of the service life of a semiconductor aligner, it is desired that the laser pulse width be as long as possible.

This is now considered in detail. When the resonator mirrors have a mutual proper inclination as shown in FIG. 39(a), the seed light 23 is obliquely incident on the resonator due to the relation of the edge portion of the input side mirror 1 to the discharge area 22. When one mirror is properly inclined as shown in FIG. 39(a), the seed light can make more roundtrips in the resonator in the amplification-stage laser as compared to when the resonator mirrors are parallel as shown in FIG. 39(b), so that far higher laser output is achievable with a further extension of the pulse width.

It is noted that when the inclination of the input side mirror 1 ranges from 0.0 mrad to 0.16 mrad, the ensuing laser system output surpasses that of the laser arrangement wherein the high-reflectivity side plane of the input side mirror 1 is parallel with the partial-reflectivity side plane of the output side mirror 2. It is to be understood that this range also varies with changes in the resonator length, discharge width and the frequency of roundtrips to be taken into account, as can be seen from the aforesaid equations (5) and (6). For instance, given three roundtrips, output surpassing that of the parallel resonator mirror arrangement will be obtained in the range of 0.0 mrad to 0.87 mrad.

In any case, the above range can relatively easily be derived on the basis of equations (5) and (6), and if the resonator is designed while this range is taken into consideration, increased laser output, extended pulse width, the degree of flexibility in the injection of the seed light 23 and decreased peak intensity of the oscillation-stage laser will then be achieved.

From another point of view, consider here how the input side mirror (rear side mirror) 1 and the output side mirror 2 are inclined with respect to the optical axis C of the seed light 23 (see FIG. 20) in the case where two plane mirrors forming the resonator in the amplification-stage laser 60 are located in a non-parallel fashion.

Figure 40:
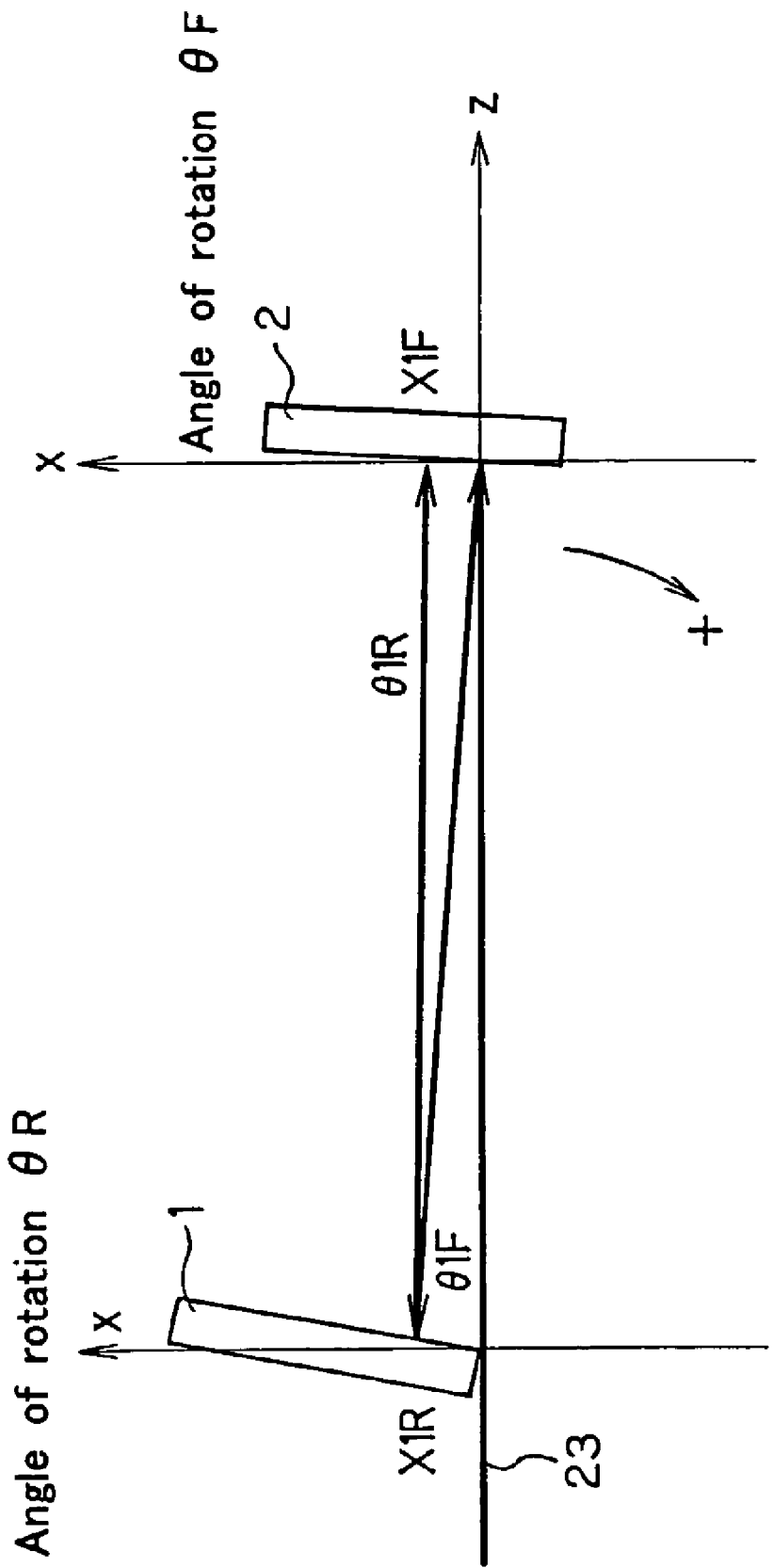
FIG. 40 is a view for studying the angle relation of inclination in a nonparallel arrangement of two plane mirrors that form together the resonator in the amplification-stage laser.

Unlike the case of FIG. 35, set a z-axis in the direction of travel of the seed light 23 and an x-axis in the discharge direction or in the vertical direction to the discharge direction with the origin at a position of the input side mirror (rear side mirror) 1, on which the seed light 23 is to be incident, as shown in FIG. 40, and assume that with respect to the x-axis, an upper site of the paper is taken as positive; with respect to the angles of the seed light 23 and the mirror 1, 2, the clockwise direction is taken as positive; and when the normal to the mirror 1, 2 lies in the z-axis direction, those angles are taken as zero. Here let OR be the angle of inclination of the input side mirror (rear side mirror) 1 and OF be the angle of inclination of the output side mirror 2. The seed light 23 is assumed to be injected in the origin of the x-axis coordinates at an angle of inclination of zero.

The angle at which the light travels after reflection at each mirror 1, 2 is written as $$\theta_{NF}=2N\theta_F-2(N-1)\theta_R$$

$$\theta_{NR}=2N\theta_F-2N\theta_R$$

Here the suffixes "NF" and "NR" represent light rays after an N-th reflection at the output side mirror 2 and the input side mirror (rear side mirror) 1, respectively.

The coordinates for the point of reflection after N roundtrips are written as $$X_{NR}=2N^2\theta_F L-2N(N-1)\theta_R L$$

$$X_{NF}=2N(N+1)\theta_F L-2N^2\theta_R L$$

Here the suffixes "NF" and "NR" represent the points of N-th reflection at the output side mirror 2 and the input side mirror (rear side mirror) 1, respectively, and L stands for the length of the resonator in the amplification-stage laser.

Unless $X_{1R}>0$, the light will not be reflected at the input side mirror (rear side mirror) 1 after one roundtrip. It is therefore required to satisfy $$\theta_F>0$$

Upon N roundtrips, the condition for reflecting light at the input side mirror (rear side mirror) 1 becomes $$X_{NR}>0$$

Therefore, $$\theta_R<N/(N-1)\times\theta_F$$

From the foregoing, the conditions for reflecting light at the input side mirror (rear side mirror) 1 upon N roundtrips become $$\theta_F > 0, \text{ and}$$

$$\theta_R < N/(N-1) \times \theta_F$$

Now, to make more resonances in the effective amplification area as compared with ($\theta_F = \theta_R$), position variations in the input side mirror (rear side mirror) 1 or the output side mirror 2 must be reduced with the frequency of roundtrips in the resonator. Similar results are obtained with any mirror; reference is then made to the output side mirror 2.

The above condition becomes $$X_{N+2\,F} - X_{N+1\,F} < X_{N+1\,F} - X_{NF}$$

Therefore, $$\theta_F < \theta_R$$

From a combination of this with the conditions as provided above, the condition for reflecting light at the output side mirror 1 up to N roundtrips and reducing the position variations becomes $$0 < \theta_F < \theta_R < N/(N-1) \times \theta_F \quad (7)$$

That is, it is required in FIG. 40 that both the input side mirror (rear side mirror) 1 and the output side mirror 2 be inclined in the clockwise direction, and when the angle of inclination of the output side mirror 2 is $\theta_F$, the angle of inclination $\theta_R$ of the input side mirror (rear side mirror) 1 be somewhat lager than $\theta_F$. This is tantamount to the injection of the seed light 23 from the side where the distance between the mirrors 1 and 2 is longer and they are mutually open.

Typically, given N=5 and $\theta_F$=0.5 mrad, $$0.5 \text{ mrad} < \theta_R < 0.625 \text{ mrad}$$

so that the angle of aperture between the input side mirror (rear side mirror) 1 and the output side mirror 2 lies in the range of 0 to 0.125 mrad.

In the above discussions, absolute values are not attached to the inequality regarding position variations. However, it is more desirous to attach the absolute value to the inequality for comparison purposes. The reason could be that when there is no absolute value sign, any shifts of light in the negative direction of the x-axis are allowable.

In the state with the absolute value signs attached, from $|X_{N+2\,F} - X_{N+1\,F}| < |X_{N+1\,F} - X_{NF}|$, $$\theta_F < \theta_R < (2N+3)/(2N+2) \times \theta_F$$

is derived. From a combination with the condition of $\theta_F > 0$, the condition for reflecting light at the output side mirror 2 up to N roundtrips and reducing the absolute value of position variations becomes $$0 < \theta_F < \theta_R < (2N+3)/(2N+2) \times \theta_F \quad (8)$$

Typically, given N=5 and $\theta_F$=0.5 mrad, $$0.5 \text{ mrad} < \theta_R < 0.542 \text{ mrad}$$

That is, the angle of aperture between the input side mirror (rear side mirror) 1 and the output side mirror 2 falls in the range of 0 to 0.042 mrad.

In any event, it is found that both the input side mirror (rear side mirror) 1 and the output side mirror 2 must be inclined in the same direction with respect to the optical axis C of the seed light 23, the angle of inclination $\theta_R$ of the input side mirror (rear side mirror) 1 must be somewhat larger than the angle of inclination $\theta_F$ of the output side mirror 2, and the seed light 23 must be injected from the side on which the distance between the mirrors 1 and 2 is longer and the angle of aperture between them is larger. It is then preferable that the angle of aperture between both mirrors 1 and 2 is in the range of 0.01 mrad to 0.2 mrad. It is here noted that when the seed light 23 is injected from the output side mirror 2 side, $\theta_R$ and $\theta_F$ are interchangeable.

FIG. 31 is illustrative of an embodiment of the invention wherein, as in FIG. 16, both the input side mirror 1 and the output side mirror 2 are inclined in the same direction with respect to the optical axis C of the seed light 23, the angle of inclination of the input side mirror 1 is somewhat larger than the angle of inclination of the output side mirror 2, and the seed light 23 is injected from the side on which the distance between both the mirrors 1 and 2 is longer and the angle of aperture between them is larger. For the purpose of illustration, the seed light 23 makes a mere 1.5 roundtrips in the amplification-stage laser 60; in actual applications, however, there are set a lot more roundtrips. For the purpose of illustration, light is drawn as one single line; in actual applications, however, the light is a beam having a finite width and a finite divergence angle. Throughout the following drawings regarding the inclinations of the input side mirror (rear side mirror 111) 1 and the output side mirror 2, mirrors and the degree of inclination of optical axes are exaggerated for convenience of illustration.

As in FIG. 19, this is directed to an embodiment wherein the input side mirror 1 in the amplification-stage laser 60 is formed of one high-reflectivity (total-reflection), hole-free plane mirror. Typically, this input side mirror 1 is applied with a high-reflectivity coating on the entire surface of its side near to the chamber 3 in the amplification-stage laser 60. The input side mirror 1 is also typically provided on its entire back surface with a reflectivity-free coating (anti-reflection coating) and/or a suitable wedge angle for the purpose of preventing interferences between the two surfaces. The output side mirror 2 is typically provided on the entire surface of its side near to the chamber 3 in the amplification-stage laser 60 with a partial reflecting mirror coating (having a reflectivity of typically 10% to 50%) in such a way as to have an optimum reflectivity in the laser system. The output side mirror 2 is also typically provided on its entire back surface with a reflectivity-free coating (antireflection coating) and/or a suitable wedge angle for the purpose of preventing interferences between the two surfaces.

The input side mirror 1 is located such that it is decentered in the horizontal direction (within the plane of the top view (a) paper) with respect to the seed light 23 from the oscillation-stage laser 50, and its high-reflectivity side plane is not parallel with the partial reflectivity side plane of the output side mirror 2. More specifically in view of the top view (a), that plane is located in such a way as to have a proper inclination and the edge of the input side mirror 1 is positioned within or near the discharge area 22 defined by the discharge electrodes 4 and 5 in the amplification-stage laser 60. In view of the high-reflectivity side plane of the input side mirror 1 and the partial reflectivity side plane of the output side mirror 2, the direction of that inclination is such that at the edge portion of the input side mirror 1 in which the seed light 23 is to be introduced, the distance between the two mirrors is longer than that between the opposite mirrors. Then, to satisfy inequality (7) or (8) as described above, the angle of inclination of the input side mirror 1 with respect to the optical axis C of the seed light 23 is somewhat larger than that of the output side mirror 2 on the same side.

With this arrangement, it is possible to prevent pits from occurring in the profile of the laser light produced out of the amplification-stage laser 60 (spots of weak light intensity in the center beam portion).

The value of the "proper inclination β" used herein has previously been specified. More specifically in a laser system having fixed other factors such as gas pressure, applied voltage, and energy of the seed light 23, that value is set such that the laser system output lies in the range G that does not fall short of the output S of the laser system wherein the high-reflectivity side plane of the input side mirror 1 is parallel with the partial reflectivity side plane of the output side mirror 2 (FIG. 20).

Figure 42A:
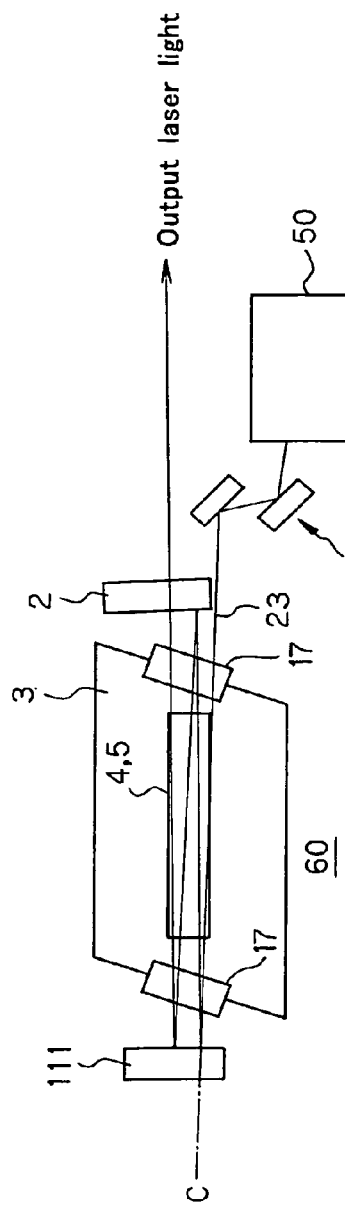
FIG. 42 is illustrative of another embodiment wherein seed light is entered as is the case with the two-stage laser system for aligners of FIG. 25 according to the invention.
Figure 42B:
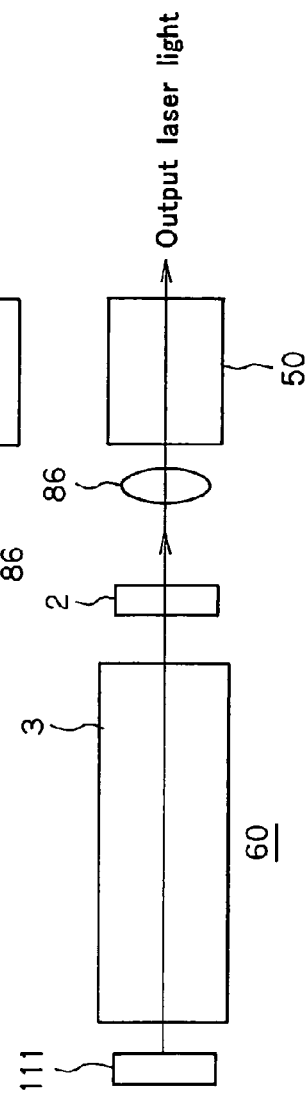
Figure 42C:
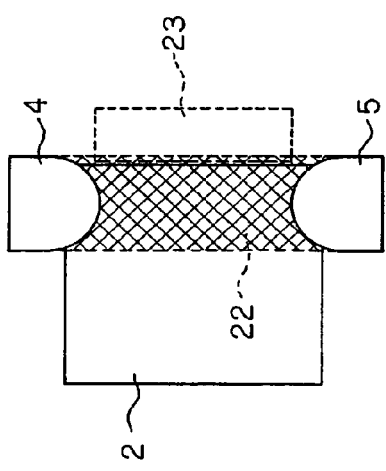

FIG. 42 is illustrative of one exemplary arrangement wherein the resonator in the amplification-stage laser 60 is made up of two non-parallel mirrors, and the seed light 23 from the oscillation-stage laser 50 is entered from the output side mirror 2, as in FIG. 25. FIGS. 42(*a*) and 42(*b*) are a top view and a side view of that arrangement, respectively, and FIG. 42(*c*) is illustrative of the output side mirror 2 in the amplification-stage laser 60, as viewed from the chamber 3 side. In this arrangement, the seed light 23 is introduced from outside the edge of the output side mirror 2 along it. In this case, the seed light 23 is entered from the output side mirror 2, and so the opposite mirror is called the rear side mirror 111. Typically, the rear side mirror 111 is applied with a high-reflectivity coating all over the surface of the side near the chamber 3 in the amplification-stage laser 60. The entire back surface of the rear side mirror 111 is typically applied with a reflectivity-free coating (anti-reflection coating) and/or a suitable wedge angle for the purpose of preventing interferences between the two surfaces. The output side mirror 2 is typically provided on the entire surface of its side near the chamber 3 in the amplification-stage laser 60 with a partial reflecting mirror coating (having a reflectivity of typically 10% to 50%) in such a way as to have an optimum reflectivity in the laser system. The output side mirror 2 is typically provided on its entire back surface with a reflectivity-free coating (antireflection coating) and/or a suitable wedge angle for the purpose of preventing interferences between the two surfaces.

In this case, the output side mirror 2 is located such that it is decentered in the horizontal direction (within the plane of the top view (a) paper) with respect to the seed light 23 from the oscillation-stage laser 50, and its partial reflectivity side plane is not parallel with the high-reflectivity side plane of the rear side mirror 111. More specifically in view of the top view (a), that plane is located in such a way as to have a proper inclination and the edge of the output side mirror 2 is positioned within or near the discharge area 22 defined by the discharge electrodes 4 and 5 in the amplification-stage laser 60. In view of the partial reflectivity side plane of the output side mirror 2 and the high-reflectivity side plane of the rear side mirror 111, the direction of that inclination is such that at the edge portion of the output side mirror 2 into which the seed light 23 is to be introduced, the distance between the two mirrors is longer than that between the opposite mirrors. In this case, the angle of inclination of the output side mirror 2 with respect to the optical axis C of the seed light 23 is somewhat larger than that of the rear side mirror 111 on the same side (contrary to FIG. 40).

Figure 41:
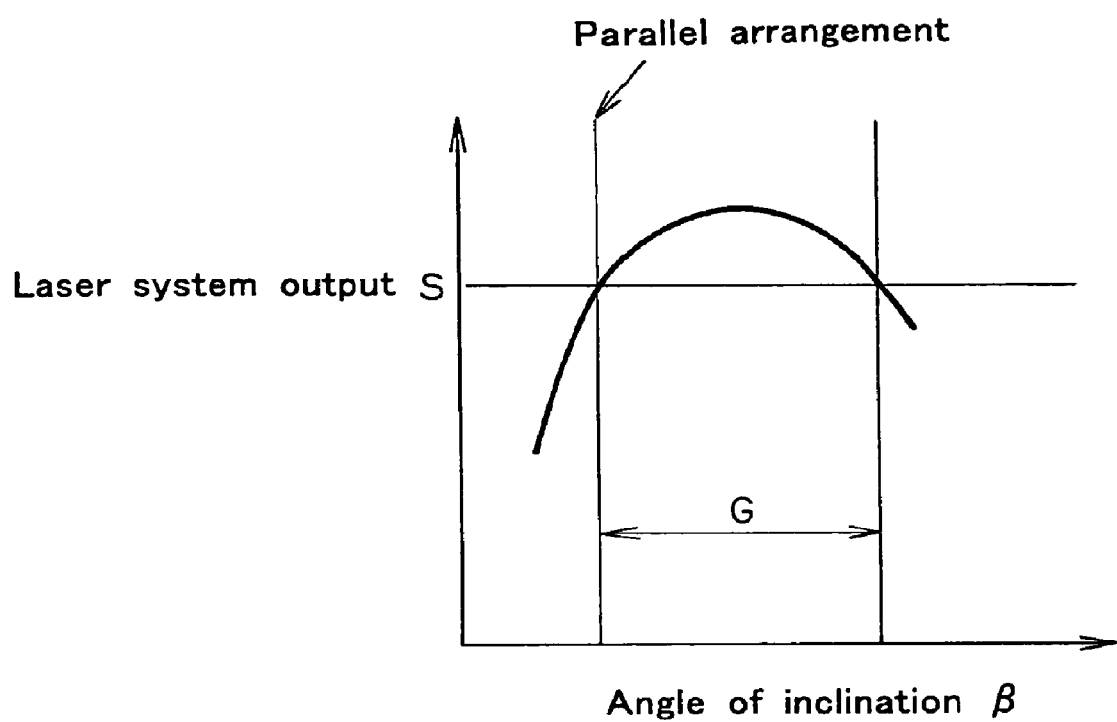
FIG. 41 is illustrative in schematic of the range for obtaining a proper inclination.

The value of the "proper inclination β" used herein, too, has previously been specified. More specifically, as shown in FIG. 41, that value is set such that the laser system output lies in the range G that does not fall short of the output S of the laser system wherein the high-reflectivity side plane of the rear side mirror 111 is parallel with the partial reflectivity side plane of the output side mirror 2 (FIG. 20). In view of the partial reflectivity side plane of the output side mirror 2 and the high-reflectivity side plane of the rear side mirror 111, the direction of that inclination is such that at the edge portion of the output side mirror 2 into which the seed light 23 is to be introduced, the distance between the two mirrors is longer than that between the opposite mirrors.

One advantage of this arrangement is that smaller seed light can be used as the seed light 23, because upon injection in the amplification-stage laser 60, it is the rear side mirror 111 of high reflectivity that it strikes at first. As shown in FIG. 42(*c*), however, a problem with the arrangement is that the output side mirror 2 is decentered for the entrance of the seed light 23, and so the beam is of somewhat limited size. In FIG. 42, the seed light 23 is shown to make only two roundtrips in the amplification-stage laser 60 for the purpose of illustration; in actual applications, however, there are set a lot more roundtrips. Likewise for the purpose of illustration, the light is drawn as one single line; however, it is a beam having a finite width and a finite divergence angle.

Figures 43A, 43B:
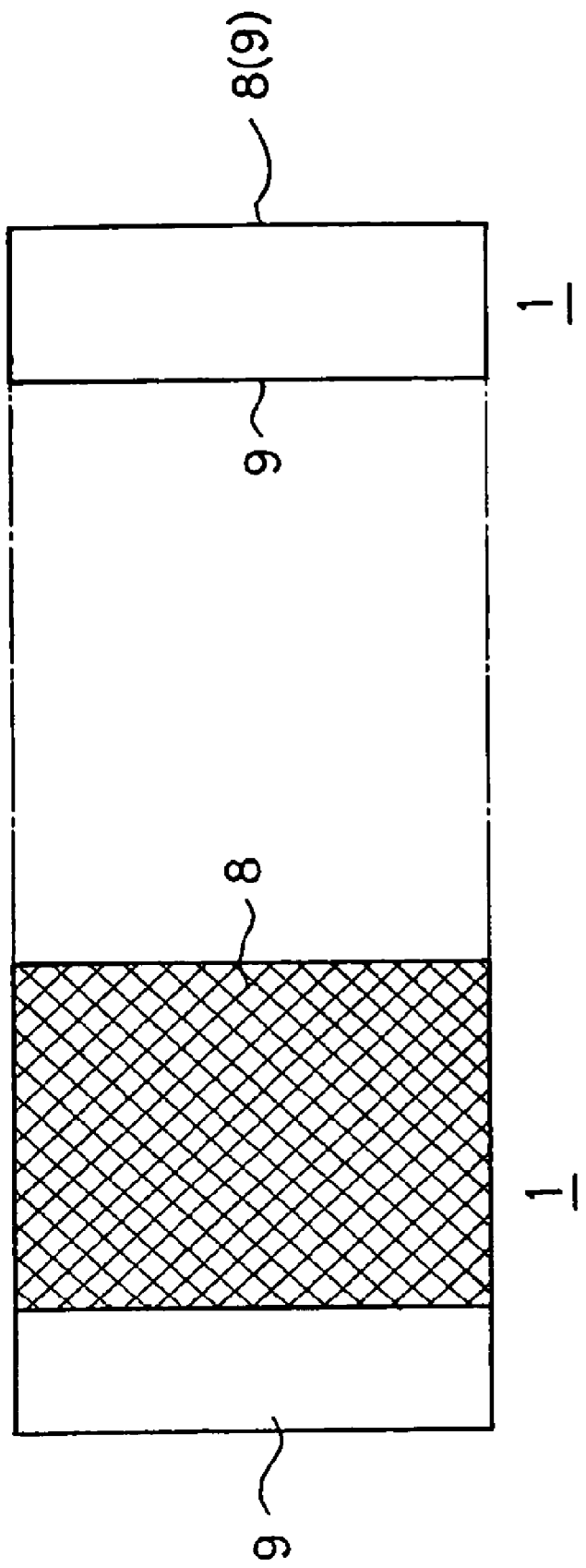
FIG. 43 is illustrative of a modification to the input side mirror usable in the embodiment of FIG. 31.

In the embodiment of FIG. 31, the input side mirror 1 is made up of one high-reflectivity (total-reflection), hole-free plane mirror. As shown in FIG. 43(*a*) as viewed from the chamber 3 side and in the sectional view of FIG. 43(*b*), however, the input side mirror 1 could be achieved by applying the antireflection coating 9 to a seed light-incident area of the output side of a $CaF_2$ or other plane substrate transparent to ultraviolet light and the high-reflectivity (total-reflection) mirror coating 8 to the rest. That is, with the input side mirror 1 used in FIG. 31, there is difficulty in the application of coating as far as the mirror end faces for the purpose of holding the mirror during vapor deposition. In addition, it is not easy to process the ends of the $CaF_2$ or other substrate into right-angle faces with high precision; usually, there is a chip off the ends during fabrication. Without chip-free application of the high-reflectivity (total-reflection) coating 8 as far as the ends, the substrate ends having a decreased reflectivity will cause losses leading to an oscillation efficiency drop. If such an input side mirror 1 as shown in FIG. 43 is used, it will be easy to process the ends of the high-reflectivity (total-reflection) coating 8; it will be possible to apply the high-reflectivity coating 8 as far as the boundary between the seed light 23 and the amplified laser light in the amplification-stage laser 60. Alternatively, the antireflection coating 9 could be dispensed with; there could be no coating at all. FIG. 44 is illustrative of an embodiment corresponding to FIG. 31, wherein this input side mirror 1 is used.

Figures 45A, 45B:
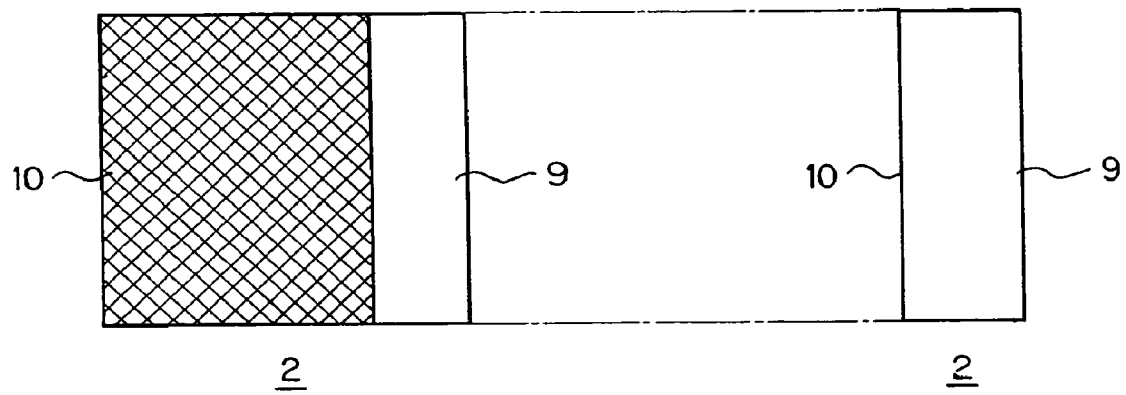
FIG. 45 is illustrative of a modification to the output side mirror usable in the embodiment of FIG. 42.
Figures 46A, 46B, 46C:
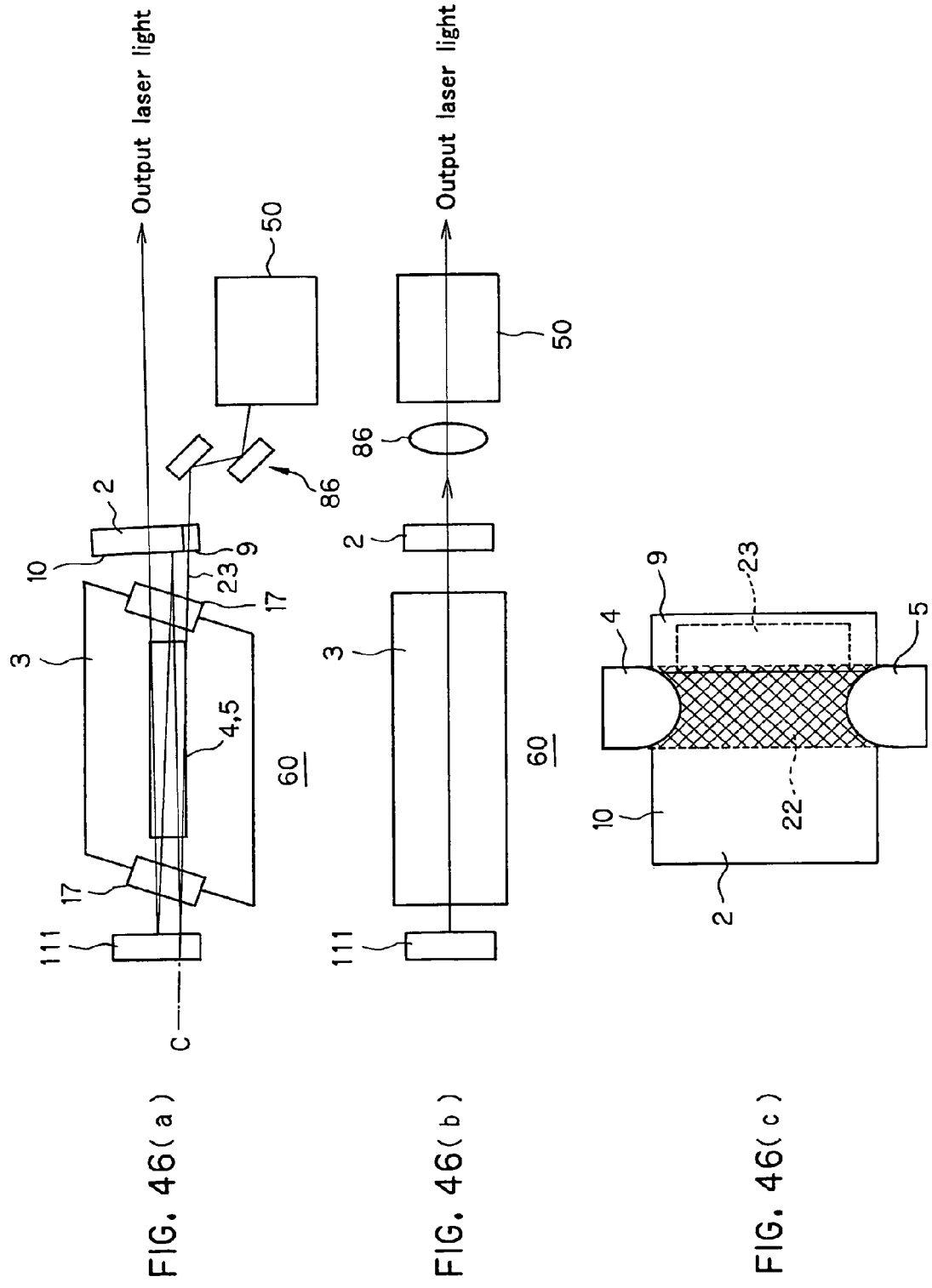
FIG. 46 is illustrative of the arrangement corresponding to FIG. 42 but with the use of the output side mirror of FIG. 46.

In the embodiment of FIG. 42, the output side mirror 2 is made up of one partial reflectivity, hole-free plane mirror. As shown in FIG. 45(*a*) as viewed from the chamber 3 side and in the sectional view of FIG. 44(*b*), however, the output side mirror 2 could be achieved by applying the antireflection coating 9 to a seed light-incident area of the chamber 3 side of a $CaF_2$ or other plane substrate transparent to ultraviolet light and the partial reflecting mirror coating 10 to the rest for similar reasons. FIG. 46 is illustrative of an embodiment corresponding to FIG. 42, wherein this output mirror 2 is used.

While, in the above embodiments, the input side mirror 1, the rear side mirror 111 and the output side mirror 2 are all in rectangular form, it is to be understood that they could have any desired shape without deviating from the purport of the invention.

Further, when the resonator in the amplification-stage laser 60 is built up of two nonparallel mirrors, the input side mirror 1 could be located while decentered in the vertical direction with respect to the seed light 23, as in FIG. 21. As long as at the edge portion of the input side mirror 1 in which the seed light 23 is to be introduced, the distance between the two mirror portions is longer than that between the opposite mirror portions, the mirrors 1 and 2 could have any desired inclination sections. FIG. 47 is illustrative of an embodiment wherein the resonator in the amplification-stage laser 60 is built up of two nonparallel mirrors, as in FIG. 21, and FIG. 47(b) is a side view of that embodiment wherein the input side mirror 1 and the output side mirror 2 are inclined with respect to the optical axis C of the seed light 23. In this case, there is shading upon injection of the seed light 23, and so the laser system efficiency becomes somewhat lower than could be achieved with the above embodiments described with reference to the top views.

In this case, too, it is to be understood that the mirrors 1 and 2 are set at such an angle of inclination that the laser system output lies in the range G that does not fall short of the output S of the laser system wherein the high-reflectivity side plane of the input side mirror 1 is parallel with the partial reflectivity side plane of the output side mirror 2 (FIG. 20). Alternatively, the injection area could be ensured by coating rather than at the edges of the mirrors 1 and 2 (see FIGS. 43-46).

Throughout all the two-stage laser systems for aligners of the invention described above, the seed light 23 emitted out of the oscillation-stage laser 50 is introduced in the resonator in the amplification-stage laser 60 from the side of the input side mirror 1 or the output side mirror 2 that form that resonator. It is understood, however, that the seed light 23 could be introduced in the direction of the laser oscillation optical axis of the amplification-stage laser 60 from any desired position between the resonator mirrors 1 and 2. In such a case, the mirror that opposes the output side mirror 2 will in no sense be any input side mirror. Therefore, that mirror will hereinafter be called the rear side mirror 111.

In what follows, embodiments will be explained under the three following categories: introduction of the seed light 23 from between the rear side mirror 111 and the chamber 3 (the rear part of the resonator), introduction of the seed light 23 from between the output side mirror 2 and the chamber 3, and direct introduction of the seed light 23 in the chamber 3. The embodiments will be explained primarily with reference to the structure of the amplification-stage laser 60, and with reference to top views unless otherwise stated. Discharge electrodes 4 and 5 (cathode and anode), not shown, are located in the vertical direction to the paper, and laser discharge occurs vertically to the paper. In these embodiments, there is a higher degree of flexibility in the introduction of the seed light 23 in the direction vertical to the (cathode-to-anode) discharge direction than in that discharge direction, and so the seed light 23 is introduced in the direction vertical to the discharge direction. Notice here that the direction of introduction of the seed light 23 is not necessarily limited to that vertical direction.

FIG. 48 is a top view illustrative of one embodiment wherein the seed light 23 is injected from the side of the amplification-stage laser 60 that is opposite to its laser exit side. The seed light 23 emitted out of the oscillation-stage laser 50 is injected in the amplification-stage laser 60 via one or more total-reflection mirrors 121. In FIG. 48, the seed light 23 passes through the second total-reflection mirror 121 and transmits through a window member 17 opposite to the laser exit side for injection in the chamber 3. The injected seed light 23 passes the side of the discharge area (gain area) 22 between the discharge electrodes 4 and 5 (the underside of the paper) or through the discharge area 22 and then through the window member 17 on the output side mirror 2 side, arriving at the output side mirror 2. Generally, the output side mirror 2 is applied with a partial reflecting mirror coating 10 at one side and an antireflection coating 10 on the other or opposite side. Although whether the partial reflecting mirror coating 10 of the output side mirror 2 directs toward the chamber 3 side or in the laser output direction is not any essential requirement, that mirror coating 10 is applied on the chamber 3 side in FIG. 48. Throughout the following embodiments, the partial reflecting mirror coating 10 and the antireflection coating 9 of the output side mirror 2 are shown in FIG. 48 alone.

The output side mirror 2 could be formed of an optical substrate with neither the partial reflecting mirror coating 10 nor the antireflection coating 9. With laser light of, for instance, 193 nm wavelength, the surface reflection of the optical substrate is about 4%; if the substrate can make use of front- and back-surface reflection, it is then possible to achieve a 193 nm wavelength output mirror having a reflectivity of about 8% without recourse to any coating.

The seed light 23 reflected at the partial reflecting mirror coating 10 of the output side mirror 2 is directed toward the rear side mirror (total-reflection) mirror 111 positioned in the rear of the laser resonator. Then, the seed light 23 is subjected to multiple reflections between the output side mirror 2 and the rear side mirror 111 that form the resonator, filling the discharge area 22.

As discharge occurs in the discharge area 22 in the amplification-stage laser 60 during or after the discharge area 22 is filled with the seed light 23, it allows the amplification-stage laser 60 to oscillate high-output, narrow-banded laser light having a line width inherited from the seed light 23 from the oscillation-stage laser 50.

Figure 49:
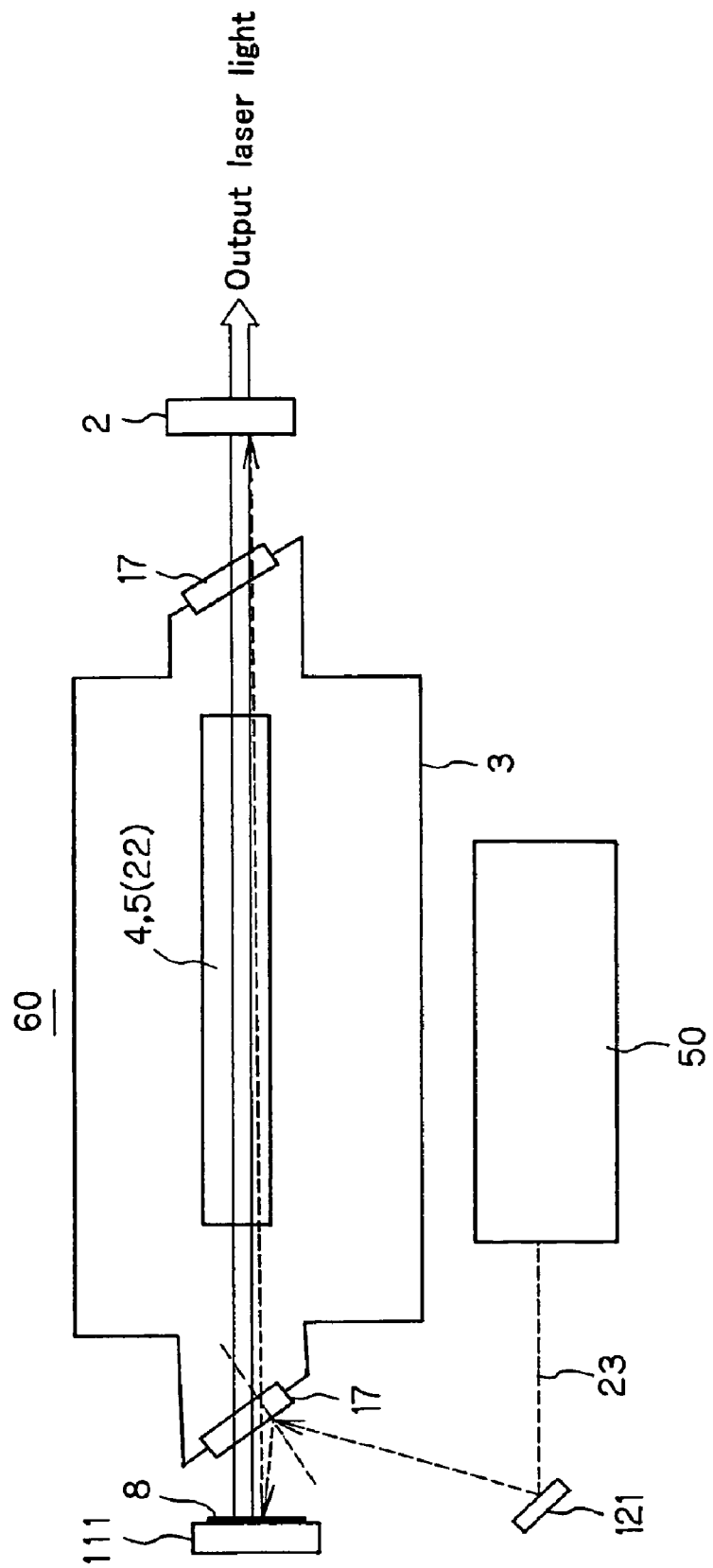
FIG. 49 is a top view illustrative of another embodiment wherein seed light is injected in the resonator in the amplification-stage laser from its side opposite to the laser exit side.

FIG. 49 is a top view illustrative of one embodiment wherein the seed light 23 is injected in the amplification-stage laser 60 using surface reflection at a window member 17 that opposes the laser exit side not located at the Brewster angle. The seed light 23 from the line narrowing oscillation-stage laser 50 is directed to the window member 17 on the rear side of the resonator via one or more total-reflection mirrors 121. The directed seed light 23 is guided by surface reflection at the window member 17 to the rear side mirror 111. The seed light 23 is guided to the output side mirror 2 upon reflection at the rear side mirror 111. Finally, the light 23 is subjected to multiple reflections between the output side mirror 2 and the rear side mirror 111 that form together the resonator.

Figure 50:
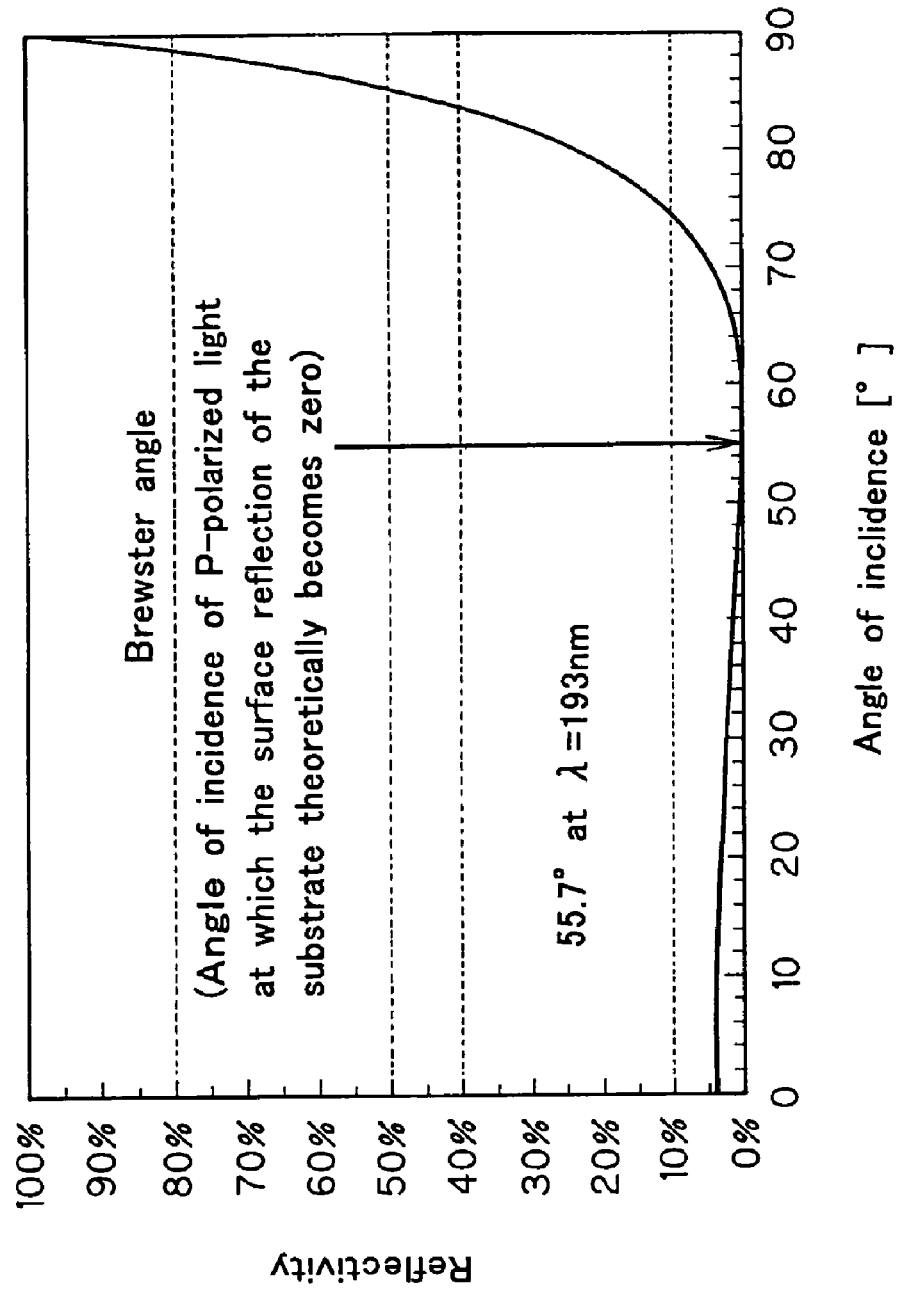
FIG. 50 is indicative of the reflection characteristics of $CaF_2$ to P-polarized light.

Usually, the $CaF_2$ is used for the window member 17. In most cases, the seed light 23 is P-polarized light. FIG. 50 shows the reflection capability of $CaF_2$ to P-polarized light. Here, the angle of incidence of the seed light 23 on the window member 17 should preferably be substantially equal to the angle of inclination with which the window member 17 is located (within ±5°). In other words, this injection mode works for the window member that is not located with the Brewster angle.

Figures 51A, 51B:
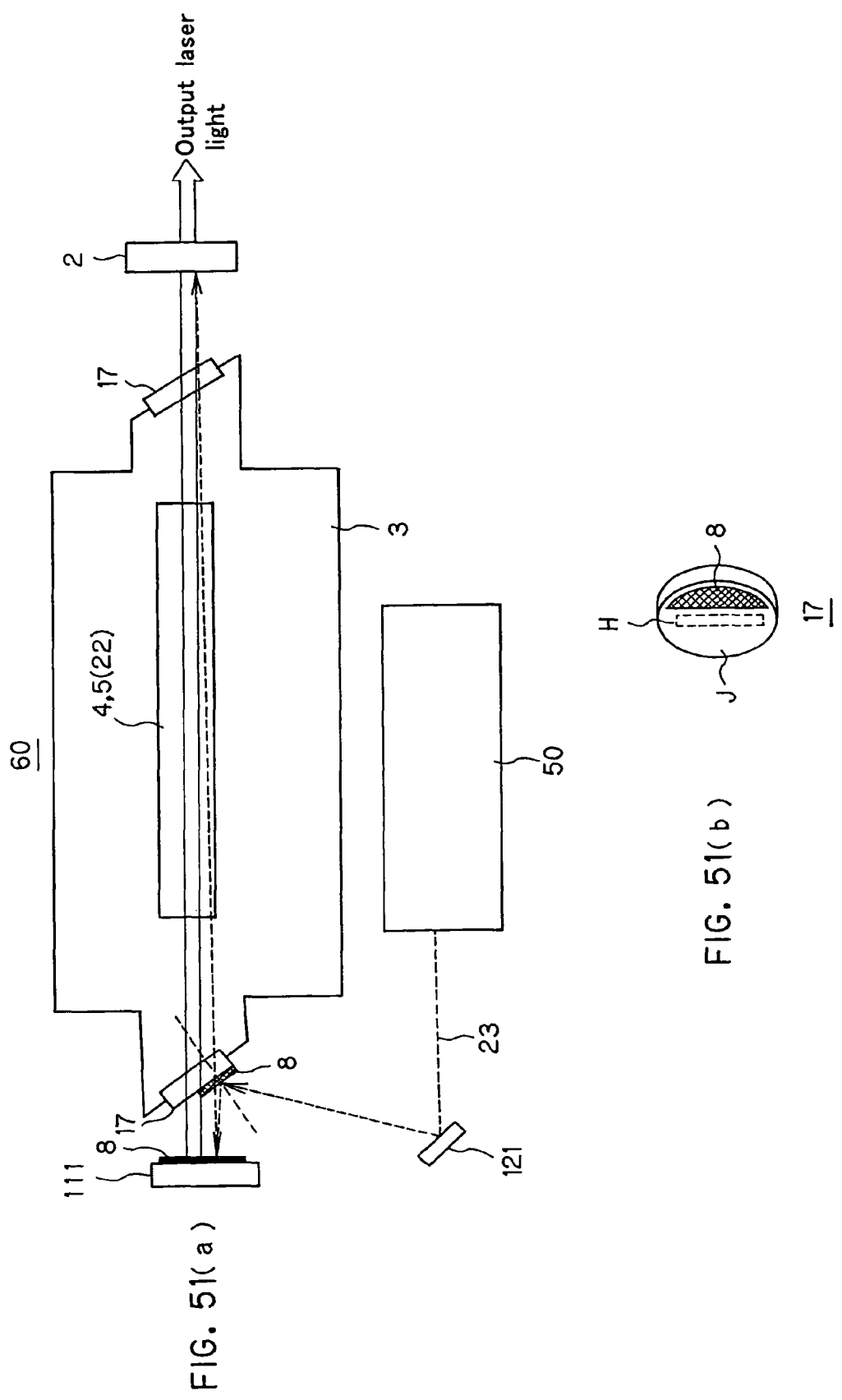
FIG. 51 is a top view illustrative of yet another embodiment wherein seed light is injected in the resonator in the amplification-stage laser from its side opposite to the laser exit side, and shows the construction of the window member in that case.

FIG. 51(a) is a top view of an embodiment wherein the seed light 23 is injected in the amplification-stage laser 60 while a high-reflectivity (total-reflection) coating 8 is applied to a part of the window member 17 that opposes the laser exit side. When the window member 17 is located in the chamber 3 with the Brewster angle or so, sufficient reflection of the seed light 23 will not be expected, as shown in FIG. 50. In this case, a high-reflectivity (total-reflection) coating 8 is applied to a site—capable of reflecting the seed light 23—of the part of the window member 17 that opposes the laser exit side, as shown in FIG. 51(b). The rest area J is or is not be applied with an antireflection coating. Alternatively, only a site H through which the amplification-stage laser light passes is or is not applied with an antireflection coating, and other site is applied with a high-reflectivity (total-reflection) coating 8 in association with the injection of the seed light 23.

In this embodiment, the seed light 23 is reflected at the portion of the high-reflectivity (total-reflection) coating 8 on the window member 17, and guided to the rear side mirror 111. Then, the seed light 23 is reflected at the rear side mirror 111 and guided to the output side mirror 2. Finally, the light is subjected to multiple reflections between the output side mirror 2 and the rear side mirror 111.

FIG. 52(*a*) is a top view of an embodiment wherein the seed light 23 is injected in the amplification-stage laser 60 from the rear portion of the resonator in the amplification-stage laser 60, in which resonator there is located a beam expander prism system (beam expander system) 61. In this embodiment, the beam expander prism systems 61 and 61 are located between one window member 17 and the rear side mirror 111 and between another window member 17 and the output side mirror 2, respectively, for the purpose of expanding the laser light incident on the rear side mirror 111 and the laser light incident on the output side mirror 2 in the amplification-stage laser 60. Each beam expander prism system 61 is here composed of two triangular prisms 62 and 63. A beam incident on one surface of the triangular prism 62 at right angles is incident from within on another surface at a relatively large angle of incidence, which it leaves in a one-dimensional direction with an expanded beam diameter. The beam with an expanded beam diameter is incident on one surface of another triangular prism 63 at right angles and then incident from within on another surface with a relatively large angle of incidence, which it leaves in a one-dimensional direction with an expanded beam diameter.

In this embodiment, the seed light 23 is directed by one or more total-reflection mirrors 121 to the beam expander prism system 61. The prism 61 to which the seed light 23 is to be directed is applied with or without an antireflection coating on a transmitting area K of the surface 64 on which laser light resonating in the resonator is to be incident, as shown in FIG. 52(*b*). The seed light 23 is incident on that transmitting area K. The rest of the surface 64 of the prism 62 is applied with a high-reflectivity (total-reflection) coating 8. Specifically but not exclusively in the embodiment of FIG. 52(*b*), the high-reflectivity (total-reflection) coating 8 is applied to the vertex side of the prism 62. Upon reflection at the high-reflectivity (total-reflection) coating 8 on the prism 62, the seed light 23 passes through the amplification-stage laser 60 and is guided to the output side mirror 2. Finally, the light is subjected to multiple reflections between the output side mirror 2 and the rear side mirror 111 that form together the resonator.

Specifically but not exclusively in the embodiment of FIG. 52(*a*), the seed light 23 is guided from the prism 62 closer to the chamber 3 into the chamber 3. When the beam expander prism system 61 is composed of two or more prisms, the seed light 23 could be guided from any surface of any prism into the amplification-stage laser 60.

Figure 53:
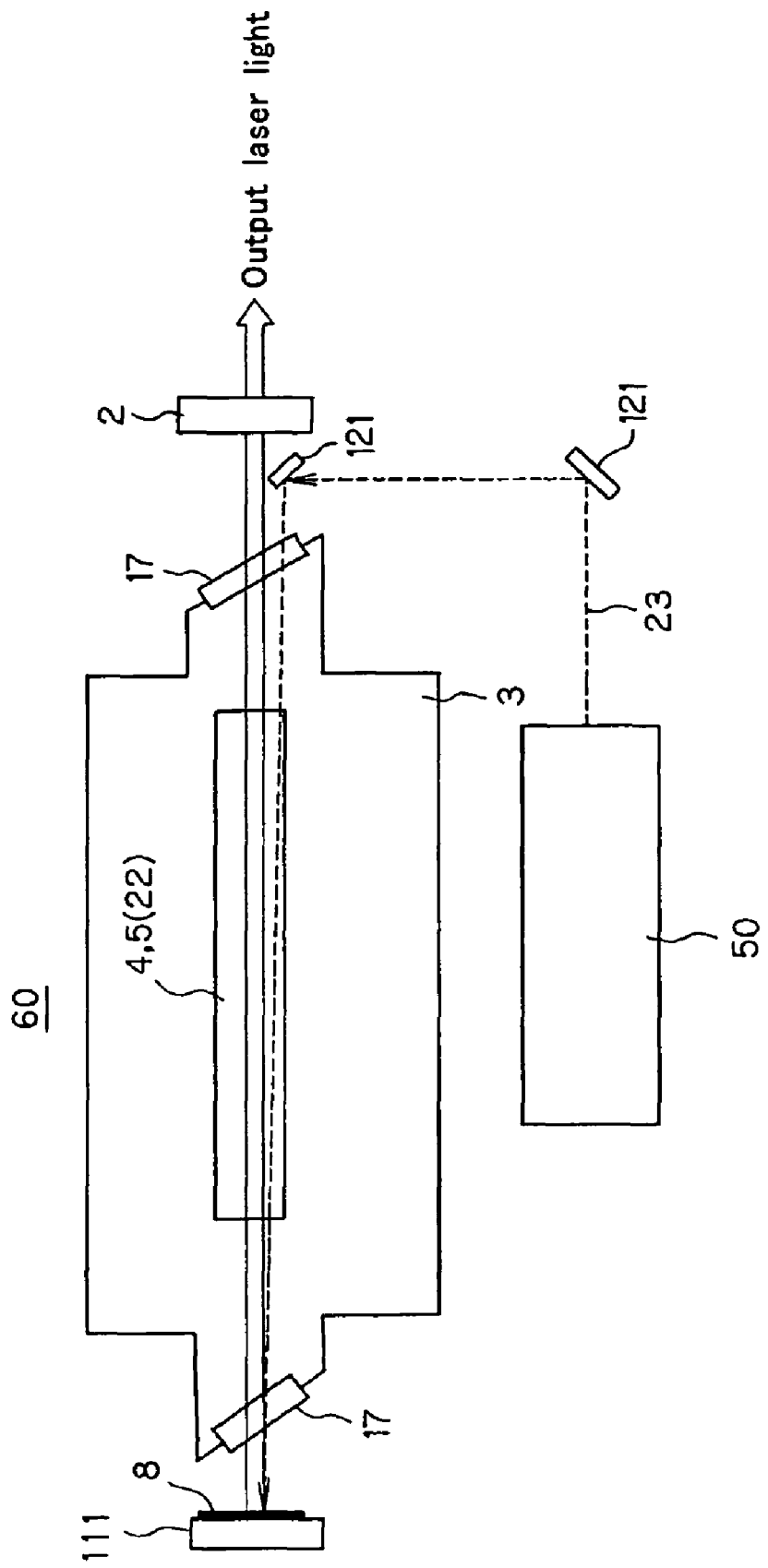
FIG. 53 is a top view illustrative of an embodiment corresponding to FIG. 48 but with the injection of seed light from between the output side mirror and the chamber in the amplification-stage laser.

FIG. 53 is a top view of an embodiment corresponding to FIG. 48. In this embodiment, the seed light 23 is injected into the laser chamber 3 from between the output side mirror 2 and the laser chamber 3 in the amplification-stage laser 60. The seed light 23 is injected in the amplification-stage laser 60 via one or more total-reflection mirrors 121. In FIG. 53, the seed light 23 passes through the second total-reflection mirror 121 between the output side mirror 2 and the laser chamber 3 and transmits through a window member 17 for injection in the chamber 3. The injected seed light 23 passes the side of the discharge area (gain area) 22 (the underside of the paper) or through the discharge area 22 and then through the window member 17 on the rear side mirror 111 side, arriving at the rear side mirror 111 that is a total-reflection mirror located on the side opposing the output side mirror with the resonator chamber 3 in the amplification-stage laser 60 sandwiched between them. Then, the seed light 23 is reflected toward the output side mirror 2, and further reflected at a partial reflecting mirror coating 10 (FIG. 48) on the output side mirror 2. Thus, the seed light 23 is subjected to multiple reflections between the output side mirror 2 and the rear side mirror 11. Finally, the discharge area 22 is filled with the seed light 23. Generally, the output side mirror 2 is applied with the partial reflecting mirror coating 10 on one side and an antireflection coating 10 on the other or opposite side. Although whether the partial reflecting mirror coating 10 on the output side mirror 2 directs toward the chamber 3 side or in the laser output direction is not any essential requirement (See the explanation of FIG. 48).

As discharge occurs in the discharge area 22 in the amplification-stage laser 60 during or after the discharge area 22 is filled with the seed light 23, it allows the amplification-stage laser 60 to oscillate high-output, narrow-banded laser light having a line width inherited from the seed light 23 from the oscillation-stage laser 50.

Figure 54:
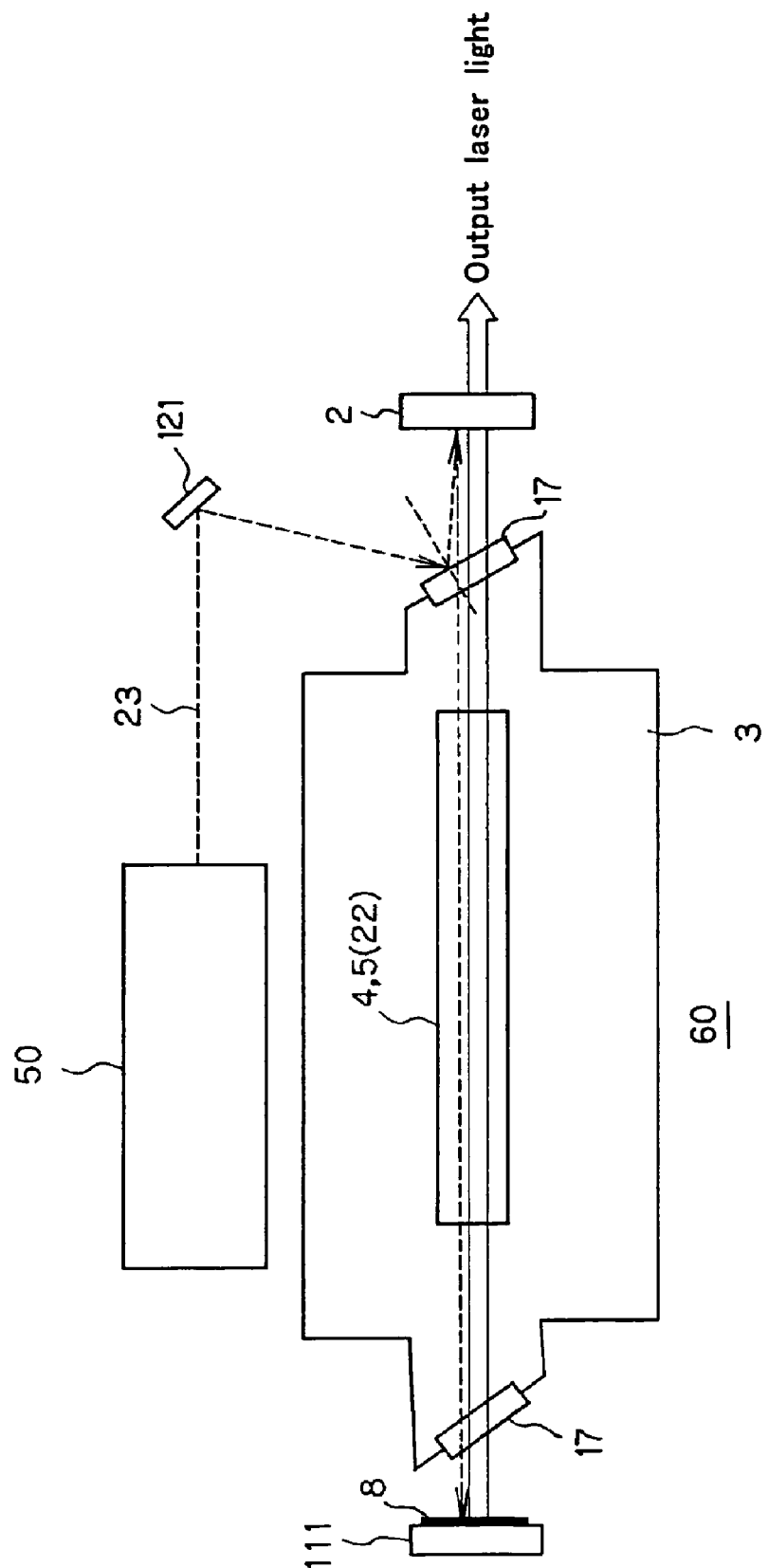
FIG. 54 is a top view illustrative of an embodiment corresponding to FIG. 49 but with the injection of seed light from between the output side mirror and the chamber in the amplification-stage laser.

FIG. 54 is a top view of an embodiment corresponding to FIG. 49. In this embodiment, the seed light 23 from the oscillation-stage laser 50 is directed to a window member 17 on the output side mirror 2 side via one or more total-reflection mirrors 121. The directed seed light 23 is guided by surface reflection at the window member 17 to the output side mirror 2. The seed light 23 is guided to the rear side mirror 111 upon reflection at the partial reflecting mirror coating 10 (FIG. 48) on the output side mirror 2. Thus, the seed light 23 is subjected to multiple reflections between the output side mirror 2 and the rear side mirror 111 that form together the resonator.

In this case, too, the $CaF_2$ is usually used for the window member 17. In most cases, the seed light 23 is P-polarized light. FIG. 50 shows the reflection capability of $CaF_2$ to P-polarized light. Here, the angle of incidence of the seed light 23 on the window member 17 should preferably be substantially equal to the angle of inclination with which the window member 17 is located (within ±5°). In other words, this injection mode works for the window member that is not located with the Brewster angle.

FIG. 55 is a top view of an embodiment corresponding to FIG. 51. In this embodiment, the seed light 23 is injected in the amplification-stage laser 60 while a high-reflectivity (total-reflection) coating 8 is applied to a part of the window member 17 on the laser exit side. When the window member 17 is located in the chamber 3 with the Brewster angle or so, sufficient reflection of the seed light 23 will not be expected, as shown in FIG. 50. In this case, the high-reflectivity (total-reflection) coating 8 is applied to a site—capable of reflecting the seed light 23—of the part of the window member 17 on the laser exit side, as shown in FIG. 55(*b*). The rest area J is or is not be applied with an antireflection coating. Alternatively, only a site H through which the amplification-stage laser light passes is or is not applied with an antireflection coating, and other site is applied with the high-reflectivity (total-reflection) coating 8 in association with the injection of the seed light 23.

In this embodiment, the seed light 23 is reflected at the portion of the high-reflectivity (total-reflection) coating 8 on the window member 17, and guided to the output side mirror 2. Then, the seed light 23 is reflected at the output side mirror 2 and guided to the rear side mirror 111. Thus, the light is subjected to multiple reflections between the output side mirror 2 and the rear side mirror 111.

Figure 56:
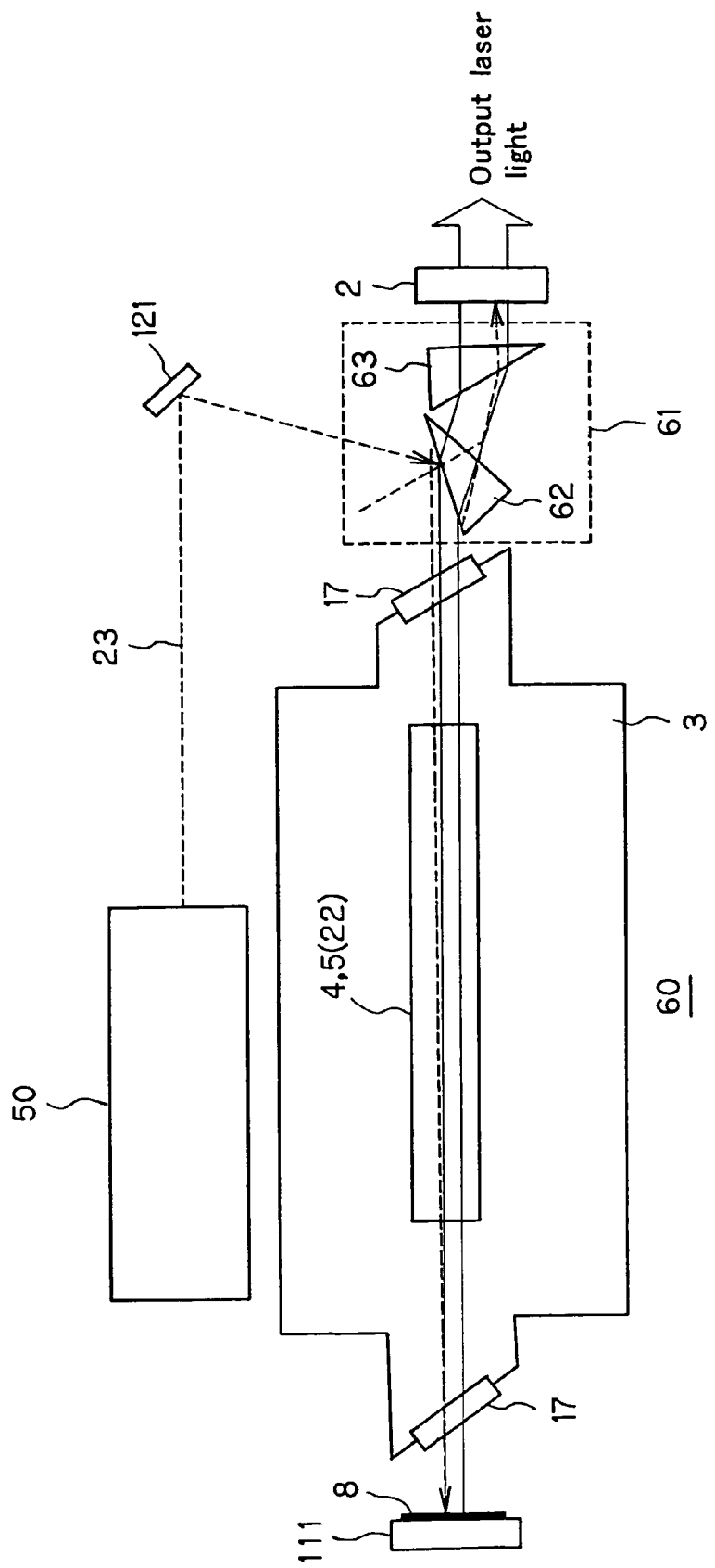
FIG. 56 is a top view illustrative of an embodiment corresponding to FIG. 52 but with the injection of seed light from between the output side mirror and the chamber in the amplification-stage laser.

FIG. 56 is a top view corresponding to FIG. 52. In this example, however, a beam expander prism system 61 is located between the window member 17 and the output side mirror 2 only for the purpose of expanding the beam of laser light incident on the output side mirror 2 in the amplification-stage laser 60, and there is no such a bean expander prism system on the rear side mirror 111. The beam expander prism system 61 is here composed of two triangular prisms 62 and 63. A beam incident on one surface of the triangular prism 62 at right angles is incident from within on another surface at a relatively large angle of incidence, which it leaves in a one-dimensional direction with an expanded beam diameter. The beam with an expanded beam diameter is incident on one surface of another triangular prism 63 at right angles and then incident from within on another surface with a relatively large angle of incidence, which it leaves in a one-dimensional direction with an expanded beam diameter.

The prism 62 to which the seed light 23 from the oscillation-stage laser 50 is to be directed has such configure as shown in FIG. 52(b). The seed light 23 is reflected at the high-reflectivity (total-reflection) coating 8 on the prism 62 is guided to the rear side mirror 111 through the amplification-stage laser 60. Thus, the seed light 23 is subjected to multiple reflections between the output side mirror 2 and the rear side mirror 111.

Specifically but not exclusively in the embodiment of FIG. 56, the seed light 23 is guided from the prism 62 closer to the chamber 3 into the chamber 3. When the beam expander prism system 61 is composed of two or more prisms, the seed light 23 could be guided from any surface of any prism into the amplification-stage laser 60.

An embodiment of directing the seed light 23 directly in the chamber 3 in the amplification-stage laser 60 is now explained.

Figure 57:
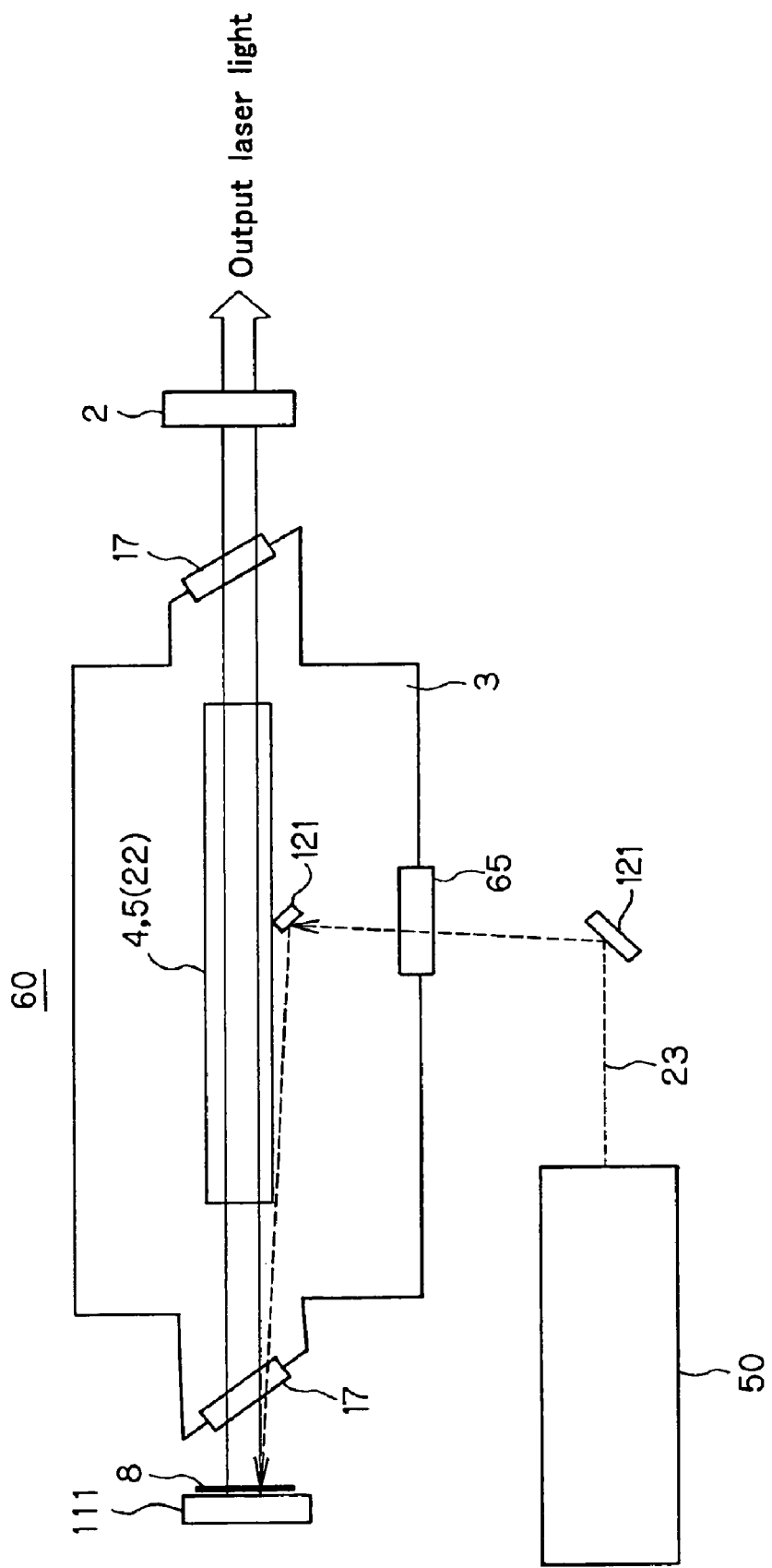
FIG. 57 is a top view illustrative of one embodiment wherein seed light is guided directly in the laser chamber in the amplification-stage laser.

FIG. 57 is a top view of an embodiment wherein the seed light 23 is injected in the discharge area 22 through a seed light-injecting window 65 attached to the side of the chamber 3 in the amplification-stage laser 60. Anti-reflection coatings could be applied on both surfaces of the seed light-injecting window 65, although this is not always necessary. The seed light 23 is injected in the amplification-stage laser 60 by one or more total-reflection mirrors 121. In FIG. 57, the seed light 23 is injected into the discharge area 22 in the chamber 3 in the amplification-stage laser 60 via the second total-reflection mirror 121 in the chamber 3. The injected seed light 23 passes through the side of the discharge area 22 (the underside of the paper) or the discharge area 22 and then transmits through the window member 17 on the rear side mirror 111 side, arriving at the rear side mirror 111. The seed light 23 reflected at the rear side mirror 111 goes toward the output side mirror 2 located in front of the laser resonator. Thus, the seed light 23 is subjected to multiple reflections between the partial reflecting mirror coating 10 (FIG. 48) on the output side mirror 2 and the rear side mirror 111, which form together resonator. Finally, the discharge area 22 is filled with the seed light 23.

As discharge occurs in the discharge area 22 in the amplification-stage laser 60 during or after the discharge area 22 is filled with the seed light 23, it allows the amplification-stage laser 60 to oscillate high-output, narrow-banded laser light having a line width inherited from the seed light 23 from the oscillation-stage laser 50.

Specifically but not exclusively in the embodiment of FIG. 57, the seed light 23 is injected toward the rear side mirror 111. For instance, the seed light 23 could be injected toward the output side mirror 2.

Figure 58:
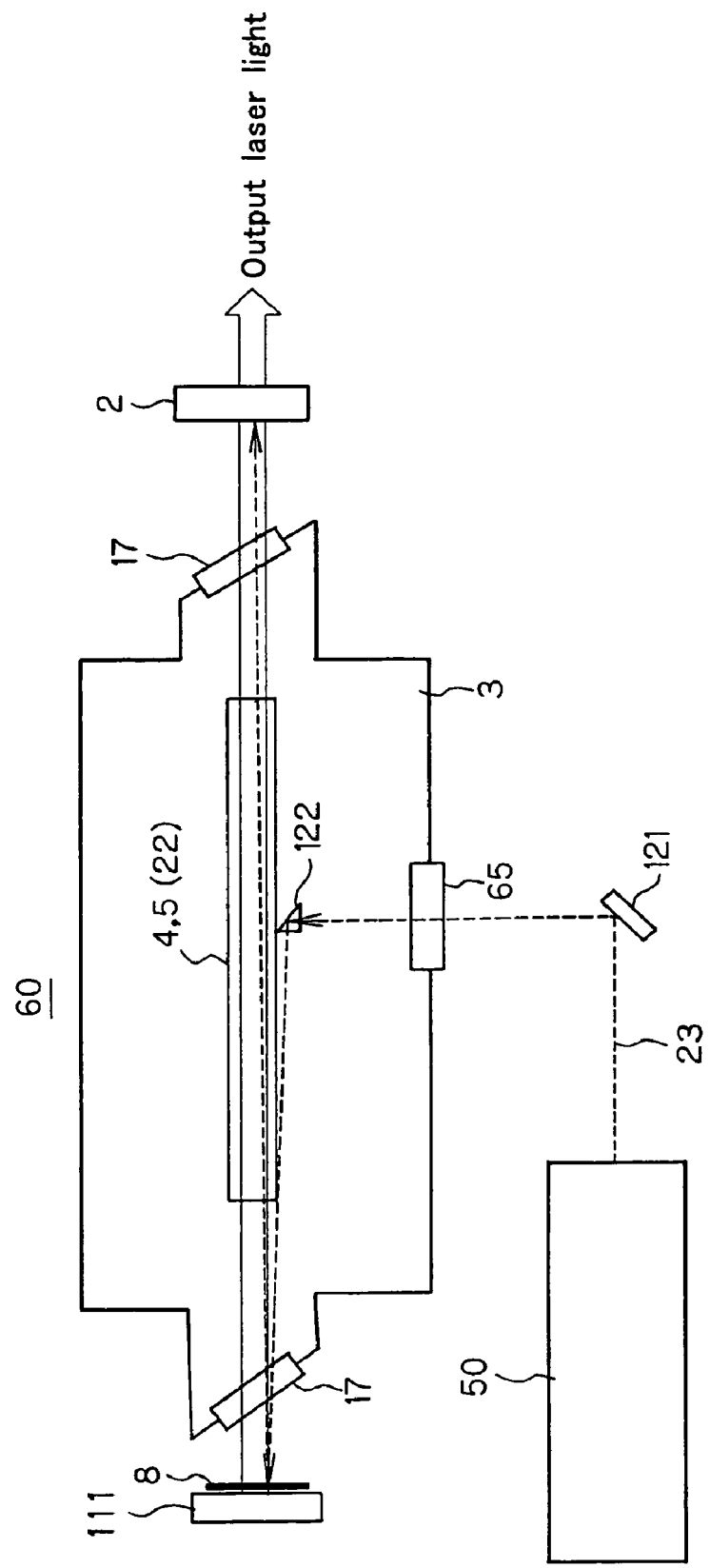
FIG. 58 is a top view illustrative of another embodiment wherein seed light is guided directly in the laser chamber in the amplification-stage laser.

FIG. 58 shows an embodiment wherein instead of the total-reflection mirror 121, a total-reflection prism 122 is used as the member located in the chamber for total reflection of the seed light 23, and the rest is the same as in FIG. 57. Therefore, only the total-reflection prism is now explained. The total-reflection prism 122 is a $CaF_2$ prism having no coating at all. As this total-reflection prism 122 is used as a total-reflection optical element, it allows the service life of that optical element to be extended because of no deterioration due to products resulting from the high-reflectivity (total-reflection) mirror coating in the laser gas or laser system, which are found with the total-reflection mirror 121.

Figure 59:
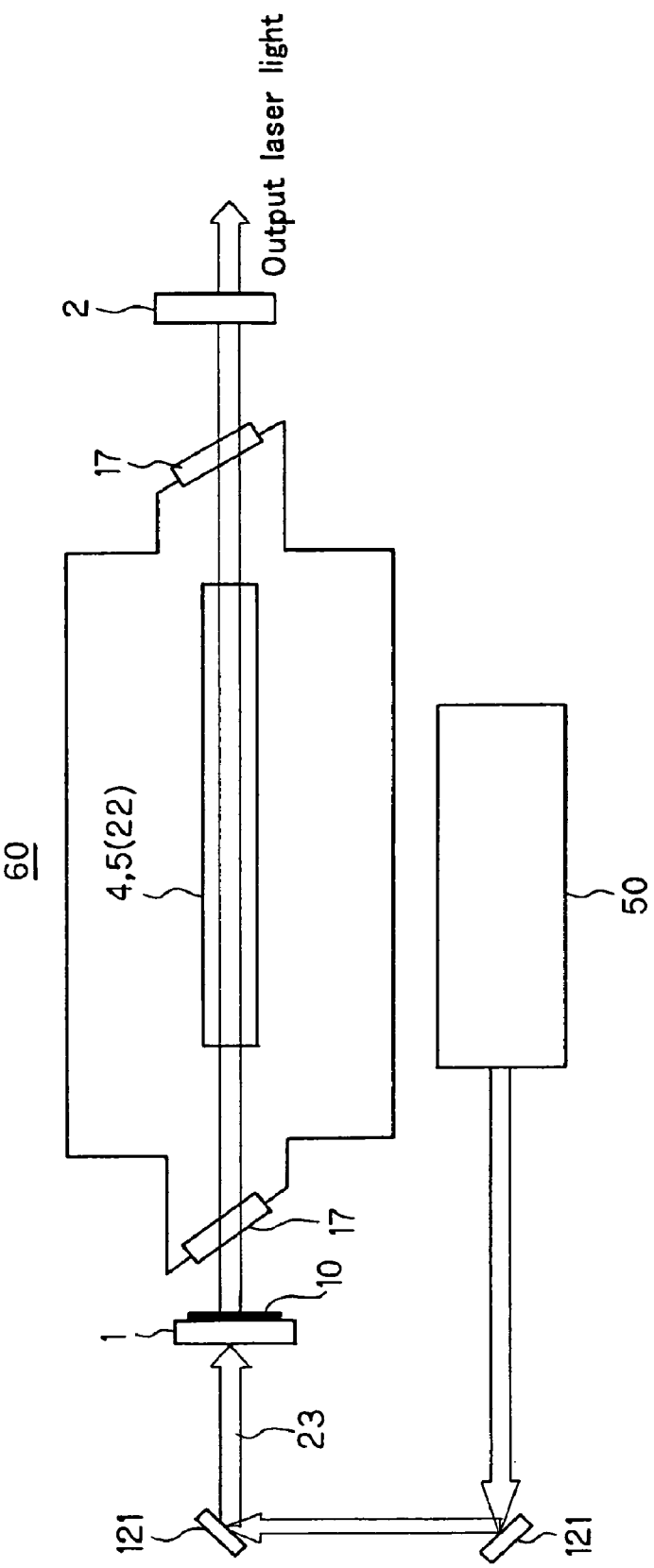
FIG. 59 is a top view illustrative of one embodiment wherein seed light is guided to the amplification-stage laser in the back surface injection mode.

FIG. 59 is a top view of an embodiment wherein a partial reflecting film 10 is coated to the input side mirror 1, so that the seed light 23 transmits through the input side mirror 1 from its back surface for the injection of the seed light 23. This will hereinafter be called the back surface injection mode. The seed light 23 from the line narrowing oscillation-stage laser 50 is introduced and entered in the back surface of the input side mirror 1 that is a rear side mirror in the resonator in the amplification-stage laser via one or more total-reflection mirrors 121, while its optical axis is in substantial alignment with the optical axis of the resonator in the amplification-stage laser. This input side mirror 1 is applied with the partial reflecting film 10, so that a part of the seed light 23 is injected into the amplification-stage laser resonator and the rest is reflected by the partial reflecting film 10. Then, the seed light 23 is filled in between the output side mirror 2 and the input side mirror 1 that form together the resonator. As high voltage is applied between the electrodes 4 and 5, it causes discharge, which allows the seed light 23 to be amplified by induction emission and the resonator to oscillate the amplification-stage laser 60.

Because the optical axis of the amplification-stage laser 60 is in alignment with the optical axis of the seed light 23, this mode provides the following merits: (1) alignment is easily achievable, (2) the tolerance of misalignment of the optical axis of the seed light 23 is wide, and (3) there is a possibility of holding back the occurrence of ASE because 0.5 roundtrip is needed to fill the amplification-stage laser resonator with the seed light 23. However, a problem with such a back surface injection mode is how the reflectivity of the input side mirror 1 is optimized.

Figure 60:
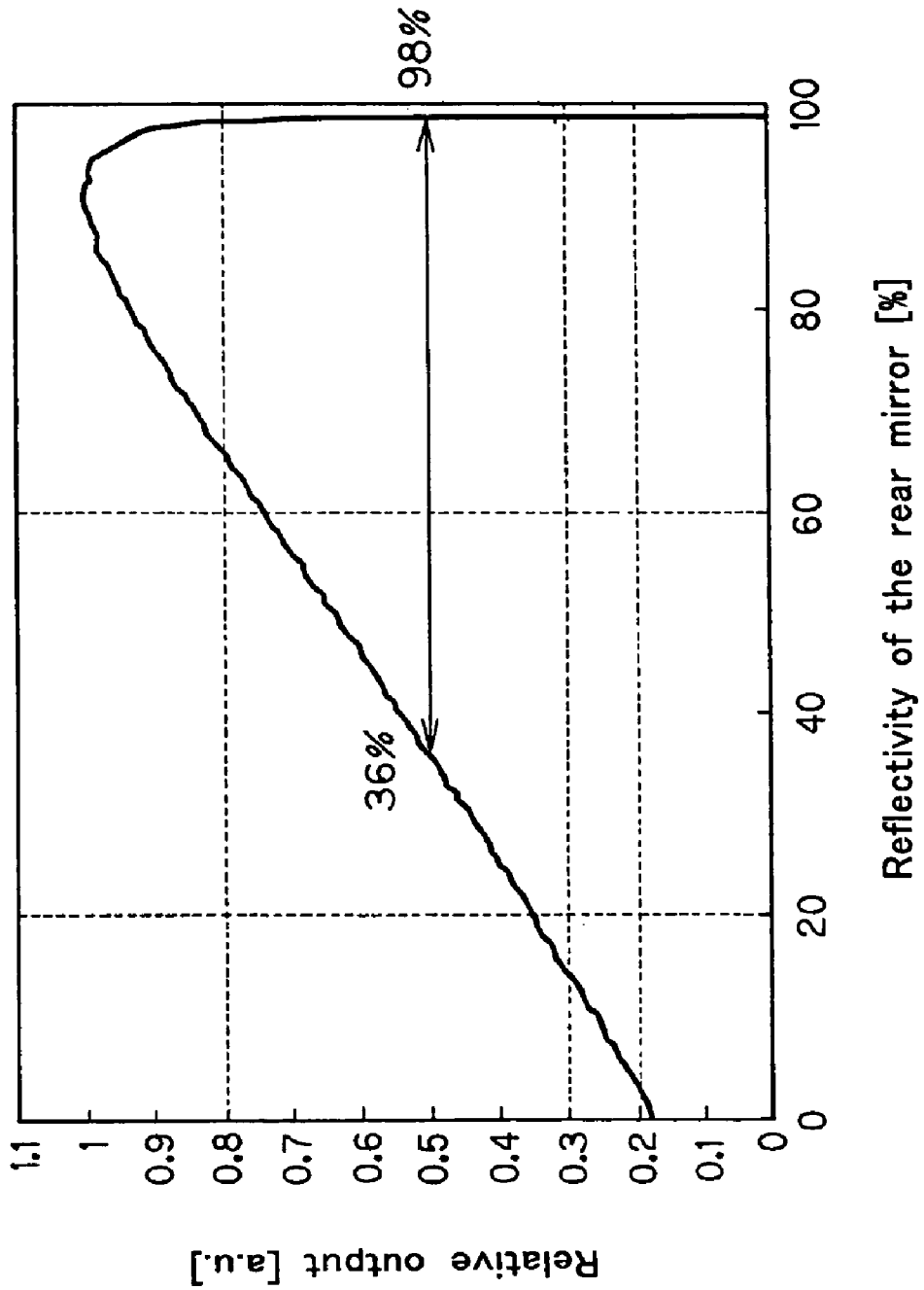
FIG. 60 is illustrative of relations between the input side mirror (the reflectivity of the rear mirror) and laser output after injection and synchronization.

FIG. 60 is indicative of relations between the input side mirror 1 (the reflectivity of the rear mirror) and the post-synchronization laser output, with relative output normalized at the respective maximum outputs as ordinate and the reflectivity of the mirror as abscissa. This is the post-synchronization output when the reflectivity of the input side mirror 1 varies at an output side mirror's reflectivity of about 30% while the output of the oscillation-stage laser is kept constant. From this graph, it has been found that the reflectivity of the mirror producing a maximum output is about 90%, and the reflectivity producing ½ of the maximum output ranges from about 36% to about 98%. In other words; it has been found that the optimum value of the reflectivity of the input side mirror in the back surface injection mode is about 90%, and the usable reflectivity range for the input side mirror 1 is about half the output having the optimum value, i.e., ranges from about 36% to about 98%.

Figure 61:
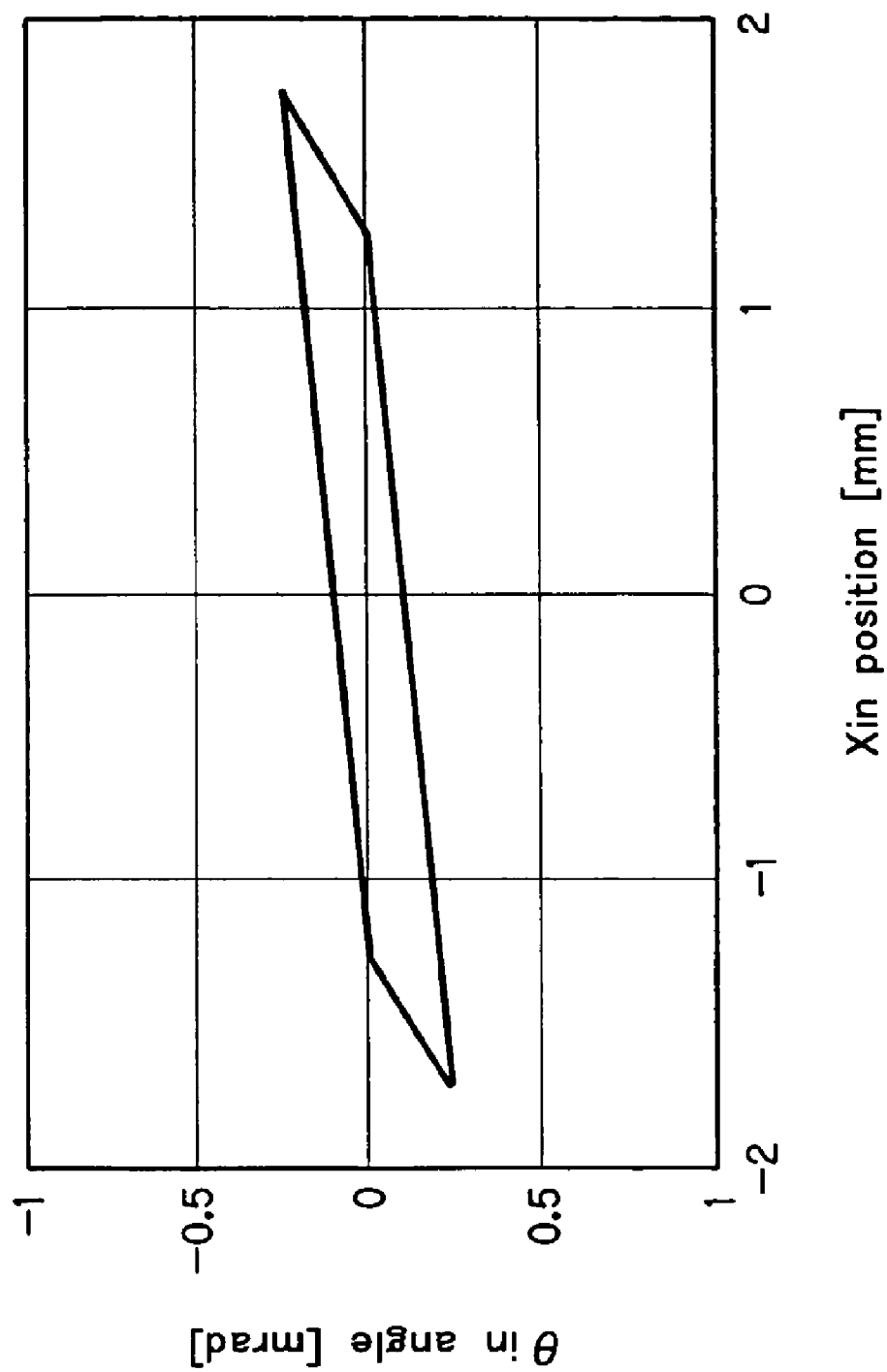
FIG. 61 is illustrative of one example indicative of an effective enabling area with respect to the angle and position, θin and Xin, of injection of seed light in the case where the seed light is injected from the back surface of the input mirror in the input side mirror.

FIG. 61 is indicative of an effective enabling region for the angle and position of injection of the seed light 23, θin and Xin, when the seed light 23 is injected in the input side mirror 1 from its back surface with the same coordinate axes and under the same amplification-stage laser conditions as in FIG. 35 (resonator length L=1,000 mm, discharge width Wx=2.5 mm, and the input side mirror 1 and the output side mirror are arranged parallel with six roundtrips). The polygonal region in FIG. 61 is larger than those found in FIGS. 37 and 38. This means that the tolerance of the optical axis of the seed light 23 to variations becomes wider in the back surface injection mode shown in FIG. 59 than in the oblique injection mode shown in FIG. 35. As a result, laser performance (such as energy stability and synchronous tolerance) will become better.

Figure 62:
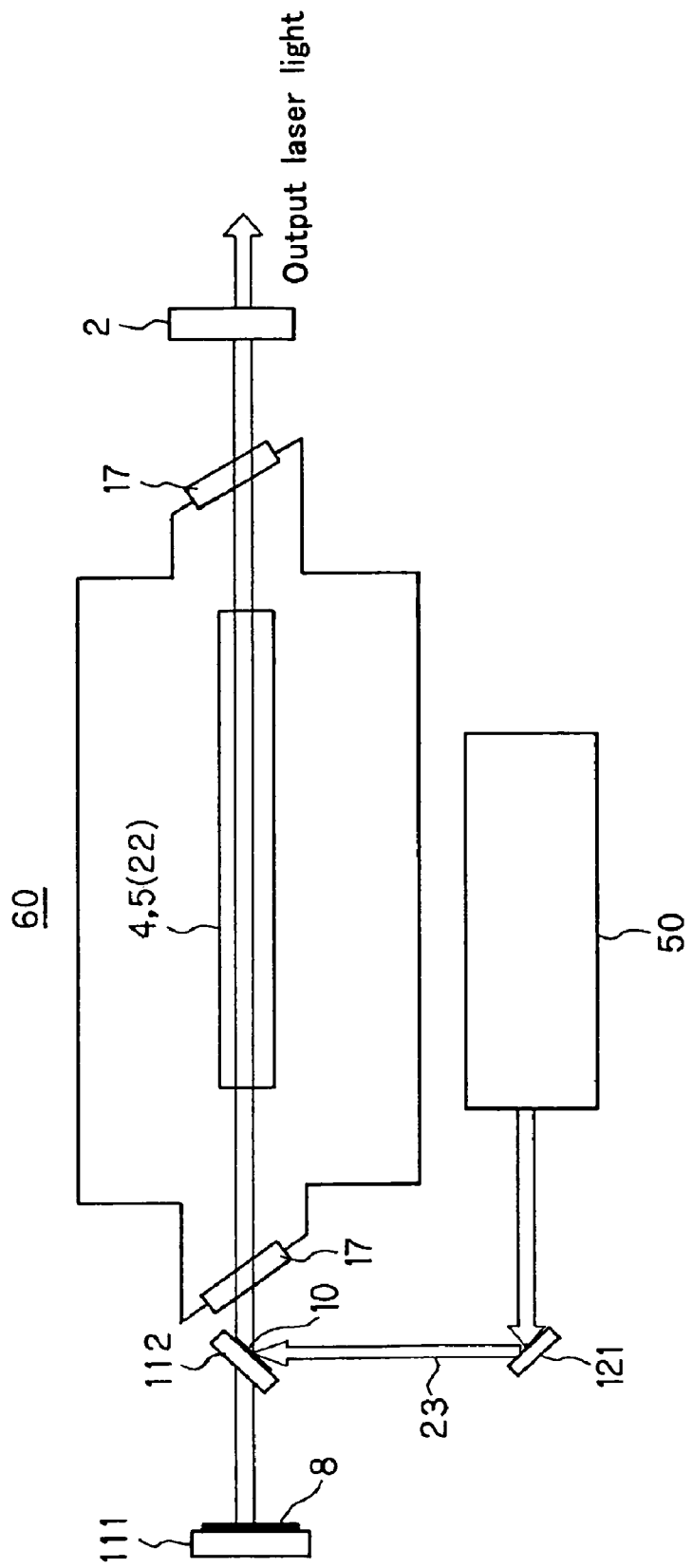
FIG. 62 is a top view illustrative of one embodiment of the mode of introducing seed light in the amplification-stage laser via a beam splitter in the resonator in the amplification-stage laser.
Figure 63:
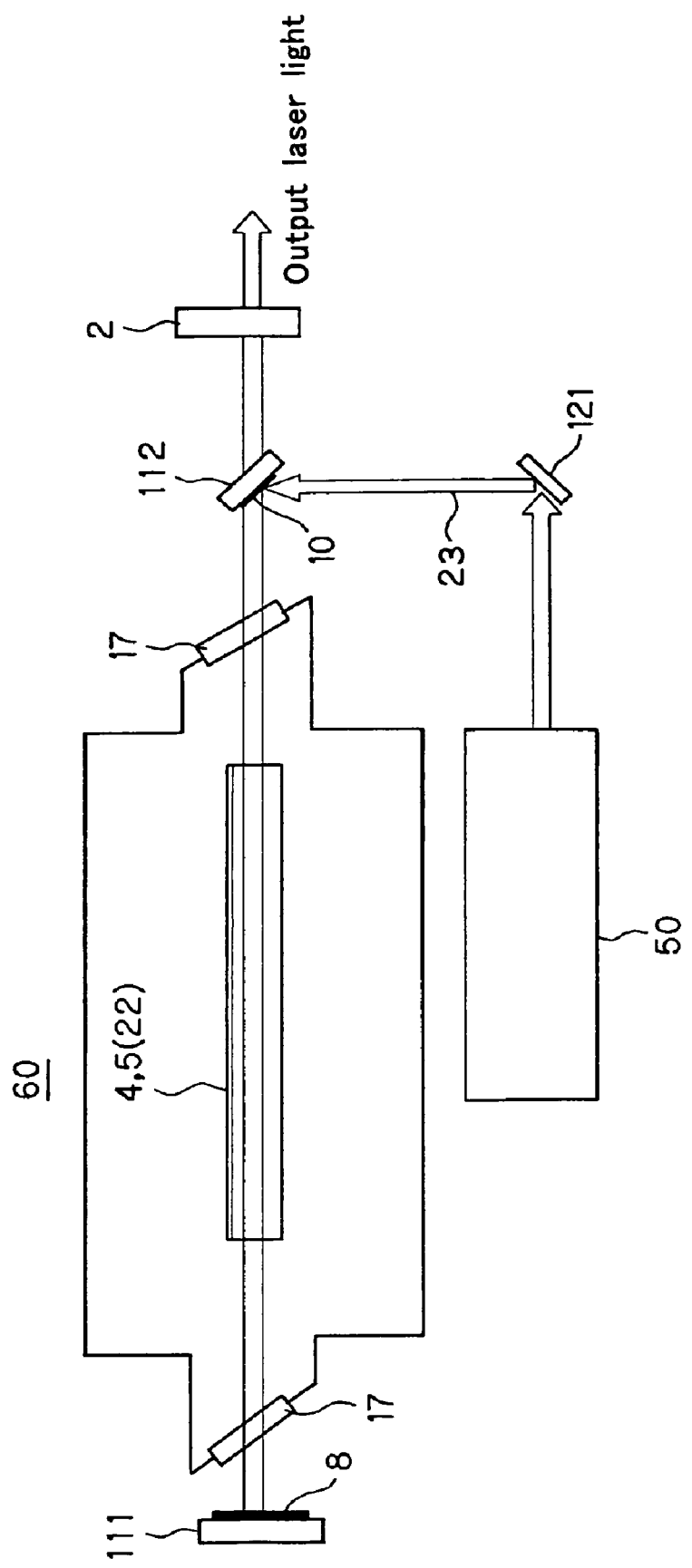
FIG. 63 is a top view illustrative of another embodiment of the mode of introducing seed light in the amplification-stage laser via a beam splitter in the resonator in the amplification-stage laser.

FIGS. 62 and 63 are each a top view of an embodiment of the mode wherein the seed light 23 is introduced in the amplification-stage laser 60 via a beam splitter 112 in the resonator in the amplification-stage laser 60. In the embodiment of FIG. 62, the beam splitter 112 coated with a partial reflecting film 10 is interposed between the rear side mirror 111 coated with a total-reflection film 8 and a rear side window 17 to introduce the seed light 23 in the amplification-stage laser 60. In the embodiment of FIG. 63, the beam splitter 112 coated with the partial reflecting film 10 is interposed between a front side window 17 and the output side mirror 2 to introduce the seed light 23 in the amplification-stage laser 60. The seed light 23 from the line narrowing oscillation-stage laser 50 is guided and directed to the beam splitter 112 located in the resonator in the amplification-stage laser 60 via one or more total-reflection mirrors 121. The beam splitter 112 is provided with the partial reflecting film 10 at which a part of the seed light 23 is reflected, and the reflected light is then injected in the amplification-stage laser resonator while its optical axis is in substantial alignment with the optical axis of the resonator. The remaining transmitted seed light 23 is thrown away. Thus, the seed light 23 is filled in between the rear side mirror 111 and the input side mirror 2 that form together the resonator. As high voltage is applied between the electrodes 4 and 5, it allows discharge to occur, so that the seed light 23 is amplified by induction emission and the amplification-stage laser 60 is oscillated by the resonator. In this embodiment, losses due to the provision of the beam splitter 112 in the resonator in the amplification-stage laser 60 grow more than in the embodiment of FIG. 59, resulting in lower output. However, the aforesaid merits (1), (2) and (3) are still kept intact.

In the embodiments of FIGS. 62 and 63, the seed light 23 is introduced in the resonator via the beam splitter 112. In a modification to them, a partial reflecting film is coated to the laser window 17 to allow it to have a similar beam splitter role as mentioned above. In this case, too, the seed light 23 is injected in the amplification-stage laser resonator while substantially coaxial with the resonator. Although the seed light 23 is first introduced in the discharge area direction by means of the beam splitter 112, it is acceptable to introduce the seed light 23 in the direction of the rear side mirror 111 or the output side mirror 2. In any case, the light reflected from the mirror toward the amplification-stage laser is amplified. It is then required, however, to make the output of the oscillation-stage laser 50 higher, because losses of the seed light 23 grow more than in the embodiments of FIGS. 62 and 63.

Figure 64:
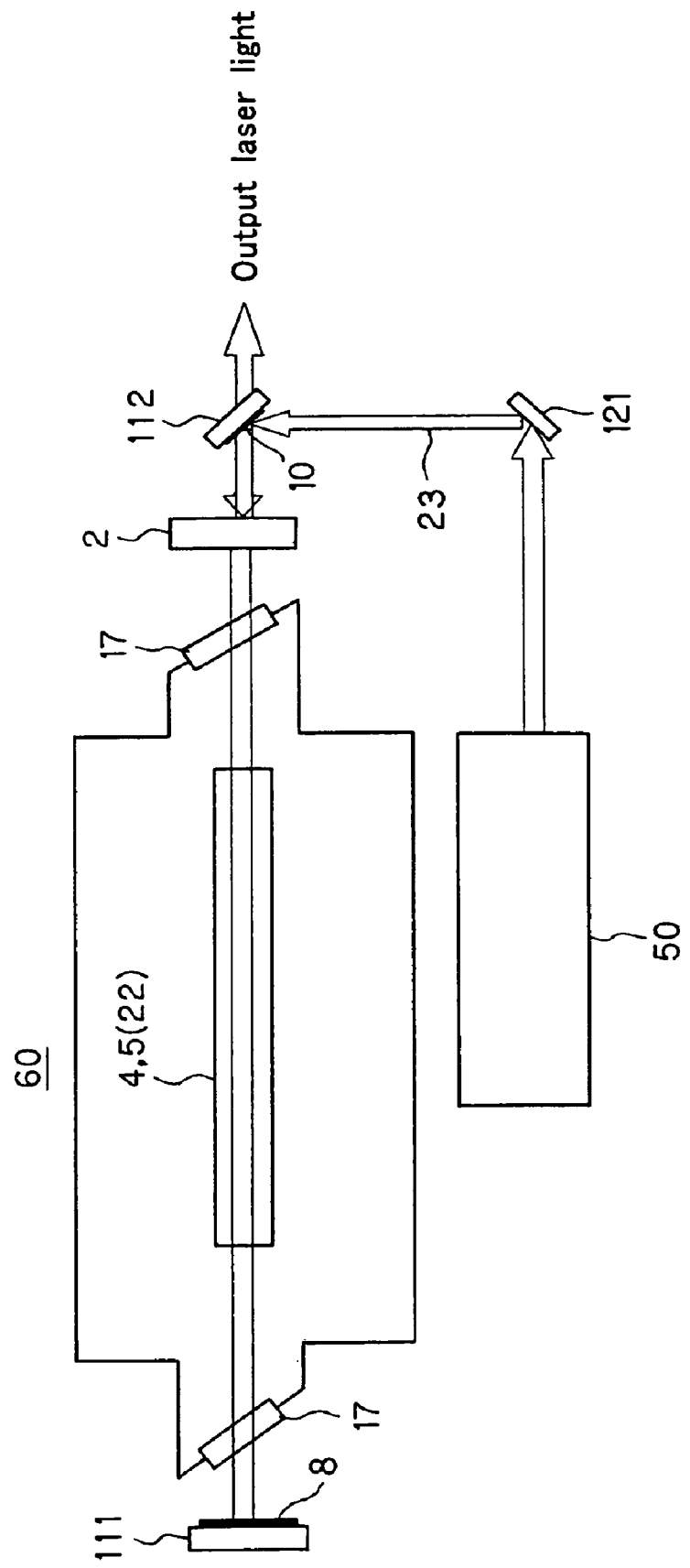
FIG. 64 is a top view illustrative of one embodiment wherein seed light is injected in the amplification-stage laser through the output side mirror by way of a beam splitter.

FIG. 64 is a top view of an embodiment wherein the seed light 23 is permitted to transmit through the output side mirror 1 by the beam splitter 112 for injection in the amplification-stage laser resonator. The seed light 23 from the line narrowing oscillation-stage laser 50 is guided and directed to the output side mirror 2 in the resonator in the amplification-stage laser 60 via one or more total-reflection mirrors 121 while its optical axis is in substantial alignment with the optical axis of the amplification-stage resonator. The beam splitter 112 is provided with a partial reflecting film 10, and the portion of the seed light 23 transmitting through the beam splitter 112 is thrown away while the reflected light is entered in the output side mirror 2. The portion of the seed light 23 transmitting through the output side mirror 1 is injected in the amplification-stage resonator. The remaining portion of the seed light 23 is reflected by the output side mirror 1. Thus, the seed light 23 is filled in between the output side mirror 2 and the rear side mirror 111 that form together the resonator. As high voltage is applied between the electrodes 4 and 5, it allows discharge to occur, so that the seed light 23 is amplified by induction emission and the amplification-stage laser 60 is oscillated by that resonator. In this embodiment, losses of the seed light 23 grow more than in the embodiment of FIG. 59, because of poor efficiency of injection through the beam splitter 112 and the output side mirror 2. It is thus required to make the output of the oscillation-stage laser 50 higher; however, the aforesaid merits (1), (2) and (3) are still kept intact.

Figure 65:
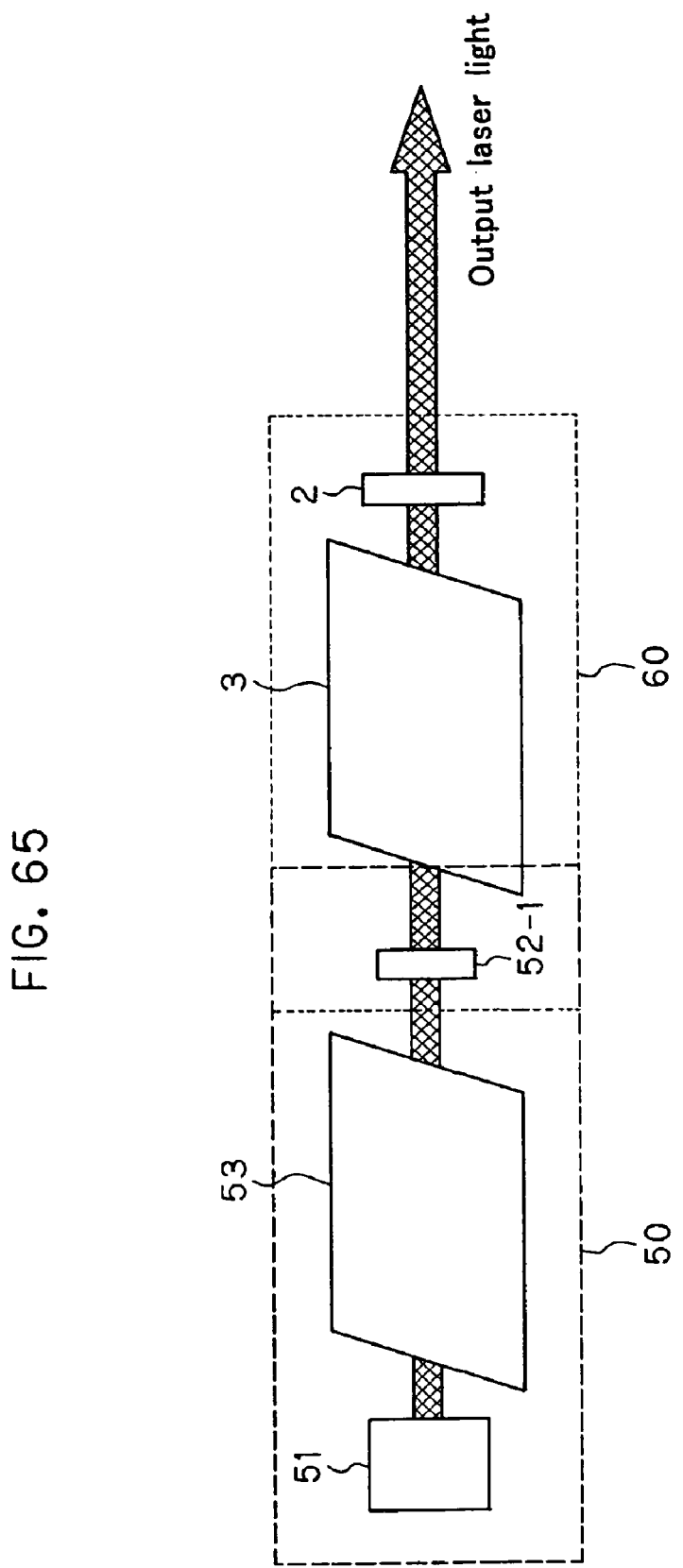
FIG. 65 is illustrative of part of another embodiment of the two-stage laser system for aligners according to the invention.

By the way, when the diameter of laser light from the oscillation-stage laser 50 is equal to the diameter of output laser light from the amplification-stage laser 60 so that the conversion optical system 70 could be dispensed with, the front mirror 52 in the oscillation-stage laser 50 and the input side mirror 1 in the amplification-stage laser 60 could be provided by a common or sharing mirror. FIG. 65 is a top view illustrative in schematic of this embodiment, wherein a cascade connection is made between the oscillation-stage laser 50 and the amplification-stage laser 60 in such a way as to share the common mirror 52-1. The front surface of the transparent substrate of the common mirror 52-1 is applied with a partial reflecting mirror coating to form a partial reflecting mirror surface for the front mirror 52 in the oscillation-stage laser 50, and the back surface of the transparent substrate of the common mirror 52-1 is provided with a high-reflectivity mirror coating (except the seed light-introduction hole 7") as shown typically in FIG. 5, for application to the input side mirror 1 in the amplification-stage laser 60. It is here noted that the front surface of the common mirror 52-1 could have a surface configuration for the front mirror 52 in the resonator for the oscillation-stage laser 50, and the back surface could be configured in a planar or concave shape for the input side mirror 1 in the amplification-stage laser 60.

Figure 66:
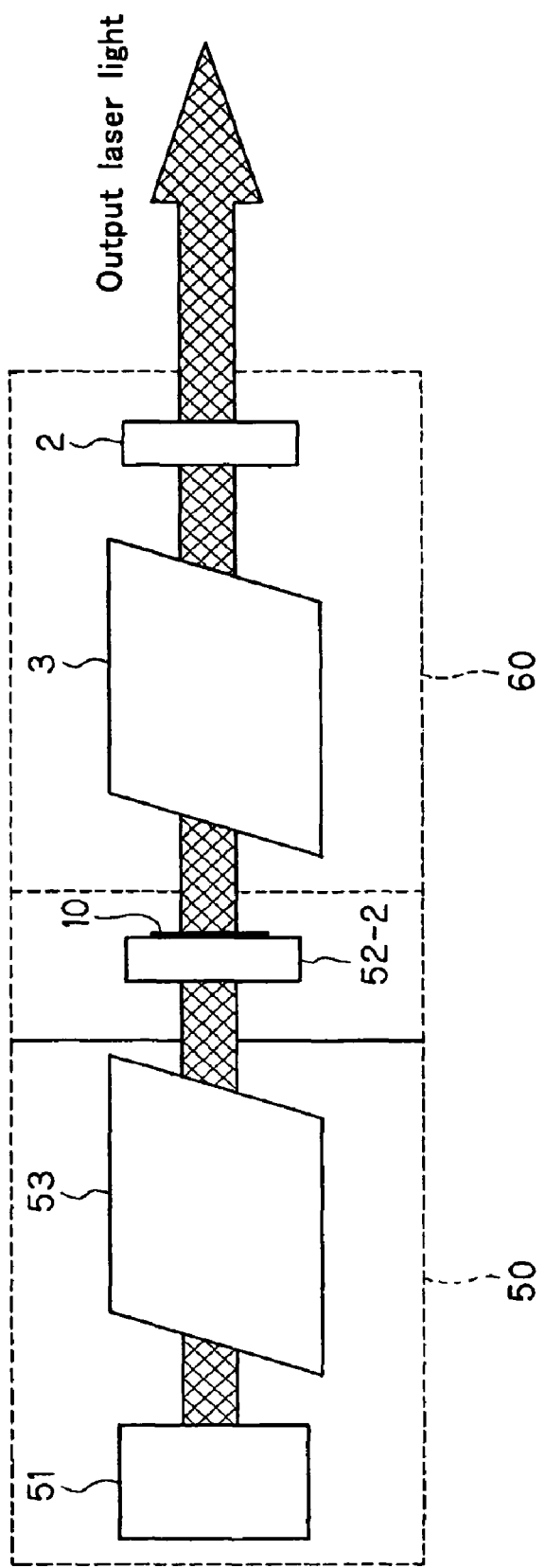
FIG. 66 is illustrative of part of yet another embodiment of the two-stage laser system for aligners according to the invention.

FIG. 66 is illustrative of a modification to the back surface injection mode. When the diameter of laser light from the oscillation-stage laser 50 is substantially equal to that from the amplification-stage laser 60 so that the conversion optical system 70 could be dispensed with, the front mirror 52 in the oscillation-stage laser 50 and the amplification-stage laser 60 could be designed to have a common or sharing input side mirror 52-2 coated with a partial reflecting film 10. It is noted that the partial reflecting film 10 could be applied to the side of the input side mirror that opposes the side shown. In this embodiment, a cascade connection is made between the oscillation-stage laser 50 and the amplification-stage laser 60 in such a way as to share the common mirror 25-2 coated with the partial reflecting film 10 on its one surface. The line narrowing module 51 and the partial reflecting surface of the common mirror 25-2 work as a resonator to oscillate the oscillation-stage laser 50 to produce the seed light from the partial reflecting surface of the common mirror 52-2. At the same time, the seed light is entered directly in the resonator in the oscillation-stage laser 60, which is made up of the common mirror 52-2 and the output side mirror 2. As high voltage is applied between the electrodes 4 and 5, it permits discharge to occur, so that the seed light is amplified by induction emission and the amplification-stage laser 60 is oscillated by that resonator. In this case, the reflectivity of the common mirror could be effective if it comes in the range of FIG. 60.

In addition to the merits (1), (2) and (3) of the back surface injection mode, this mode provides additional merits as set forth just below. Because the common mirror 52-2 having the partial reflecting film is shared by the front mirror in the oscillation-stage laser 50 and the input side mirror in the amplification-stage laser 60, (1) any means for the introduction of seed light can be dispensed with, making the system compact and less costly, (2) the seed light can be injected in the resonator in the amplification-stage laser without losses, so that the oscillation-stage laser can be kept low in output and compact in size, and (3) the optical axes of the oscillation- and amplification-stage lasers are substantially in alignment, so that they can be easily adjusted with higher stability.

A difference in the advantage between the embodiments of FIGS. 65 and 66 is now explained. The output of the oscillation-stage laser can be lower in the embodiment of FIG. 66 than in that of FIG. 65. This is because the common mirror 52-2 having the partial reflecting film on its one surface is shared by the front mirror in the oscillation-stage laser 50 and the input side mirror in the amplification-stage laser 60, so that all the seed light 23 can be injected in the resonator in the amplification-stage laser 60 without causing losses of the output of the oscillation-stage laser 50. Thus, the oscillation-stage laser 50 can be made smaller and less costly.

With the above two-stage laser system for aligners according to the invention, Fabry-Perot etalon type stable resonator or a resonator with its two mirrors slightly inclined with each other is used in the amplification-stage laser so as to achieve a spatial coherence as low as that of the oscillation-stage laser, and light having divergence is used as the seed light oscillated from the oscillation-stage laser so as to fill a laser gas gain area with the seed light for efficient amplification. Even with a ring resonator using a plurality of plane mirrors in the amplification-stage laser, too, the desired low spatial coherence is achievable.

Figure 67:
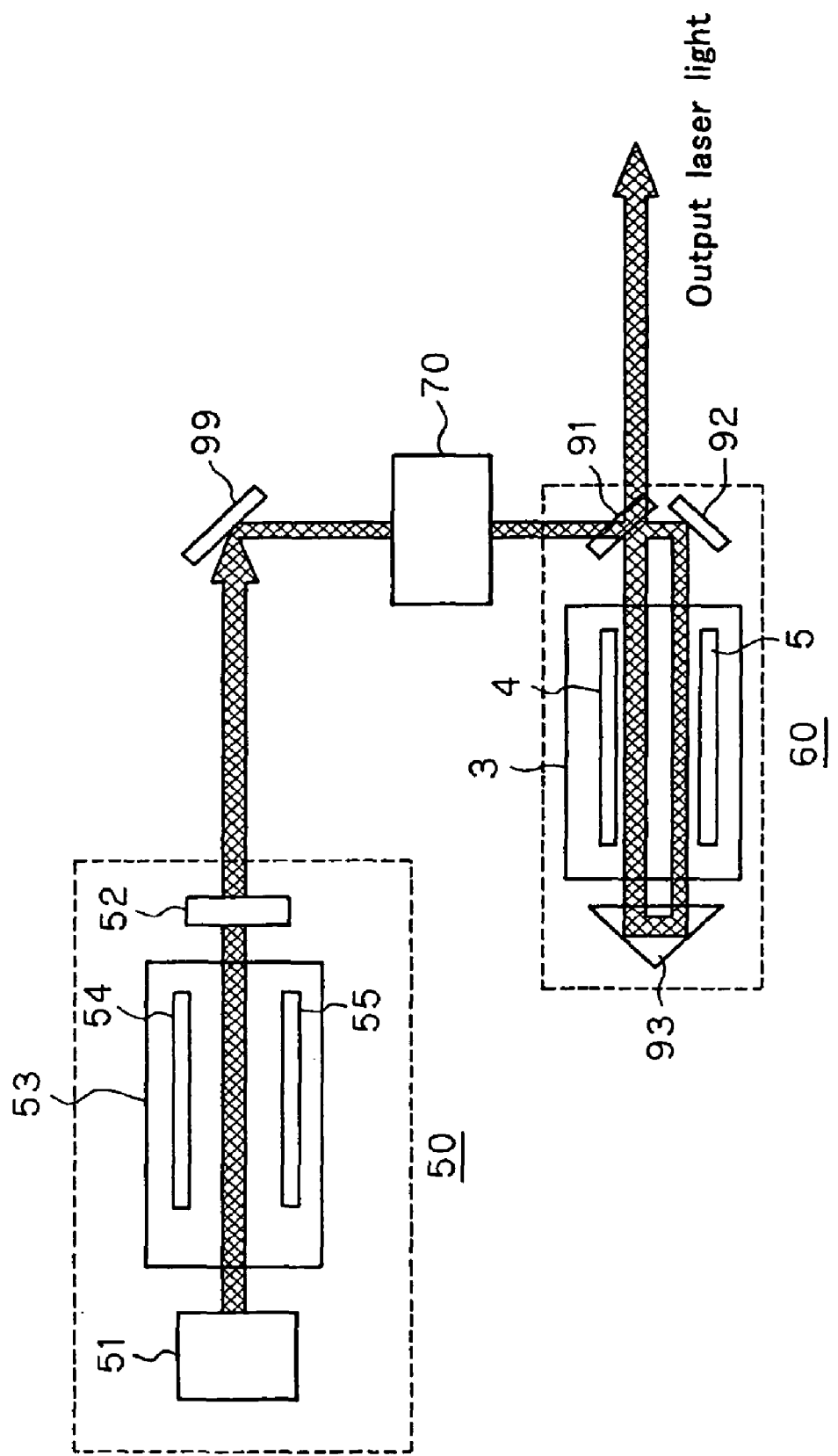
FIG. 67 is illustrative in schematic of the construction of one embodiment of the two-stage laser system for aligners according to the invention, wherein a ring resonator is used in the amplification-stage laser.

FIG. 67 is a side view illustrative in schematic of one embodiment using such a ring resonator. In this embodiment, the seed light from the oscillation-stage laser 50 is directed through a reflecting mirror 99 to the conversion optical system 70 where it is reduced to the desired beam width, entering the amplification-stage laser 60. The amplification-stage laser 60 comprises a ring resonator built up of an input/output partial reflecting mirror 91, a total-reflection mirror 92 for the reflection of seed light transmitting through the partial reflecting mirror 91, and a total-reflection right-angle prism (roof prism) 93 having two total-reflection surfaces and operable to reflect incident light in a direction substantially parallel with and opposite to the direction of incidence, wherein all reflecting surfaces are formed of planes. Thus, the gain area (discharge area) in the chamber 3 positioned between the partial reflecting mirror 91/total-reflection mirror 92 and the total-reflection right-angle prism 93 can be filled with the seed light having divergence while it makes roundtrips in the ring resonator, which the amplified laser light leaves as output via the partial reflecting mirror 91.

Figure 68:
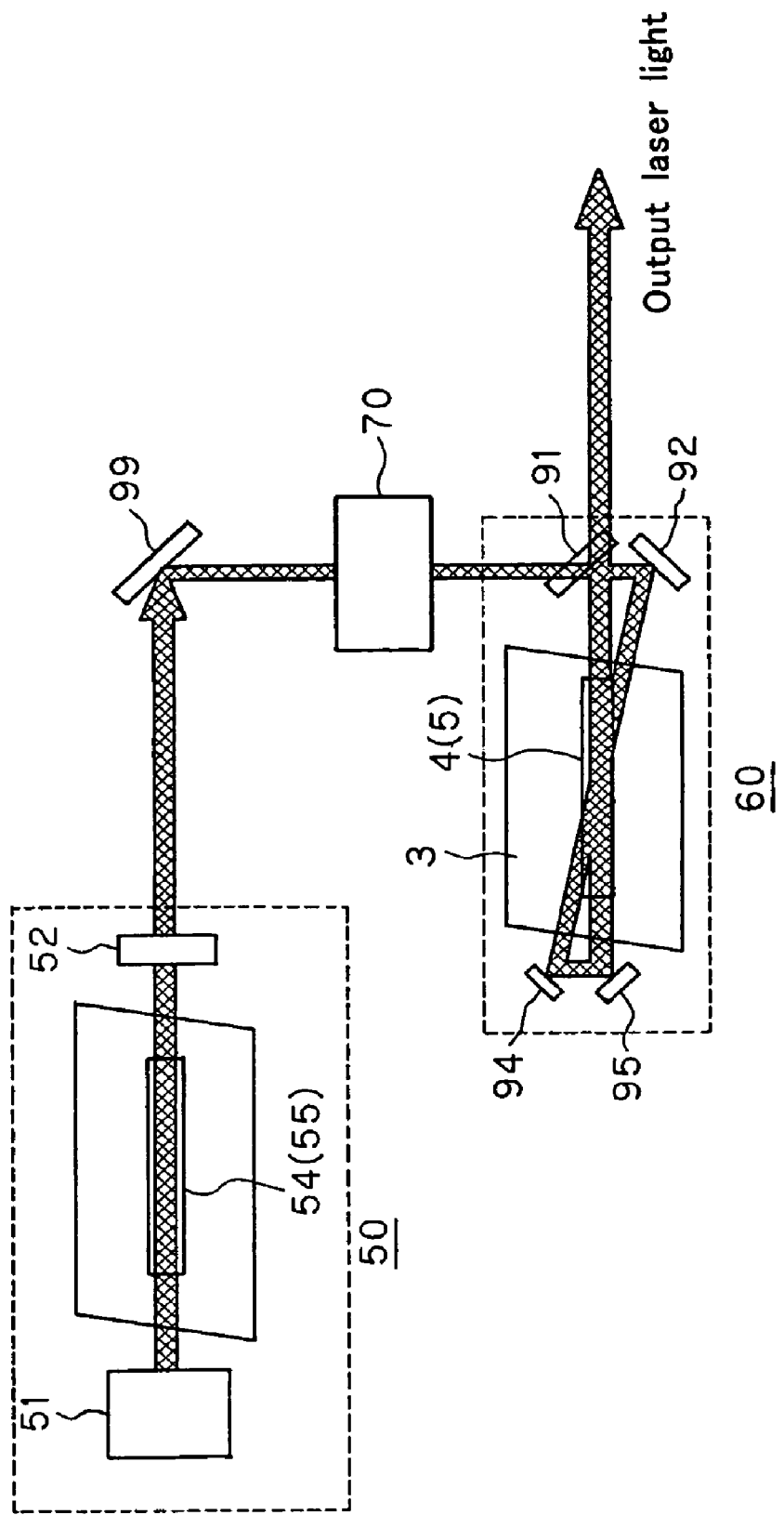
FIG. 68 is illustrative in schematic of the construction of another embodiment of the two-stage laser system for aligners according to the invention, wherein a ring resonator is used in the amplification-stage laser.

FIG. 68 is a plan view illustrative in schematic of another embodiment using the ring resonator. The seed light from the oscillation-stage laser 50 is entered in the amplification-stage laser 60 via a reflecting mirror 99. The amplification-stage laser 60 comprises a ring resonator built up of an input/output partial reflecting mirror 91 and three total-reflection mirrors 92, 93 and 94 for sequentially reflecting the seed light transmitting through the partial reflecting mirror 91 back to the partial reflecting mirror 91, wherein all reflecting surfaces are formed of planes. Thus, the gain area (discharge area) in the chamber 3 positioned between the partial reflecting mirror 91/total-reflection mirror 92 and the total-reflection mirrors 94, 95 can be filled with the seed light having divergence while it makes roundtrips in the ring resonator, which the amplified laser light leaves as output via the partial reflecting mirror 91.

The inventors have further found that if, in a two-stage laser system having its spatial coherence decreased while taking advantage of the high stability, high output efficiency and fine line width of the MOPO system explained in the preamble of the disclosure, the length of an optical path in the resonator in the amplification-stage laser is specified as described below, it is then possible to provide a two-stage laser system more suitable for use on semiconductor aligners.

As a result of experiments after experiments, the inventors have discovered that there is often an interference fringe pattern in the beam profile configuration of laser light produced out of the amplification-stage laser, although depending on the length of the optical path in the resonator in the amplification-stage laser.

This interference fringe pattern, if any, renders the symmetry of the beam profile configuration worse. Further, the interference fringe pattern moves with time due to changes in the center wavelength of the seed light 23 produced out of the oscillation-stage laser 50, changes in the resonator length of the amplification-stage laser 60 or the like, rendering the stability of the beam profile worse too.

The beam profile configuration of the laser light produced out of the two-stage laser system that is a light source for the aligner has some considerable influences on the uniform illumination of masks on the aligner and, hence, on exposure capability on what is to be exposed (wafers). Further, fluctuations of the interference fringe pattern give rise to too large fluctuations of laser light output to control.

Why the interference fringe pattern occurs is now explained with reference to FIGS. 69 and 70. FIG. 69 is illustrative in schematic of a MOPO type two-stage laser system to which the invention is applied, and laser light characteristics as well. Specifically, FIG. 69(*a*) is a schematic illustration of the MOPO type two-stage laser system to which the invention is applied; FIG. 69(*b*) is indicative of a spectral profile of narrow-banded laser light produced out of the oscillation-stage laser; and FIG. 69(*c*) is indicative in section of laser light (beam profile configuration) produced out of the amplification-stage laser.

For instance, given the narrow-banded laser light (seed light 23) produced out of the oscillation-stage laser 50 has the spectral profile shown in FIG. 69(*b*). The seed light 23 is injected in the resonator in the amplification-stage laser 60 (which is built up of, e.g., the input side mirror 1 and the output side mirror 2), wherein it is amplified and oscillated.

Here, when the resonator in the amplification-stage laser 60 is built up of a stable resonator or a resonator with its mirrors slightly inclined with respect to each other and that resonator is comprised of an input side (total-reflection) mirror 1 and an output side (partial reflecting) mirror 2, the seed light 23 transmits through the input side mirror 1 and thereafter passes through the discharge area 22 in the amplification-stage laser 60, where it is amplified. The amplified light after passing through the discharge area 22 is incident on the output side mirror 2 that is a partial reflecting mirror, and a part of the reflected light is produced as the first laser light L1 through the output side mirror 2.

On the other hand, the amplified light reflected by the output side mirror 2 passes through the discharge area 22 where it is amplified, entering the input side mirror 1. The amplified light subjected to total reflection at the input side mirror 1 passes through the discharge area 22 wherein it is amplified, entering the output side mirror 1. A part of that light transmits through the output side mirror 2, leaving it as the second laser light K2. The remaining amplified light is reflected by the output side mirror 2 toward the amplification area 22. In the resonator in the amplification-stage laser 60, such resonance occurs repeatedly.

The first laser light K1 and the second laser light K2 interfere when the optical path difference between the both laser light K1 and K2 is shorter than a time-based coherent length Lc corresponding to the spectral width of the seed light 23 produced out of the oscillation-stage laser 50.

Here, let $\lambda$ be the wavelength of the laser light, and $\Delta\lambda$ be the spectral line width. Then, the time-based coherent length Lc is defined by equation (9) (see non-patent publication 1).

$$Lc=\lambda^2/\Delta\lambda \quad (9)$$

Figure 69A:
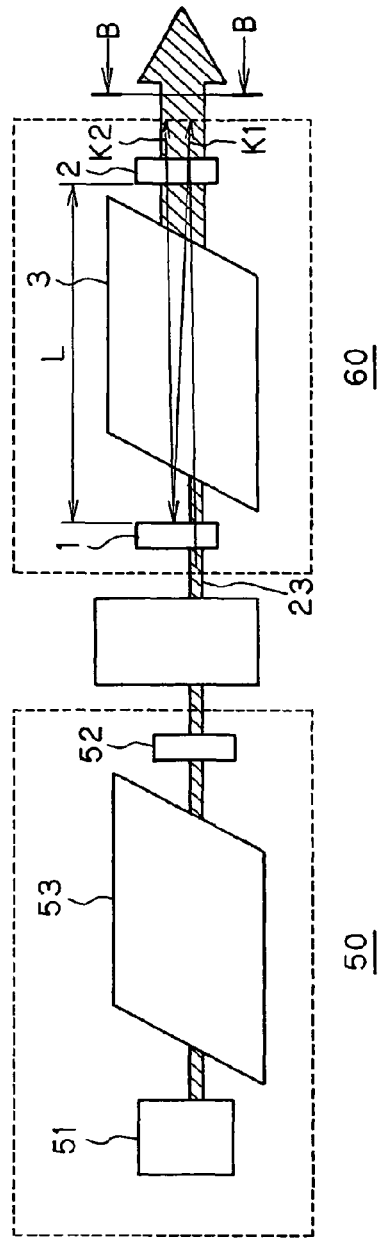
FIG. 69 is illustrative of the principles of why an interference fringe pattern occurs in the two-stage laser system for aligners.
Figure 69B:
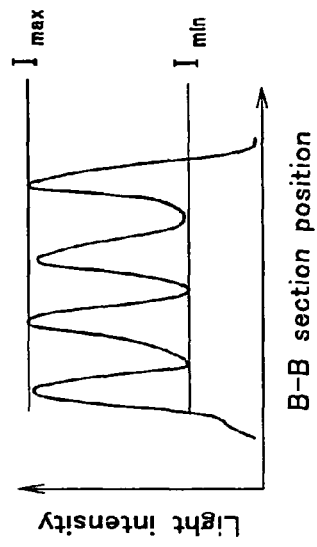
Figure 69C:
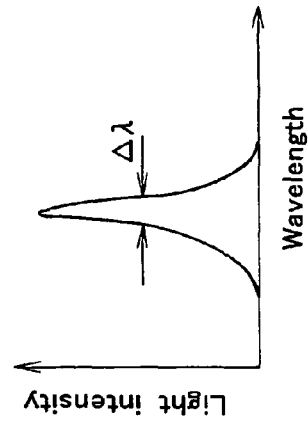
Figure 70:
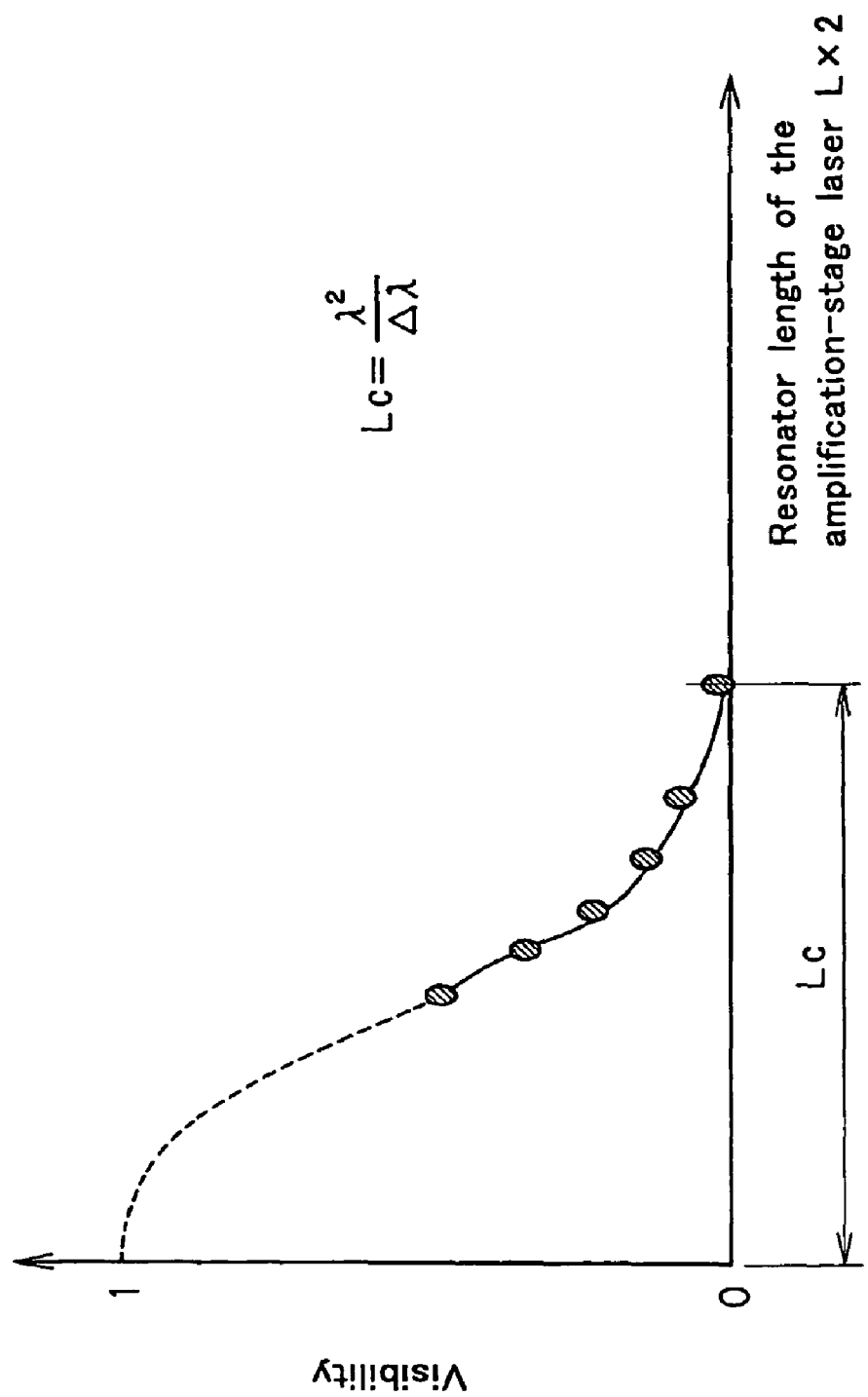
FIG. 70 is indicative of relations between the length twice as long as the resonator length L of the amplification-stage laser and the visibility of an interference fringe pattern.
Figure 71:
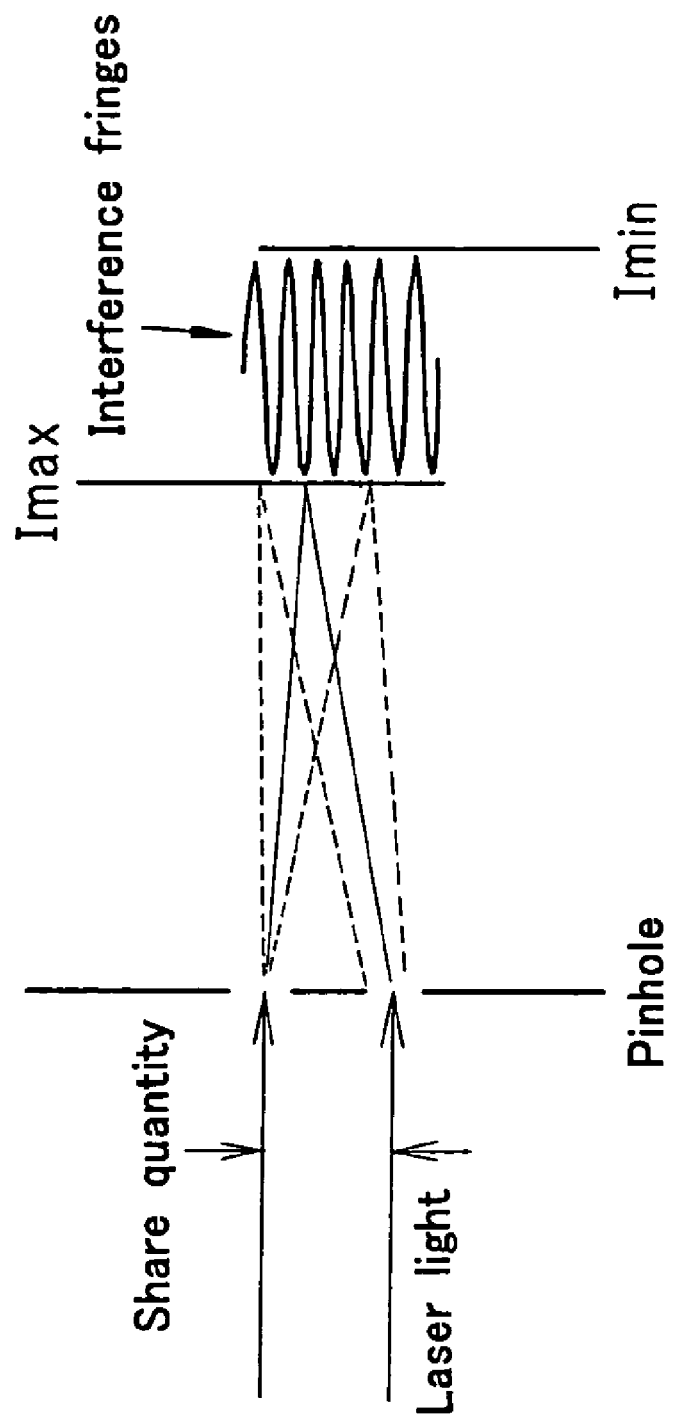
FIG. 71 is illustrative in schematic of interference fringes of light from two points in a given share quantity as well as the maximum and minimum fringe intensities.
Figure 72:
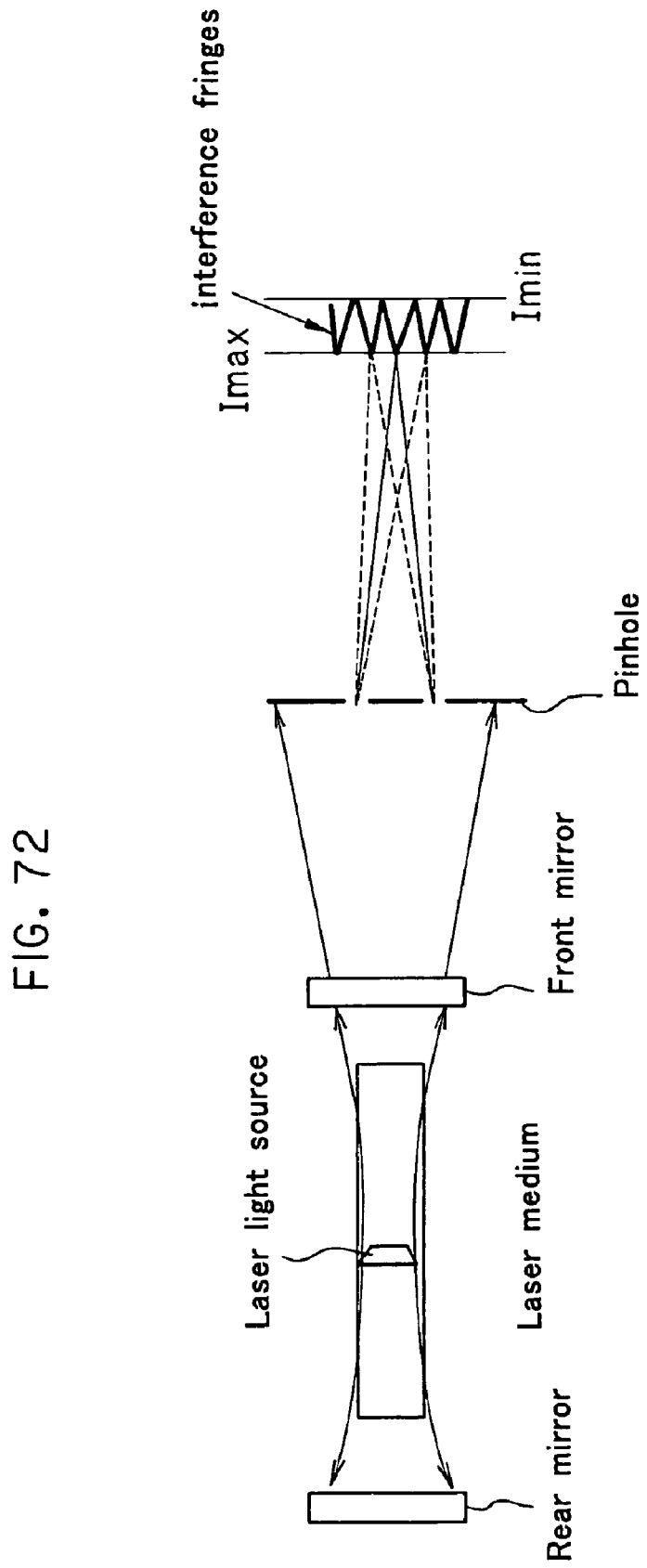
FIG. 72 is a view, as in FIG. 71, of a laser portion added to it.

As in the evaluation of spatial coherence, interference fringe capability on the B-B section of FIG. 69(a) is evaluated in terms of visibility and optical path difference. The optical path difference herein is tantamount to the distance that the laser light (seed light) travels from entering the resonator to leaving it; that is, it is substantially twice as long as the resonator length L of the amplification-stage laser 60. Visibility is also found from the following formula:

Visibility=(maximum fringe intensity $I_{max}$ of interference fringe pattern−minimum fringe intensity $I_{min}$ of interference fringe pattern)÷(maximum fringe intensity $I_{max}$ of interference fringe pattern+minimum fringe intensity of $I_{min}$ of interference fringe pattern FIG. 70 is indicative of relations between the length twice as long as the resonator length L of the amplification-stage laser and the visibility of the interference fringe pattern. FIG. 70 teaches that as the length twice as long as the resonator length L of the amplification-stage laser 60 (that length substantially matches the optical path difference between the first laser light K1 and the second laser light K2) becomes long, the visibility of the interference fringe pattern occurring on the beam profile of laser light produced out of the amplification-stage laser 60 becomes small. It also teaches that as the length substantially twice as long as the resonator length L of the amplification-stage laser 60 becomes longer than the time-based coherence length Lc of the seed light 23 produced out of the oscillation-stage laser 50, the interference fringe pattern virtually disappears.

Referring typically to an ArF laser MOPO type two-stage laser system for aligners, when the spectral line width (full width half maximum) of the seed light 23 produced out of the oscillation-stage laser 50 is $\Delta\lambda$=0.2 pm and the wavelength is $\lambda$=193.4 nm, the time-based coherence length Lc is found from equation (9) to be Lc=about 0.186 m. Therefore, to prevent any interference fringe pattern from occurring in the beam profile of the laser light output, the resonator length L of the amplification-stage laser 60 must be 0.186/2=0.093 m or longer.

When the ring resonator is used as the resonator in such an amplification-stage laser 60 as shown in FIGS. 67 and 68, such conditions as mentioned below must be satisfied to prevent any interference fringe pattern from occurring on the beam profile of the laser light produced out of the amplification-stage laser 60.

With the ring resonator, the interference fringe pattern can be held back by making its optical path length longer than the time-based coherent length Lc corresponding to the spectral line width of the narrow-banded seed light 23 produced out of the oscillation-stage laser 50.

With the embodiment of FIG. 67, the length of the optical path taken by the seed light 23 (laser light) from the position where it leaves the partial reflecting mirror 91 upon entrance and transmission through it until that laser light again arrives at the partial reflecting mirror 9 via the total-reflection mirror 92 and the total-reflection right-angle prism 93 should preferably be longer than the time-based coherent length Lc.

With the embodiment of FIG. 68, the length of the optical path taken by the seed light 23 (laser light) from the position where it leaves the partial reflecting mirror 91 upon entrance and transmission through it until that laser light again arrives at the partial reflecting mirror 9 via the total-reflection mirrors 92, 94 and 95 should preferably be longer than the time-based-coherent length Lc.

That is, if, in FIGS. 67 and 68, the optical path length difference upon the laser light split by the partial reflecting mirror 91 crossing again over it is made longer than the time-based coherent length Lc corresponding to the spectral line width of the seed light 23 produced out of the oscillation-stage laser, it is then possible to prevent any interference fringe pattern from occurring on the beam profile of the laser light produced out of the amplification-stage laser 60.

While the two-stage laser system for aligners according to the invention has been described with referent to its principles and embodiments, it is to be understood that the invention is by no means limited to them and various modifications to them are possible.

For instance, when the two-stage laser system for aligners according to the invention is a fluorine molecule ($F_2$) laser system, the oscillation-stage laser 50 could comprise, in place of the line narrowing module 51, a line select module comprising at least one angle dispersion element and a total-reflection mirror located in order from its side on which laser light is incident.

Specifically, the laser light produced out of the $F_2$ laser system has two primary oscillation wavelengths ($\lambda_1$=157.6299 nm and $\lambda_2$=157.5233 nm: non-patent publication 2). The spectral line width (FWHN) of both lines is about 1 pm. When an alignment optical system in the aligner is catadioptric system, chromatic aberrations are prevented even at such spectral line widths as mentioned above.

In this case, therefore, the oscillation line of stronger intensity $\lambda_1$ (=157.6299 nm) among both lines is usually selected by the aforesaid line select module upon free-run oscillation.

It is noted that such a line select module is not necessarily located in the oscillation-stage laser 50; it could be located in the output optical path of the output side mirror 60 in the amplification-stage laser 60.

Here, when any interference fringe pattern is prevented from occurring on the beam profile of the laser light produced out of the amplification-stage laser 60, the resonator length Lc of the amplification-stage laser 60 is determined as mentioned above, while comparing with the time-based coherent length Lc of the oscillation-stage laser 50. Upon determination of the time-based coherent length Lc from equation (9), the spectral lie width $\Delta\lambda$ of the oscillation-stage laser 60 is determined as follows.

Here consider the case where the two-stage laser system for aligners is a $F_2$ laser system comprising a line select module on the rear side of the oscillation-stage laser 50. From a comparison of the output of laser light (seed light 23) at a wavelength $\lambda_1$ (=157.6299 nm) selected by the line select module with the output of laser light (seed light 23) at a wavelength $\lambda_2$ (=157.5233 nm) selected by the line select module, it is found that the output of laser light having a wavelength $\lambda_2$ is merely about 20% lower than that of laser light a wavelength $\lambda_1$. In this case, therefore, it is possible to select the wavelength $\lambda_2$ by the line select module. In other words, the above spectral line width $\Delta\lambda$ is that of the oscillation line at the wavelength $\lambda_1$ (=157.6299 rum) or $\lambda_2$ (=157.5233 nm) selected by the line select module.

When the two-stage laser system is a F2 laser system comprising a line select module externally of the output side mirror 2 in the amplification-stage laser 60, the spectral line width $\Delta\lambda$ is that of the oscillation line at wavelength $\lambda_1$ of stronger intensity among two primary oscillation lines of wavelength $\lambda_1=157.6299$ nm and wavelength $\lambda_2=157.5233$ nm.

POSSIBLE INDUSTRIAL APPLICATIONS

In the two-stage laser system for aligners according to the invention, oscillation laser light having divergence is used as the oscillation-stage laser and the amplification-stage laser comprises a Fabry-Perot etalon resonator where the resonator is configured as a stable resonator or, alternatively, oscillation laser light having divergence is used as the oscillation-stage laser and the amplification-stage laser comprises a ring resonator comprising an input/output partial reflecting mirror and a plurality of total-reflection mirrors for reflecting laser light entered via the partial reflecting mirror back to the position of the partial reflecting mirror wherein the partial reflecting mirror and the plurality of total-reflection mirrors are each formed of a plane. Thus, the two-stage laser system for aligners according to the invention has the features of the MOPO mode that output fluctuations are insensitive to fluctuations of synchronous excitation timing between the chambers, high energy stability and high output efficiency are achievable, laser (seed) energy from the oscillation stage can be kept lower, the spectral line width is narrow because the latter half of a laser pulse from the oscillation-stage laser makes a lot more roundtrips, and the line width is narrow because the tail of the latter half can be amplified, and has the features of the MOPA mode as well that the spatial coherence is low; that is, given the same share quantity (pinhole-to-pinhole space) in the beam transverse direction, the visibility of interference fringes and the spatial coherence are low.

If the optical axis of laser light oscillated out of the oscillation-stage laser and entered in the amplification-stage laser is set in such a way as to make an angle with the optical axis of the resonator in the amplification-stage laser, then the spatial coherence is much more reduced.

If the length about twice as long as the length of the resonator in the amplification-stage laser is set longer than the time-based coherent length corresponding to the spectral line width of the oscillation-stage laser or the length of the optical path through the ring resonator is set longer than the time-based coherent length corresponding to the spectral line width of the oscillation-stage laser, it is then possible to prevent any interference fringe pattern from occurring on the beam profile of laser light produced out of the amplification-stage laser. It is thus possible to maintain the symmetry of the beam profile and hold back its fluctuations and, hence, provide uniform illumination of masks in an aligner. Thus, the invention provides a two-stage laser system well fit especially for semiconductor aligners.

The invention is in no sense limited to the use of the oscillation laser light having divergence as the oscillation-stage laser. For instance, if the optical axis of laser light oscillated out of the oscillation-stage laser and entered in the amplification-stage laser is set in such a way as to make an angle with respect to the optical axis of the resonator in the amplification-stage laser, it is then possible to obtain a two-stage laser system that does not only have the above features of the MOPO mode but also is reduced in terms of spatial coherence so that it lends itself well to semiconductor aligners.

Further, if the reflecting surfaces of the rear side mirror and the output side mirror are each formed of a plane, the normal lines to the rear side mirror and the output side mirror are set in such a way as to make an angle with respect to the optical axis of laser light oscillated out of the oscillation-stage laser and entered in the amplification-stage laser and with each other as well, and the laser light oscillated out of the oscillation-stage laser is entered in the resonator from the side on which the distance between both mirrors is longer, it is then possible to obtain a two-stage laser system that does not only have the above features obtained by setting the optical axis of laser light entered in the amplification-stage laser in such a way as to make an angle with respect to the optical axis of the resonator in the amplification-stage laser but also has an increased laser output and an extended pulse width and ensures the degree of flexibility in the injection of laser light entered in the amplification-stage laser with a decrease in the peak intensity of the oscillation-stage laser, and so is best suited for use with semiconductor aligners.

What we claimed is:

1. A two-stage laser system for aligners, comprising an oscillation-stage laser and an amplification-stage laser that inputs laser light oscillated by said oscillation-stage laser, amplifies and outputs the laser light, and said oscillation-stage laser and said amplification-stage laser each comprising a discharge electrode in a chamber filled with a laser gas, wherein the output light of said oscillation-stage laser has a divergence angle, said amplification-stage laser comprises a ring resonator including a partial reflecting mirror that serves both as an input of the oscillation-stage laser light and an output of laser light amplified, a first total-reflection mirror that reflects the laser light input via said partial reflecting mirror and transmits said laser light through a discharge area of the discharge electrode of said amplification-stage laser, and a plurality of total-reflection mirrors that transmits again the light transmitted through said discharge area by the first total-reflection mirror of said amplification-stage laser to the discharge area of the discharge electrode and return the light back to the position of said partial reflecting mirror, a plane formed by a loop laser optical axis defined by the plurality of total-reflection mirrors and the partial reflecting mirror is substantially orthogonal to a discharge direction of the discharge electrode, thus the output light of said oscillation-stage laser passes through the discharge area of the discharge electrode of said amplification-stage laser two times in one way per loop, and said partial reflecting mirror and said plurality of total-reflection mirrors are each formed of a plane.

2. The two-stage laser system for aligners according to claim 1, wherein the optical path of the ring resonator of said amplification-stage laser lies in a plane perpendicular to the discharge direction of the discharge electrode of said amplification-stage laser.

3. The two-stage laser system for aligners according to claim 1 or 2, wherein said first total-reflection mirror is a total-reflection mirror that reflects the laser light input via said partial reflecting mirror and transmits said laser light inclined to the longitudinal direction of the discharge electrode of said amplification-stage laser through said discharge area, and said plurality of total-reflection mirrors are a plurality of total-reflection mirrors that transmits again the light transmitted through said discharge area by the first total-reflection mirror of said amplification-stage laser to the discharge area along the longitudinal direction of said discharge electrode and return the light back to the position of said partial reflecting mirror.

4. The two-stage laser system for aligners according to claim 3, wherein an optical path length in said ring resonator is set longer than a time-based coherent length corresponding to a spectrum line width of said oscillation-stage laser.

5. The two-stage laser system for aligners according to claim 3, wherein said oscillation-stage laser is a narrow-band laser.

6. The two-stage laser system for aligners according to claim 3, wherein between said oscillation-stage laser and said amplification-stage laser, there is located a conversion optical system having a function of compressing a beam shape of laser light oscillated out of said oscillation-stage area.

7. The two-stage laser system for aligners according to claim 5, wherein an optical path length in said ring resonator is set longer than a time-based coherent length corresponding to a spectrum line width of said oscillation-stage laser.

8. The two-stage laser system for aligners according to claim 5, wherein between said oscillation-stage laser and said amplification-stage laser, there is located a conversion optical system having a function of compressing a beam shape of laser light oscillated out of said oscillation-stage area.

9. The two-stage laser system for aligners according to claim 8, wherein an optical path length in said ring resonator is set longer than a time-based coherent length corresponding to a spectrum line width of said oscillation-stage laser.

10. The two-stage laser system for aligners according to claim 6, wherein an optical path length in said ring resonator is set longer than a time-based coherent length corresponding to a spectrum line width of said oscillation-stage laser.

11. The two-stage laser system for aligners according to claim 1 or 2, wherein said oscillation-stage laser is a narrow-band laser.

12. The two-stage laser system for aligners according to claim 11, wherein an optical path length in said ring resonator is set longer than a time-based coherent length corresponding to a spectrum line width of said oscillation-stage laser.

13. The two-stage laser system for aligners according to claim 11, wherein between said oscillation-stage laser and said amplification-stage laser, there is located a conversion optical system having a function of compressing a beam shape of laser light oscillated out of said oscillation-stage area.

14. The two-stage laser system for aligners according to claim 13, wherein an optical path length in said ring resonator is set longer than a time-based coherent length corresponding to a spectrum line width of said oscillation-stage laser.

15. The two-stage laser system for aligners according to claim 1 or 2, wherein between said oscillation-stage laser and said amplification-stage laser, there is located a conversion optical system having a function of compressing a beam shape of laser light oscillated out of said oscillation-stage area.

16. The two-stage laser system for aligners according to claim 15, wherein an optical path length in said ring resonator is set longer than a time-based coherent length corresponding to a spectrum line width of said oscillation-stage laser.

17. The two-stage laser system for aligners according to claim 1 or 2, wherein an optical path length in said ring resonator is set longer than a time-based coherent length corresponding to a spectrum line width of said oscillation-stage laser.

* * * * *